(12) United States Patent
Shoji et al.

(10) Patent No.: US 7,800,113 B2
(45) Date of Patent: Sep. 21, 2010

(54) METHOD FOR MANUFACTURING DISPLAY DEVICE

(75) Inventors: Hironobu Shoji, Tokyo (JP); Shinji Maekawa, Kanagawa (JP); Kensuke Yoshizumi, Kanagawa (JP); Tatsuya Honda, Kanagawa (JP); Yukie Suzuki, Kanagawa (JP); Ikuko Kawamata, Kanagawa (JP); Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 666 days.

(21) Appl. No.: 11/826,815

(22) Filed: Jul. 18, 2007

(65) Prior Publication Data

US 2007/0262318 A1    Nov. 15, 2007

Related U.S. Application Data

(62) Division of application No. 11/205,220, filed on Aug. 17, 2005, now Pat. No. 7,247,529.

(30) Foreign Application Priority Data

Aug. 30, 2004    (JP) ............................. 2004-251036

(51) Int. Cl.
*H01L 29/04* (2006.01)
(52) U.S. Cl. .......................... 257/72; 438/166
(58) Field of Classification Search .............. 438/149, 438/164, 163, 166, 609, 652, 656; 257/66, 257/70, 72, 500, 57, 59, E29.117
See application file for complete search history.

(56) References Cited

U.S. PATENT DOCUMENTS

| 5,834,328 | A | * | 11/1998 | Jang .......................... 438/30 |
| 5,923,968 | A |  | 7/1999 | Yamazaki et al. |
| 5,972,105 | A |  | 10/1999 | Yamazaki et al. |
| 6,670,640 | B1 |  | 12/2003 | Yamazaki et al. |
| 6,692,997 | B2 |  | 2/2004 | So et al. |

FOREIGN PATENT DOCUMENTS

CN    1129850    8/1996

OTHER PUBLICATIONS

Yasuaki Nagahiro et al., Nikkei Microdevices' Flat Panel Display 2002 Yearbook, Nikkei BP Marketing, Inc., Oct. 2001, pp. 102-109 (English abstract).
Chinese Office Action (Application No. 2005/10106745.7) dated Apr. 10, 2009 with English translation.

* cited by examiner

*Primary Examiner*—David Vu
(74) *Attorney, Agent, or Firm*—Nixon Peabody LLP; Jeffrey L. Costellia

(57) ABSTRACT

The present invention provides a method for manufacturing a display device having a TFT that can be operated at high speed while using a small number of photomasks and improving the utilization efficiency of materials, where the threshold value is difficult to be varied. In the invention, a catalytic element is applied to an amorphous semiconductor film and the amorphous semiconductor film is heated to form a crystalline semiconductor film. After removing the catalytic element from the crystalline semiconductor film, a top-gate type thin film transistor with a planar structure is manufactured. Moreover, by using the droplet discharging method where an element of a display device is formed selectively, the process can be simplified, and loss of materials can be reduced.

21 Claims, 48 Drawing Sheets

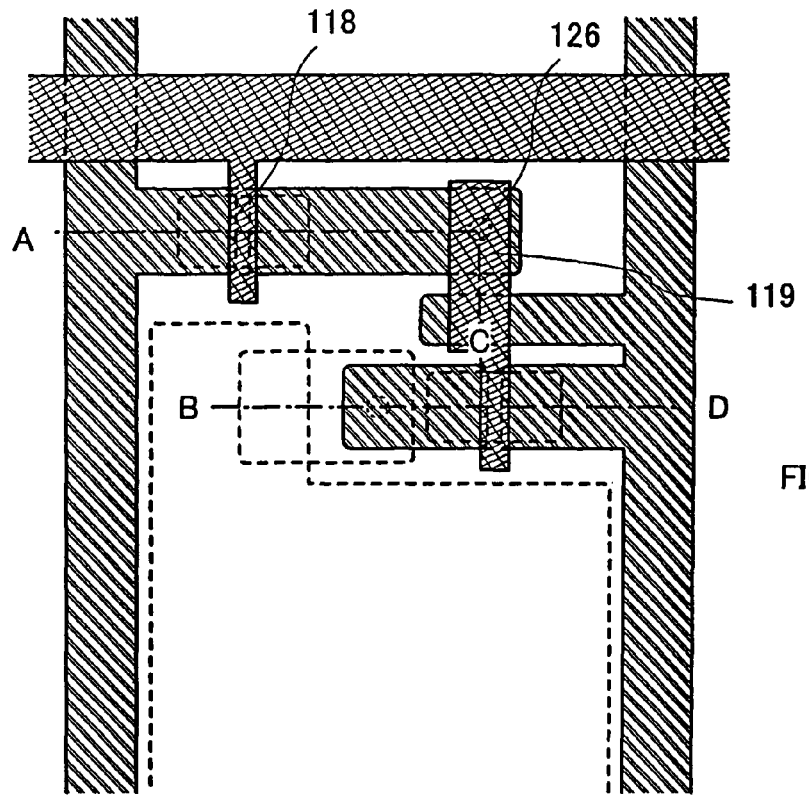
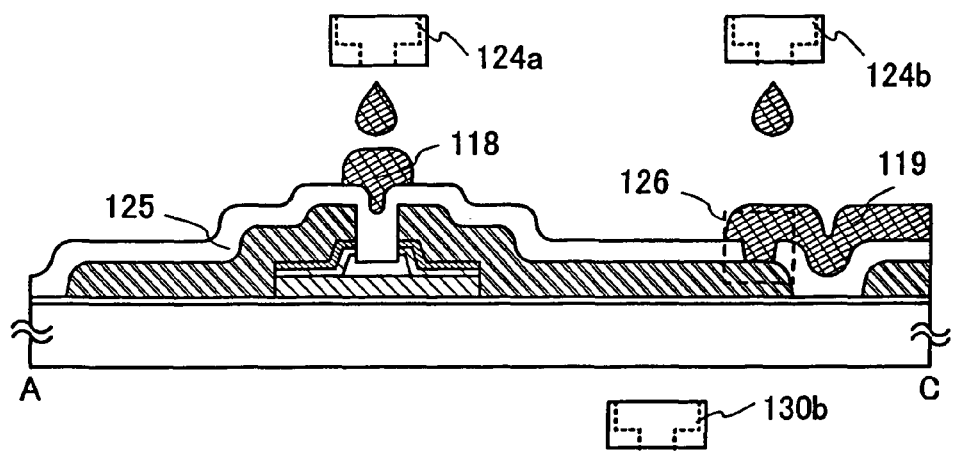
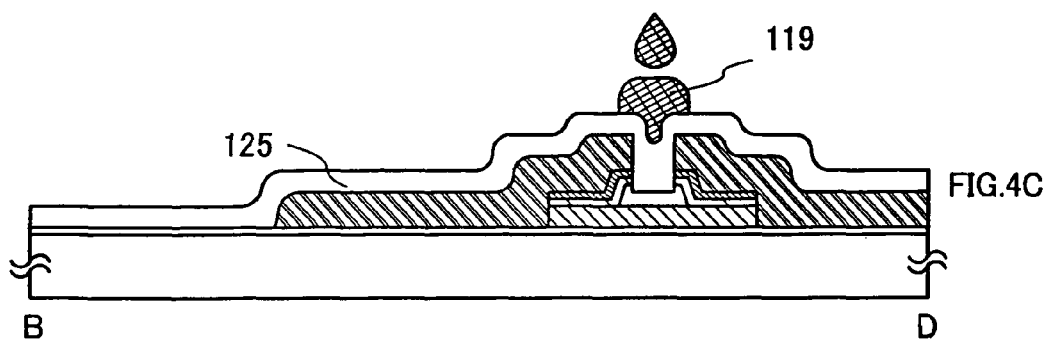
FIG.4A
FIG.4B
FIG.4C

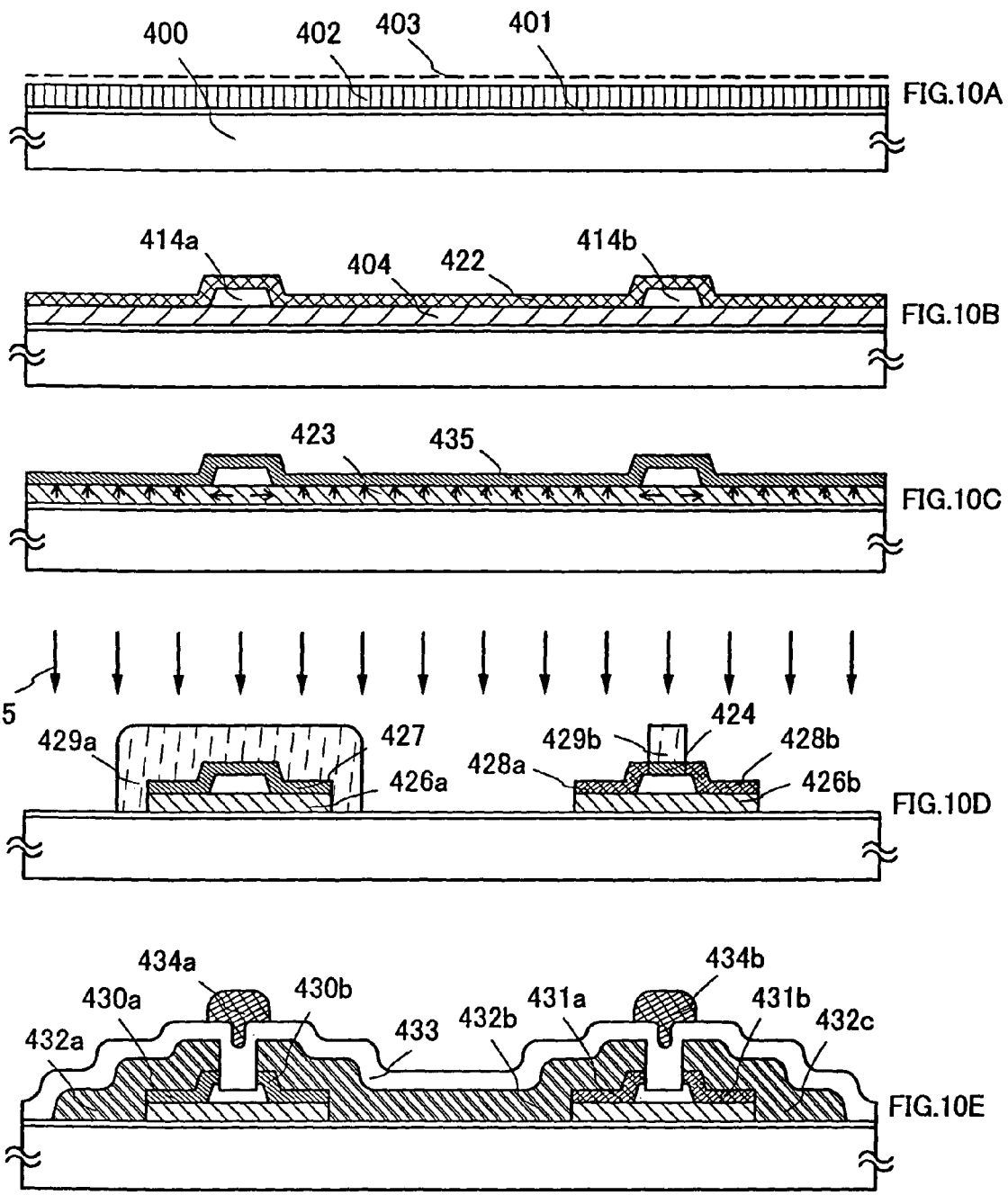

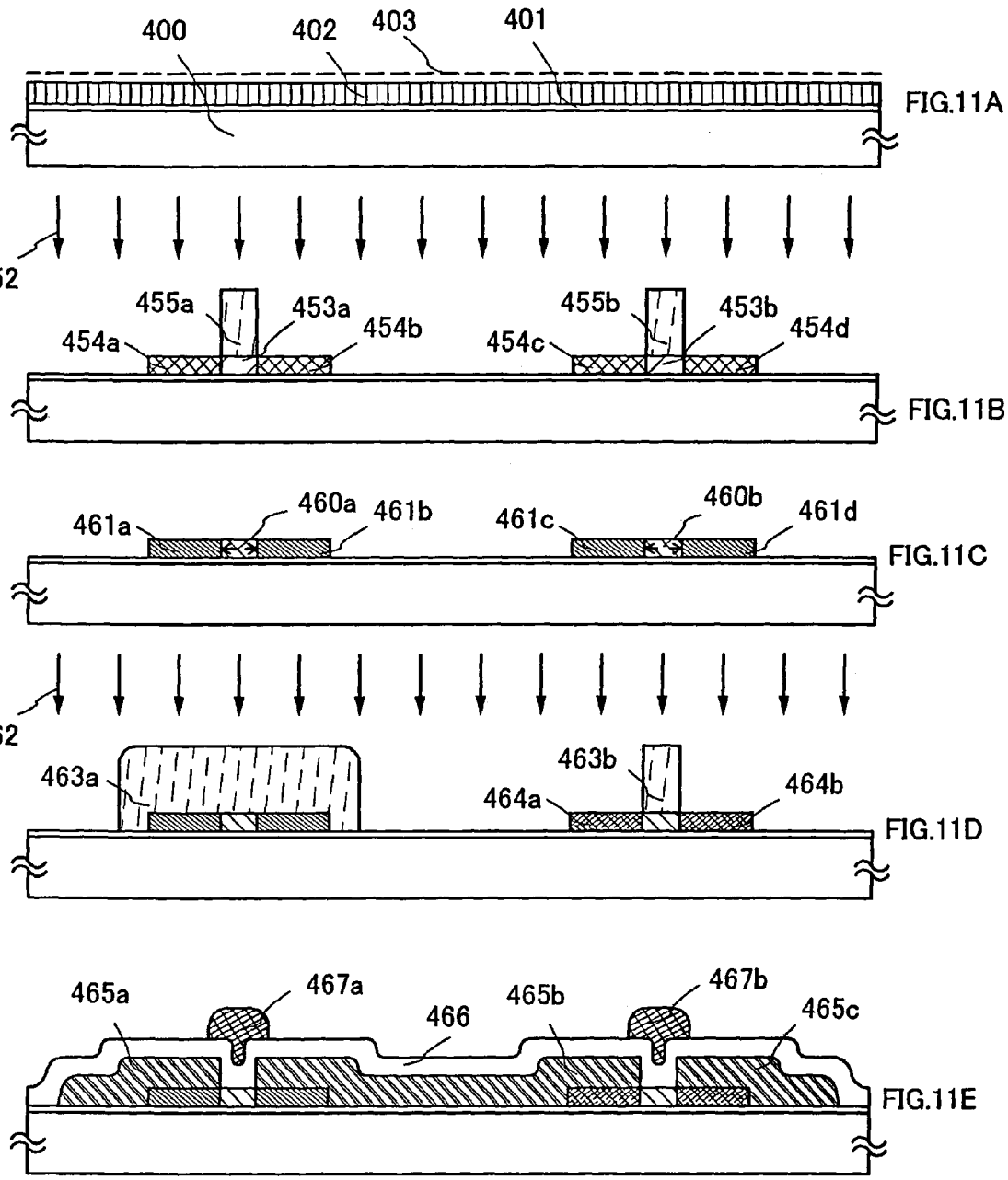

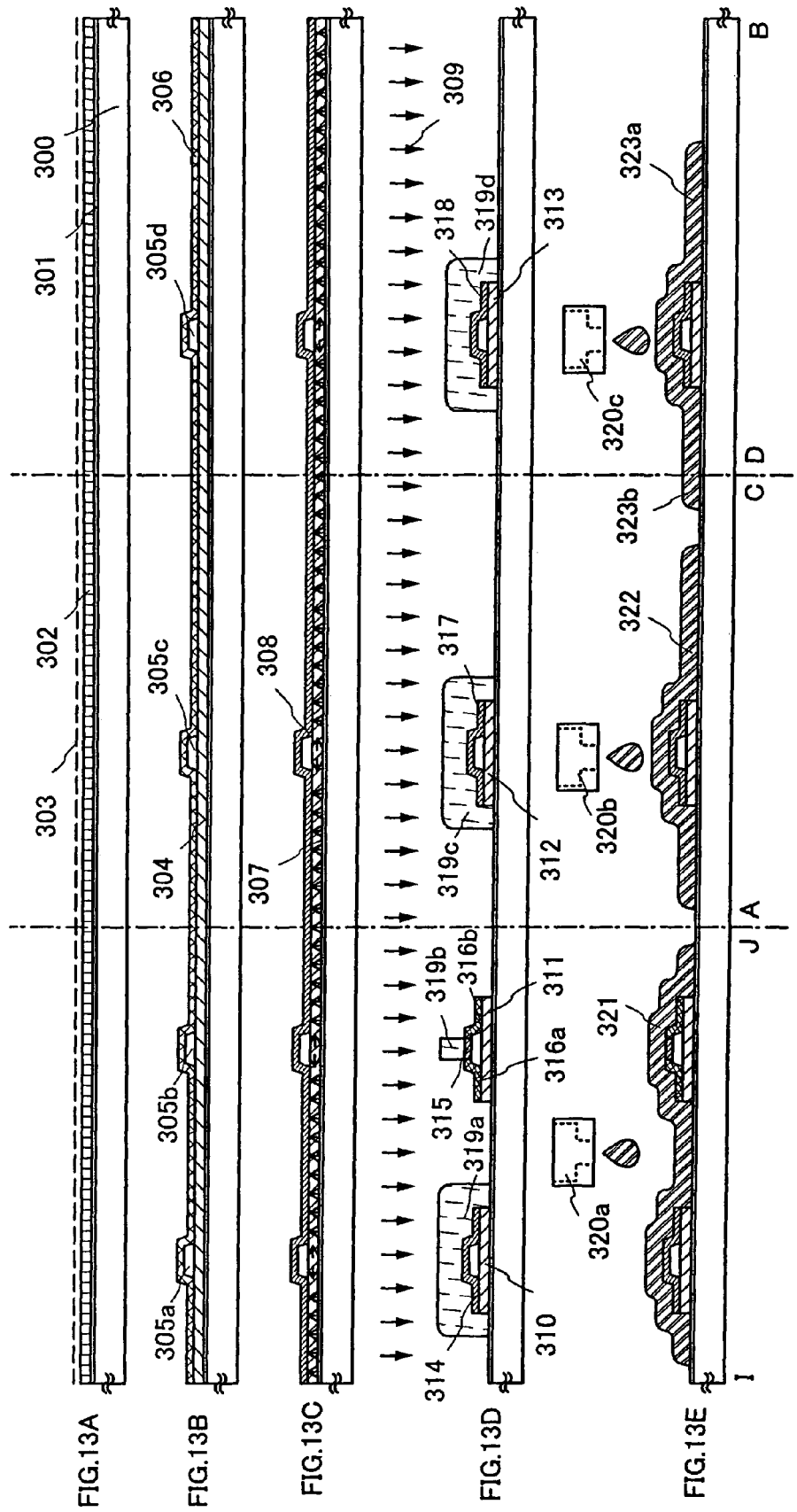

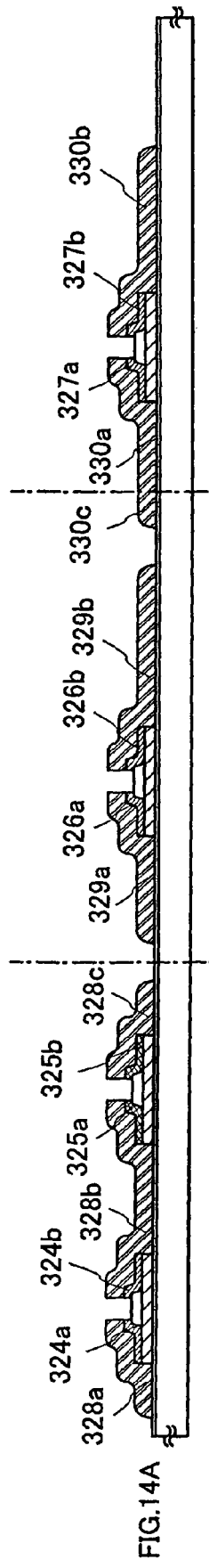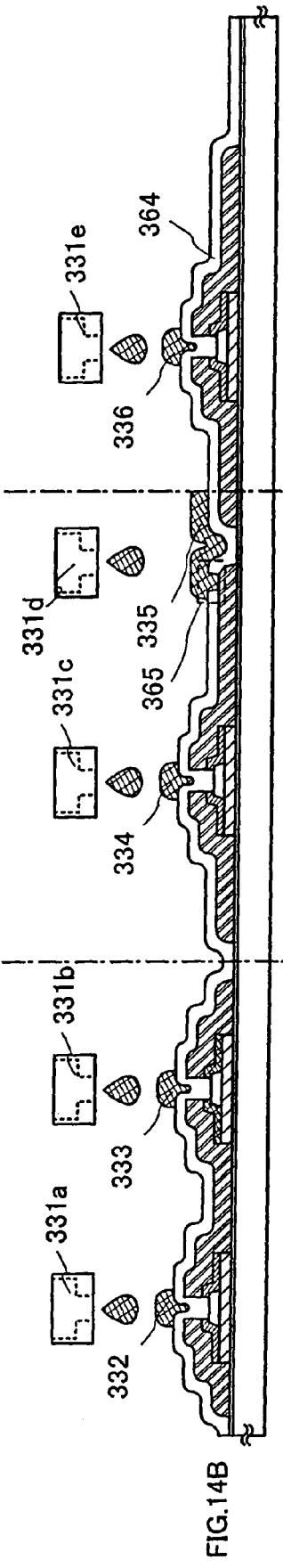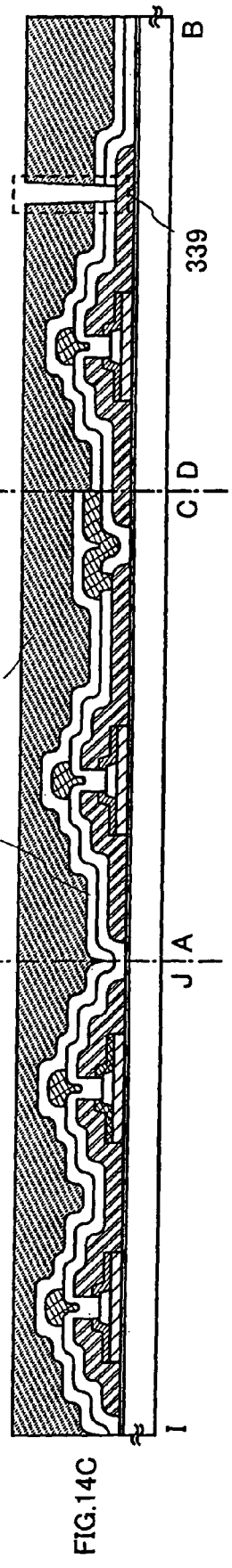

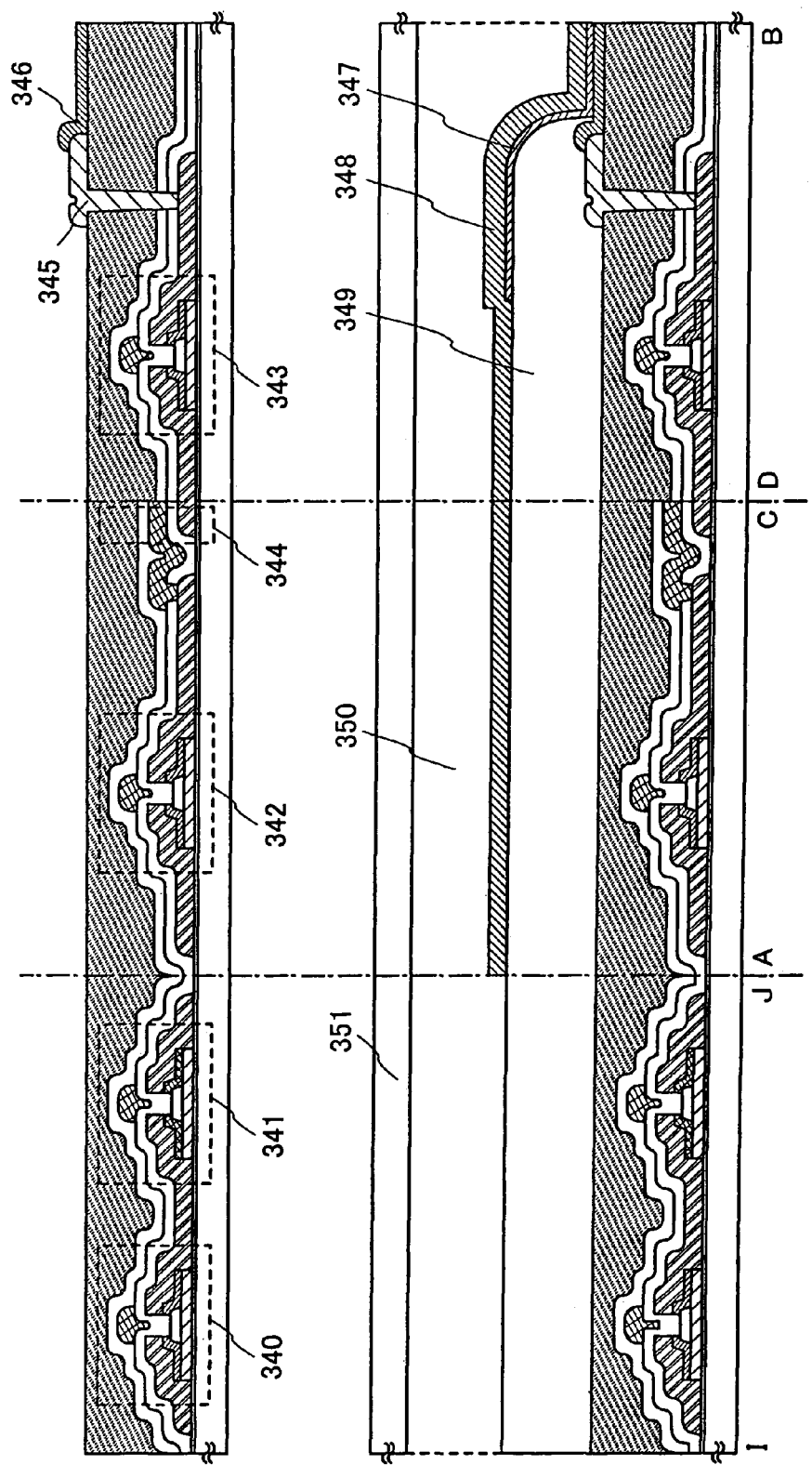

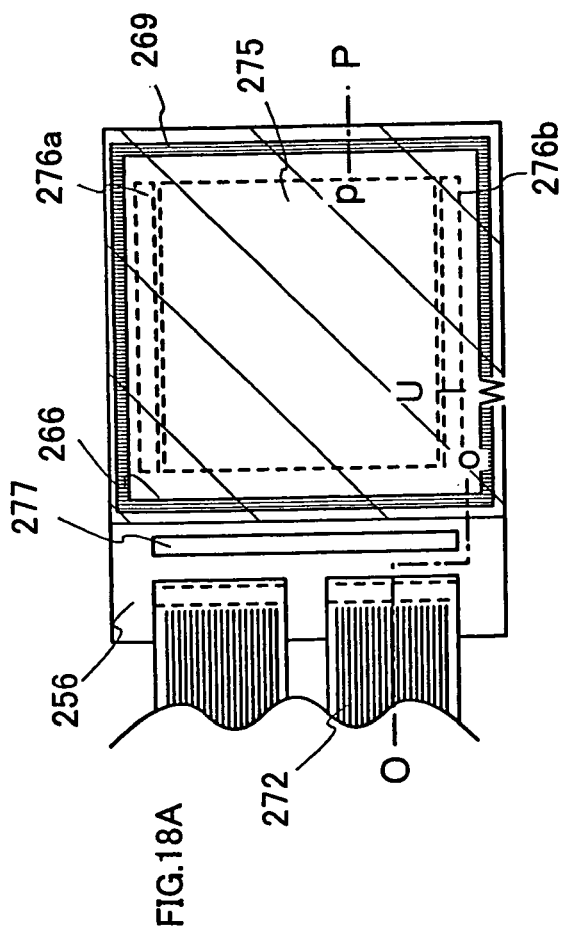
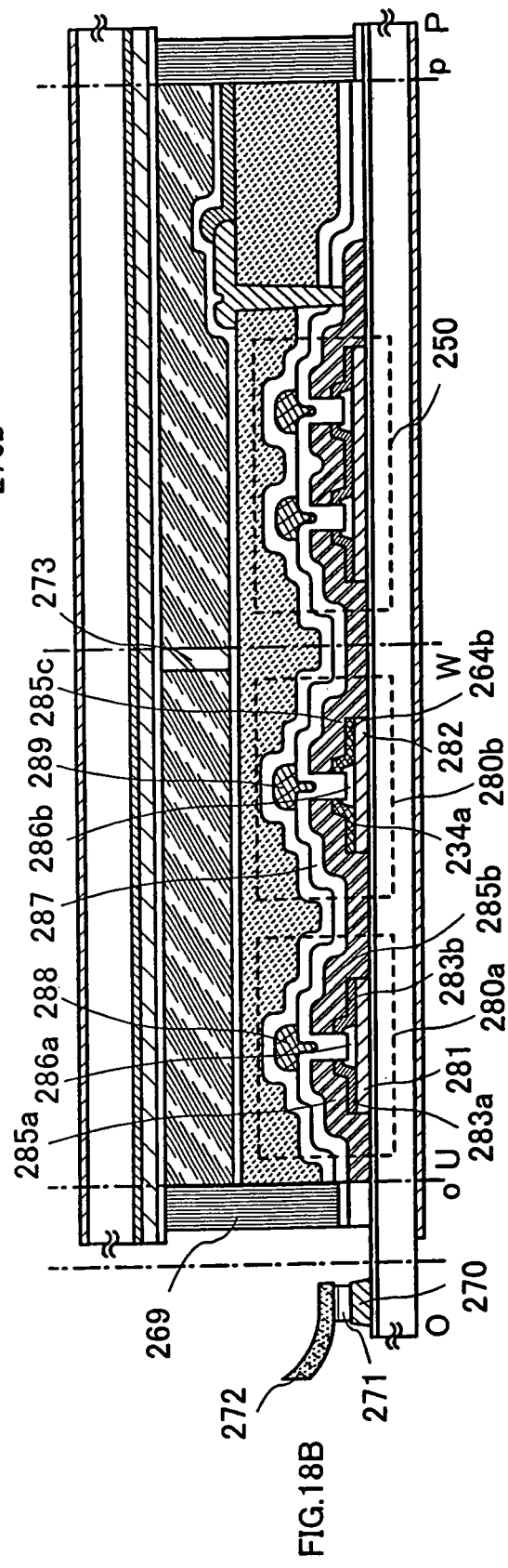
FIG.18A
FIG.18B

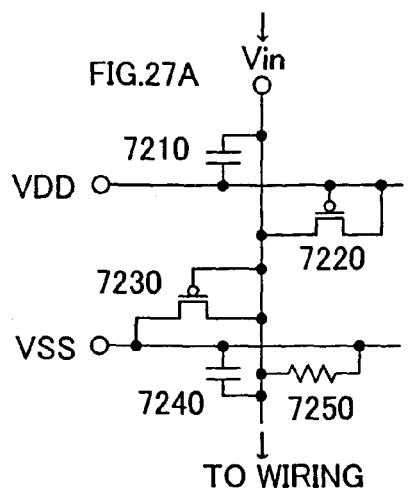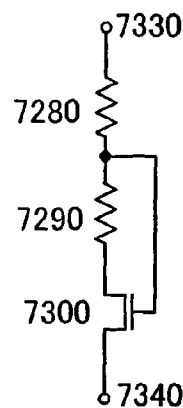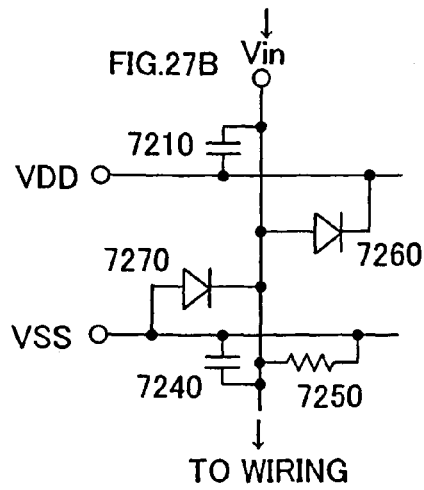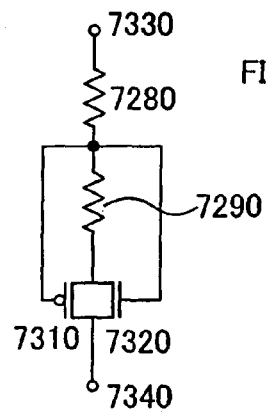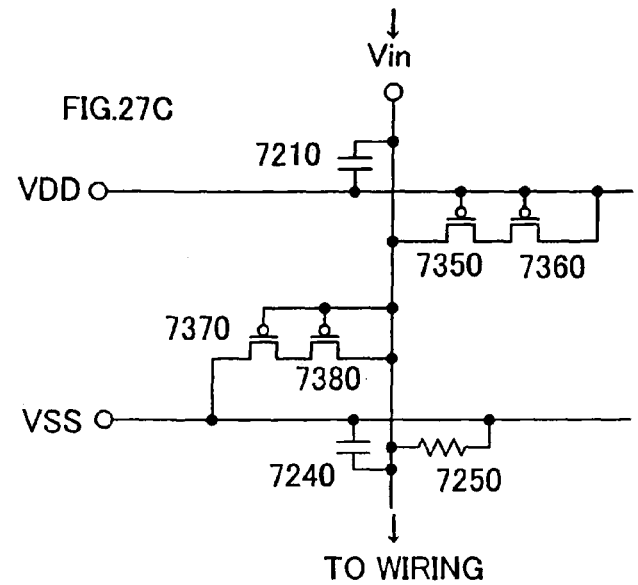

FIG.37A
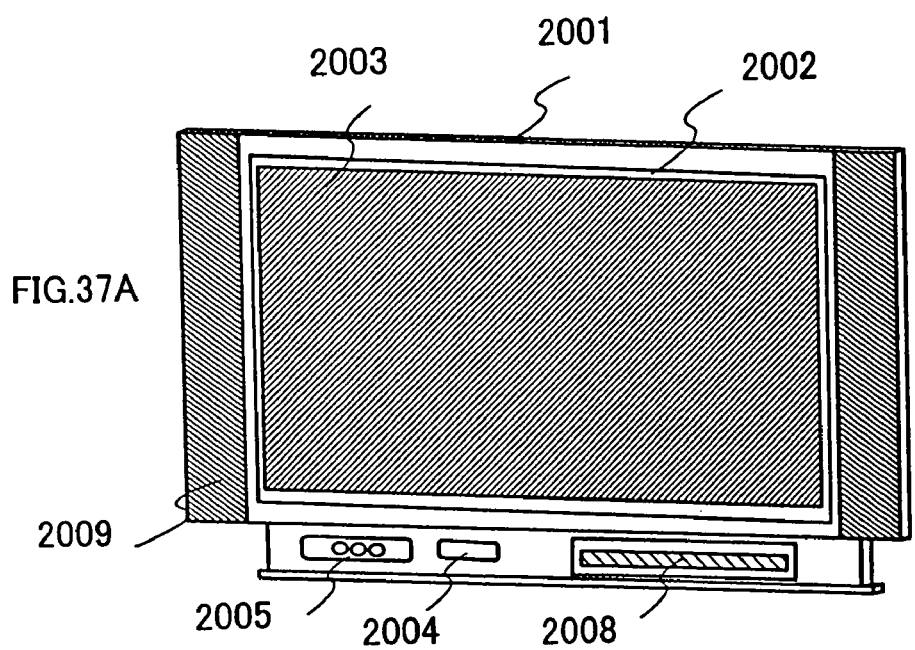
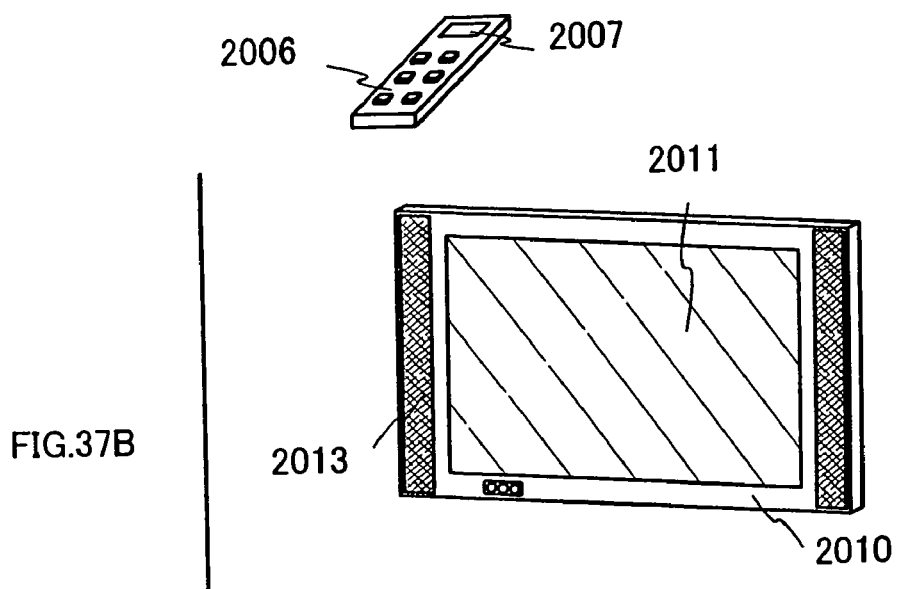
FIG.37B
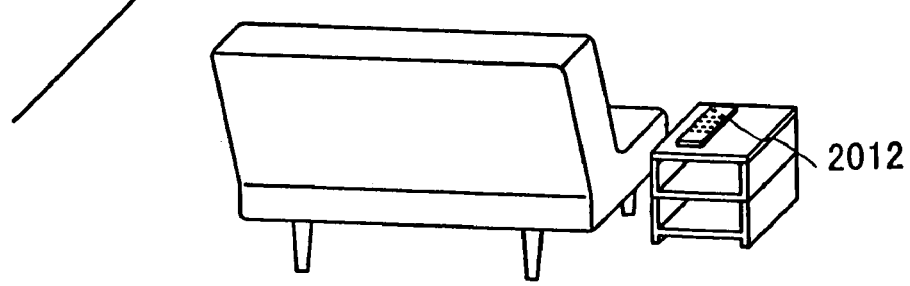

FIG.43A1
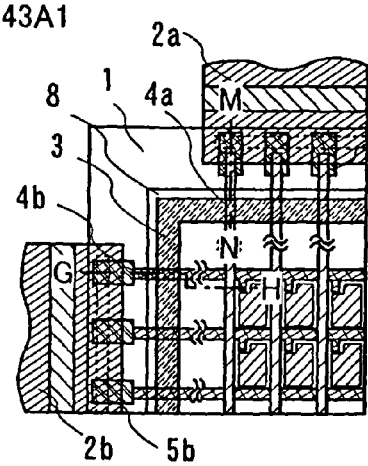
FIG.43A2
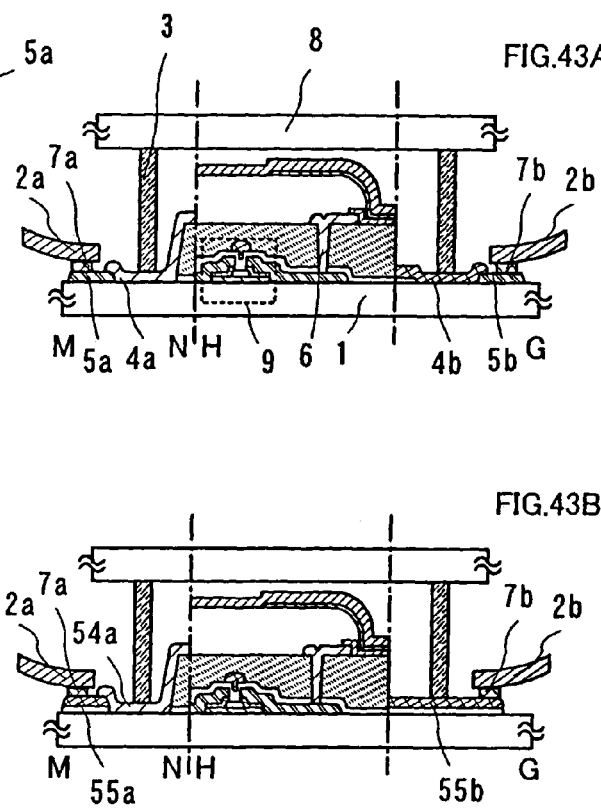
FIG.43B1
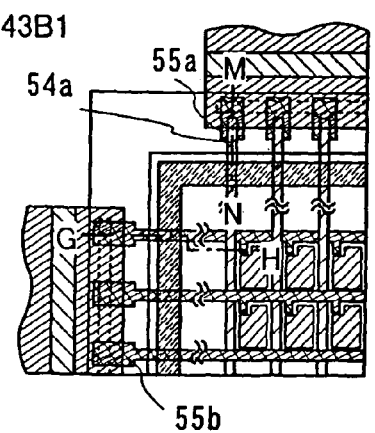
FIG.43B2
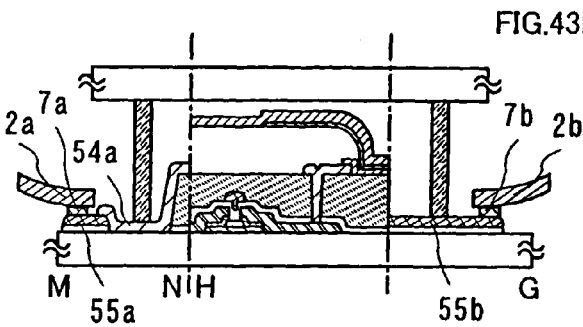
FIG.43C1
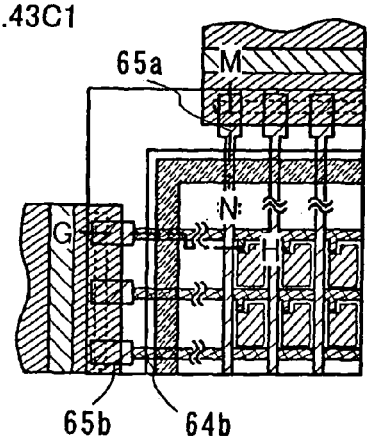
FIG.43C2
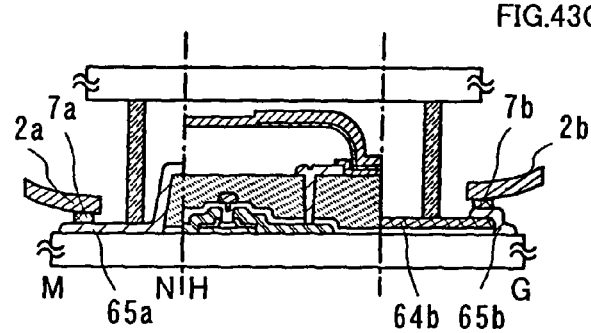

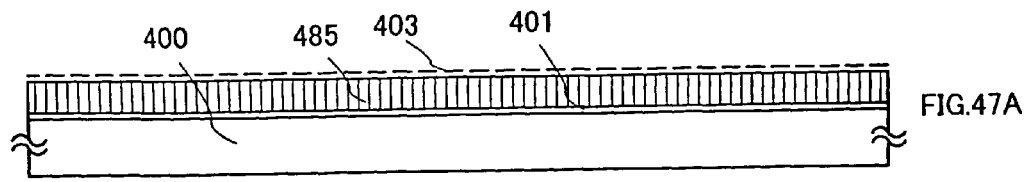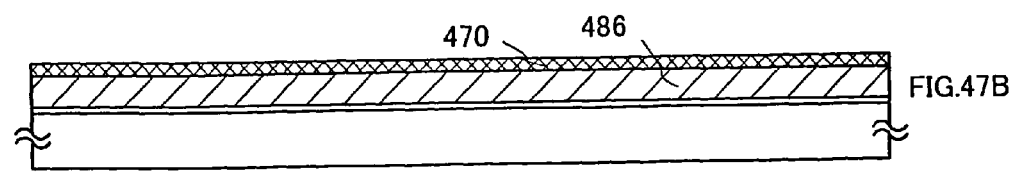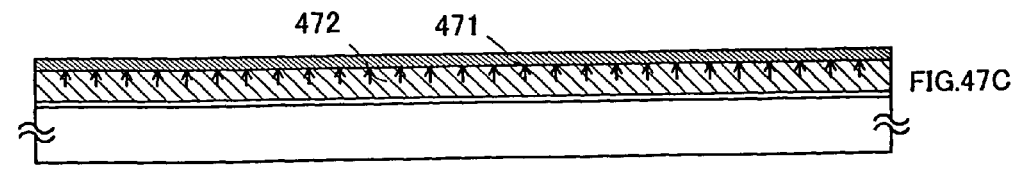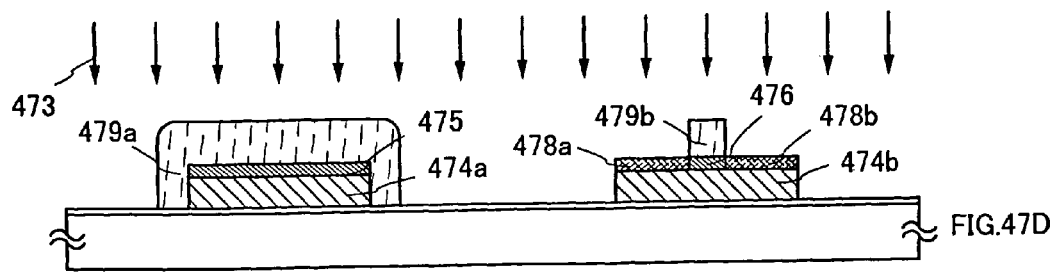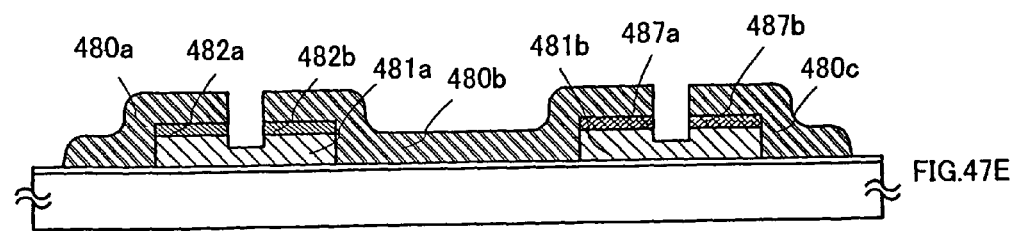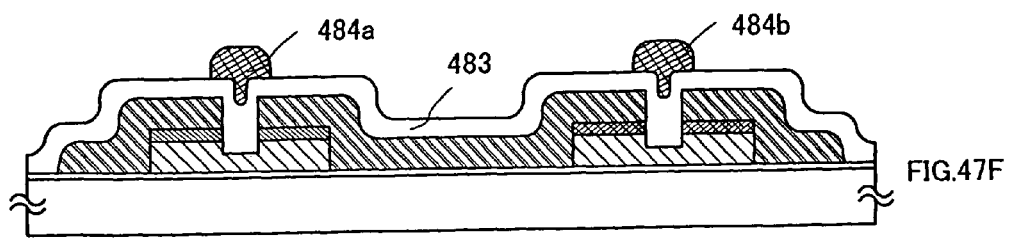

METHOD FOR MANUFACTURING DISPLAY DEVICE

This application is a Divisional of application Ser. No. 11/205,220 filed Aug. 17, 2005 now U.S. Pat. No. 7,247,529, now issued.

BACKGROUND OF THE INVENTION

1. Field of the Invention

The present invention relates to a method for manufacturing a display device.

2. Description of the Related Art

In recent years, flat panel displays (FPDs) typified by liquid crystal displays (LCDs) and electroluminescent (EL) displays have been attracting attention as display devices taking the place of the conventional CRTs. In particular, development of large-area liquid crystal television devices equipped with large-size active matrix liquid crystal panels has been a major issue for liquid crystal panel manufacturers. Moreover, development of large-area EL television devices has recently been carried out following to the development of the liquid crystal television devices.

A thin film transistor (hereinafter, also referred to as a TFT) using an amorphous silicon is used as a semiconductor element for driving each pixel in the conventional liquid crystal display device or EL display device (hereinafter, also referred to as a light emitting display device).

Meanwhile, the conventional liquid crystal television devices have defects of image deblurring caused by the limits of viewing angle characteristics and the limits of high-speed operation due to a liquid crystal material etc. Recently, an OCB (optically compensated bend) mode has been proposed as a new display mode for solving the above problem (see non-patent document 1).

Non-Patent Document 1: Yasuaki Nagahiro et al., Nikkei Microdevices' Flat Panel Display 2002 Yearbook, Nikkei BP Marketing, Inc., October 2001, pp. 102-109

However, when a TFT using an amorphous semiconductor film is driven by flowing direct current therethrough, the threshold value is easily varied, causing the variation in characteristics of the TFT easily. Therefore, the fluctuation of luminance is caused in a light emitting display device that uses this TFT using the amorphous semiconductor film in a switching pixel. This phenomenon is especially prominent in a large-area television device with 30 inches or more (typically, 40 inches or more) in diagonal, which results in a serious problem of the deterioration of image quality.

Furthermore, it has been thought that a switching element that can be operated at high speed is required in a liquid crystal display device employing the OCB mode or the like in order to improve the image quality of the LCD. However, the TFT using the amorphous semiconductor film has the limits of high speed operation. Therefore, it is difficult to realize a high-performance liquid crystal display device.

SUMMARY OF THE INVENTION

In view of the above mentioned problems, it is an object of the present invention to provide a method for manufacturing a display device having a TFT that can be operated at high speed with less number of photomasks, where the variation in threshold value is difficult to be caused. Also, it is another object of the invention to provide a method for manufacturing a display device having an excellent switching property along with a superior contrast.

To solve the above described problems in the conventional techniques, the present invention provides the countermeasures below.

According to the present invention, an amorphous semiconductor film is added with a catalytic element and then baked to form a crystalline semiconductor film. After removing the catalytic element from the crystalline semiconductor film, a top-gate planar thin film transistor is manufactured. According to the invention, the process can be simplified and loss of materials can be reduced by using a droplet discharging method where a constitution element of a display device is selectively formed. Also, as the display device according to the invention, a light emitting display device having a light emitting element and a TFT connected to each other in which a layer including an organic material that emits light referred to as electroluminescence or a mixture of an organic material and an inorganic material is interposed between electrodes, a liquid crystal display device using a liquid crystal element containing a liquid crystal material as a display element, and the like can be given.

One feature of the present invention is that an amorphous semiconductor film is added with an element that promotes or accelerates the crystallization (hereinafter, also referred to as a metal element or a catalytic element since this element mainly indicates a metal element) and then baked to form a crystalline semiconductor film. A semiconductor film having an element that belongs to group 15 of the periodic table or a semiconductor film having an rare gas element is formed on the crystalline semiconductor film and then baked. After removing the metal element from the crystalline semiconductor film, an inversely-staggered thin film transistor is formed. When the semiconductor film having an element that belongs to the group 15 of the periodic table is formed on the crystalline semiconductor film, the semiconductor film having the element, which belongs to the group 15 of the periodic table, is used as a source region and a drain region so as to form an n-channel thin film transistor. Also, an element that belongs to group 13 of the periodic table is added as an impurity element imparting a p-type conductivity to the semiconductor film having the element, which belongs to the group 15 of the periodic table, as an impurity element imparting an n-type conductivity to form a p-channel thin film transistor. Furthermore, when forming the semiconductor film having the rare gas element, after performing a heat treatment, the semiconductor film having the rare gas element is removed, and then a source region and a drain region are formed to form an n-channel or a p-channel thin film transistor.

In an aspect of the present invention, a method for manufacturing a display device includes the steps of: forming an amorphous semiconductor layer over an insulated surface; adding a metal element to the amorphous semiconductor layer; baking and crystallizing the amorphous semiconductor layer to form a crystalline semiconductor layer; forming a semiconductor layer having one conductivity type in contact with the crystalline semiconductor layer; heating the crystalline semiconductor layer and the semiconductor layer having one conductivity type; patterning the semiconductor layer having one conductivity type; forming a source region and a drain region; discharging a composition that contains a conductive material on the source region and the drain region to form a source electrode layer and a drain electrode layer; forming a gate insulating layer on the crystalline semiconductor layer, the source electrode layer and the drain electrode layer; and forming a gate electrode layer on the gate insulating layer.

In another aspect of the invention, a method for manufacturing a display device includes the steps of: forming an amorphous semiconductor layer over an insulated surface; adding a metal element to the amorphous semiconductor layer; baking and crystallizing the amorphous semiconductor layer to form a crystalline semiconductor layer; forming a channel protection layer on the crystalline semiconductor layer; forming a semiconductor layer having one conductivity type on the crystalline semiconductor layer and the channel protection layer; heating the crystalline semiconductor layer and the semiconductor layer having one conductivity type; patterning the semiconductor layer having one conductivity type to form a source region and a drain region; selectively discharging a composition containing a conductive material on the source region and the drain region to form a source electrode layer and a drain electrode layer; forming a gate insulating layer on the crystalline semiconductor layer, the channel protection layer, the source electrode layer and the drain electrode layer; and forming a gate electrode layer on the gate insulating layer.

In another aspect of the invention, a method for manufacturing a display device includes the steps of: forming a first semiconductor layer over an insulated surface; adding a metal element to the first semiconductor layer; heating the first semiconductor layer; forming a second semiconductor layer having a first impurity element in contact with the first semiconductor layer; heating the first semiconductor layer and the second semiconductor layer having the first impurity element; removing the second semiconductor layer having the first impurity element; adding a second impurity element to the first semiconductor layer to form a source region and a drain region; selectively discharging a composition containing a conductive material on the source region and the drain region to form a source electrode layer and a drain electrode layer; forming a gate insulating layer on the crystalline semiconductor layer, the source electrode layer and the drain electrode layer; and forming a gate electrode layer on the gate insulating layer.

In another aspect of the invention, a method for manufacturing a display device includes the steps of: forming a first semiconductor layer over an insulated surface; adding a metal element to the first semiconductor layer; heating the first semiconductor layer; forming a second semiconductor layer having a first impurity element in contact with the first semiconductor layer; heating the first semiconductor layer and the second semiconductor layer having the first impurity element; removing the second semiconductor layer having the first impurity element; forming a channel protection layer on a channel formation region of the first semiconductor layer; adding a second impurity element to the first semiconductor layer to form a source region and a drain region; selectively discharging a composition containing a conductive material on the source region and the drain region to form a source electrode layer and a drain electrode layer; forming a gate insulating layer on the crystalline semiconductor layer, the channel protection layer, the source electrode layer and the drain electrode layer; and forming a gate electrode layer on the gate insulating layer.

According to the present invention, a top-gate type thin film transistor with a planar structure that has a crystalline semiconductor film can be formed. A TFT having a crystalline semiconductor film formed according to the present invention has higher mobility compared to a TFT formed using an amorphous semiconductor film. Also, the source region and the drain region include a metal element that promotes the crystallization, in addition to an impurity element imparting a p-type conductivity (an acceptor element) or an impurity element imparting an n-type conductivity (a donor element). Accordingly, a source region and a drain region having low resistivity can be formed. As a consequence, a display device that is necessary to be operated at high speed can be manufactured.

As compared with a thin film transistor formed using an amorphous semiconductor film, the fluctuation in the characteristics of the thin film transistor formed using the crystalline semiconductor film according to the invention can be reduced. Consequently, the non-uniformities in display performance can also be reduced, making it possible to manufacture a highly reliable display device.

Moreover, a metal element mixed in a semiconductor film is removed through a gettering step at the time of forming a film, and hence, off current can be reduced. Therefore, by providing such a TFT in a switching element of a display device, the contrast can be improved.

Additionally, according to the present invention, cost can be reduced with minimal loss of materials, making it possible to manufacture a high-performance, highly reliable display device at good yield.

BRIEF DESCRIPTION OF THE DRAWINGS

FIG. 4A is a top view and FIGS. 4B and 4C are cross sectional views explaining a method for manufacturing a display device according to the present invention;

FIGS. 10A to 10E are cross sectional views explaining a method for manufacturing a display device according to the present invention;

FIGS. 11A to 11E are cross sectional views explaining a method for manufacturing a display device according to the present invention;

FIGS. 13A to 13E are cross sectional views explaining a method for manufacturing a display device according to the present invention;

FIGS. 14A to 14C are cross sectional views explaining a method for manufacturing a display device according to the present invention;

FIGS. 15A and 15B are cross sectional views explaining a method for manufacturing a display device according to the present invention;

FIG. 18A is a top view and FIG. 18B is a cross sectional view explaining a method for manufacturing a display device according to the present invention;

FIGS. 27A to 27E are diagrams showing protection circuits to which the present invention is applied;

FIGS. 37A and 37B are diagrams showing electronic appliances to which the present invention is applied;

FIGS. 43A1 to 43C1 are top views and FIGS. 43A2 to 43C2 are cross sectional views explaining display devices according to the invention.

FIGS. 47A to 47F are cross sectional views showing a display device according to the invention.

DETAILED DESCRIPTION OF THE PREFERRED EMBODIMENTS

Embodiment Mode 1

Figure 1A:
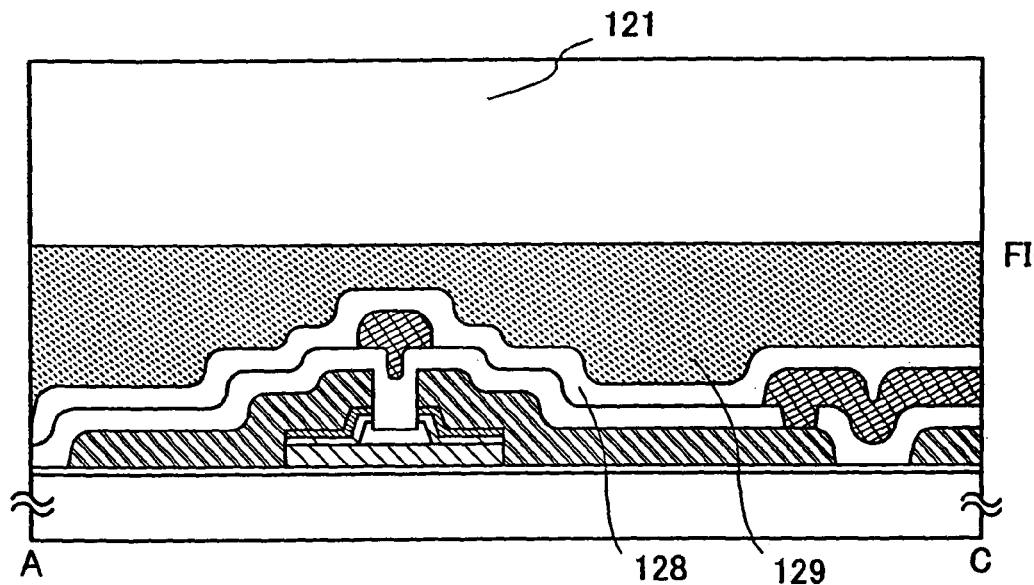
FIGS. 1A and 1B are cross sectional views explaining a display device according to the present invention.

The embodiment modes according to the present invention will hereinafter be described referring to the accompanying drawings. It is easily understood by those who skilled in the art that the embodiment modes and details herein disclosed can be modified in various ways without departing from the purpose and the scope of the invention. The present invention should not be interpreted as being limited to the description of the embodiment modes to be given below. Identical portions or portions having similar functions are marked by same reference numerals throughout the drawings so as to eliminate repeated explanation.

Figure 33A:
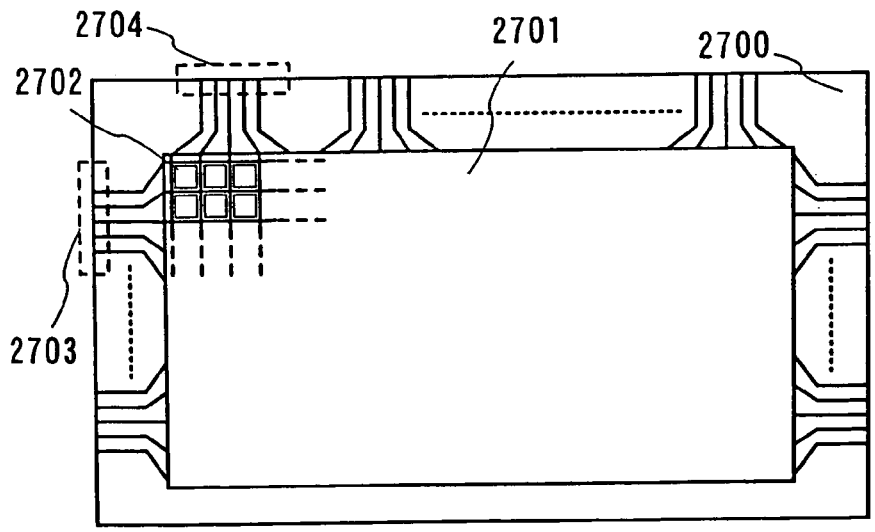
FIGS. 33A to 33C are top views of display devices according to the invention.

FIG. 33A is a top view showing a structure of a display panel according to the present invention. A pixel portion 2701 over which pixels 2702 are arranged in matrix form, a scanning line input terminal 2703 and a signal line input terminal 2704 are formed over a substrate 2700 with an insulated surface. The number of pixels may be determined in accordance with various standards. The number of pixels for XGA may be 1,024×768 ×3 (RGB), and that for UXGA may be 1,600×1,200×3 (RGB). In the case of forming a display panel corresponding to a full-specification high-definition, the number of pixels may be 1,920×1,080×3 (RGB).

The pixels 2702 are arranged in matrix form by intersecting scanning lines that extend from the scanning line input terminal 2703 with signal lines that extend from the signal line input terminal 2704. Each pixel 2702 includes a switching element and a pixel electrode connecting to the switching element. A TFT is a representative example of the switching element. Connecting a gate electrode side of the TFT to the scanning line and connecting a source or drain side thereof to the signal line allow to control respective pixels independently by a signal input from an external portion.

Figure 34A:
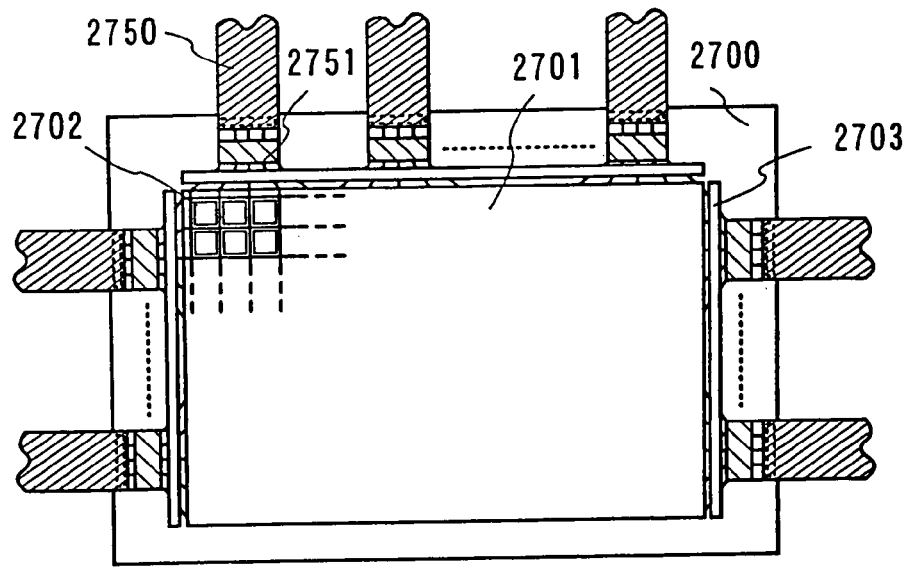
FIGS. 34A and 34B are top views of display devices according to the invention.
Figure 34B:
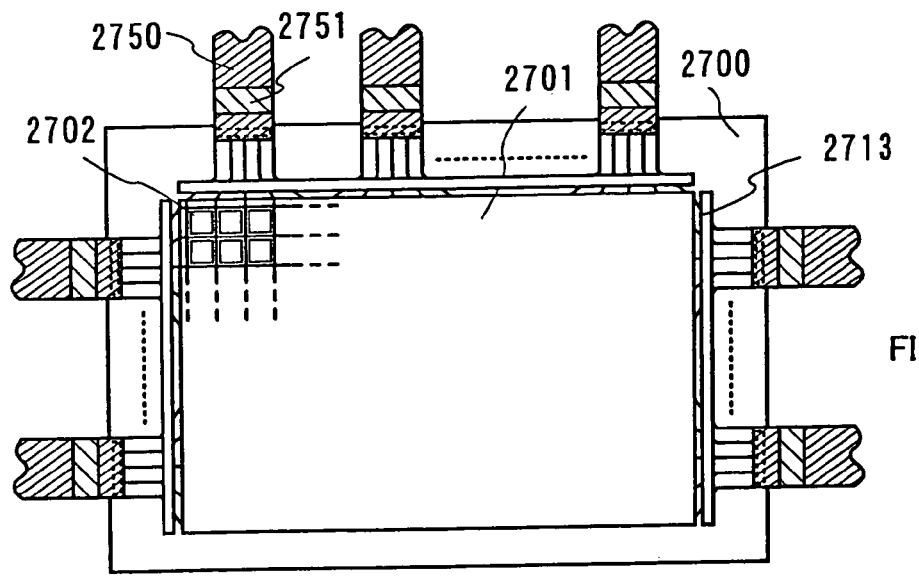

FIG. 33A shows a structure of a display panel that controls a signal being input into the scanning lines and the signal lines by an external driver circuit. As shown in FIG. 34A, driver ICs 2751 may be mounted over a substrate 2700 by the COG (Chip on Glass) technology. As shown in FIG. 34B, the TAB (tape automated bonding) technology may be used as another mounting mode. The driver ICs may be formed over a single crystal semiconductor substrate or may be formed over a glass substrate by using a TFT. In FIGS. 34A and 34B, the driver ICs 2751 are connected to FPCs (flexible printed circuits) 2750, respectively.

Figure 33B:
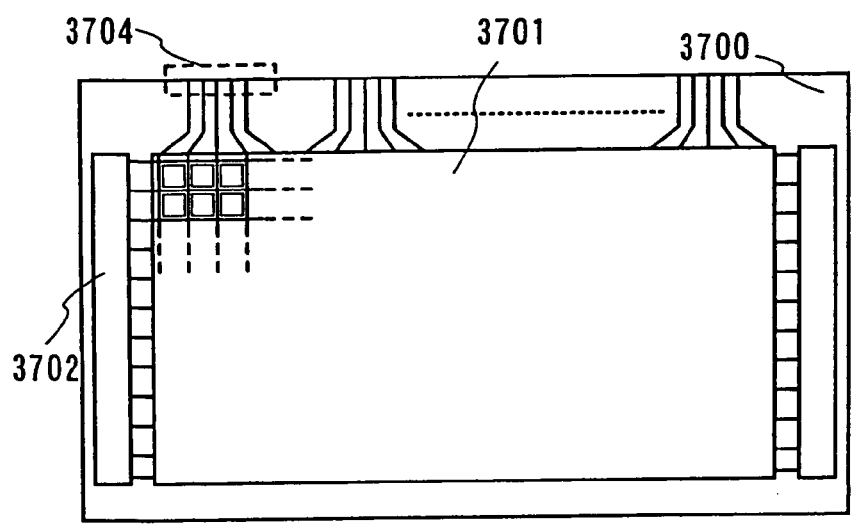
Figure 33C:
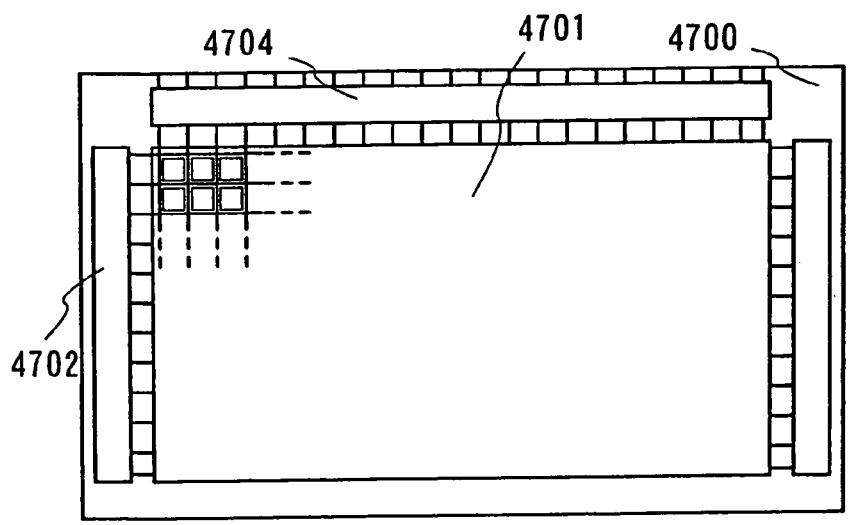

In the case where a TFT that is formed in a pixel is made using a polycrystalline (microcrystalline) semiconductor having high crystallinity, a scanning line driver circuit 3702 can be integrated over a substrate 3700 as shown in FIG. 33B. In FIG. 33B, reference numeral 3701 represents a pixel portion and a signal line driver circuit is controlled by an external driver circuit as well as FIG. 33A. When a TFT formed in each pixel is made using a polycrystalline (microcrystalline) semiconductor, a single crystalline semiconductor or the like having high mobility, a scanning line driver circuit 4702 and a signal line driver circuit 4704 can be provided over a glass substrate 4700 as shown in FIG. 33C.

One feature of the present invention is that at least one or more of materials (existing in various modes like a film or a layer according to a purpose and a function) necessary for manufacturing a display panel such as a wiring layer, a conductive layer of an electrode and a mask layer used for forming a predetermined pattern is/are selectively formed to have a desired shape or desired shapes so as to fabricate a display device. The present invention can be applied to all component elements formed to have predetermined shapes like conductive layers such as a gate electrode layer, a source electrode layer and a drain electrode layer, a semiconductor layer, a mask layer, an insulating layer and the like, which are used for forming a thin film transistor or a display device. A droplet discharging (jetting) method (also referred to as an ink jet method depending on its system) in which a conductive layer, an insulating layer or the like is formed and a liquid of composition that is prepared for a certain purpose is selectively discharged (jetted) thereon to form a predetermined pattern is used as a method for forming a pattern having a predetermined shape selectively. Additionally, a technique in which a material having a predetermined shape can be transferred or written, for example, various kinds of printing techniques (e.g., techniques for forming predetermined patterns such as screen printing, offset (planography) printing, relief printing, gravure printing) can be employed.

A technique in which a composition containing a material having fluidity is discharged (jetted) to form a predetermined pattern is employed in this embodiment mode. A droplet containing a material to be formed is discharged in a subject region on which a pattern will be formed, and then, for example, baked and dried to solidify the liquid, thereby obtaining a predetermined pattern.

Figure 31:
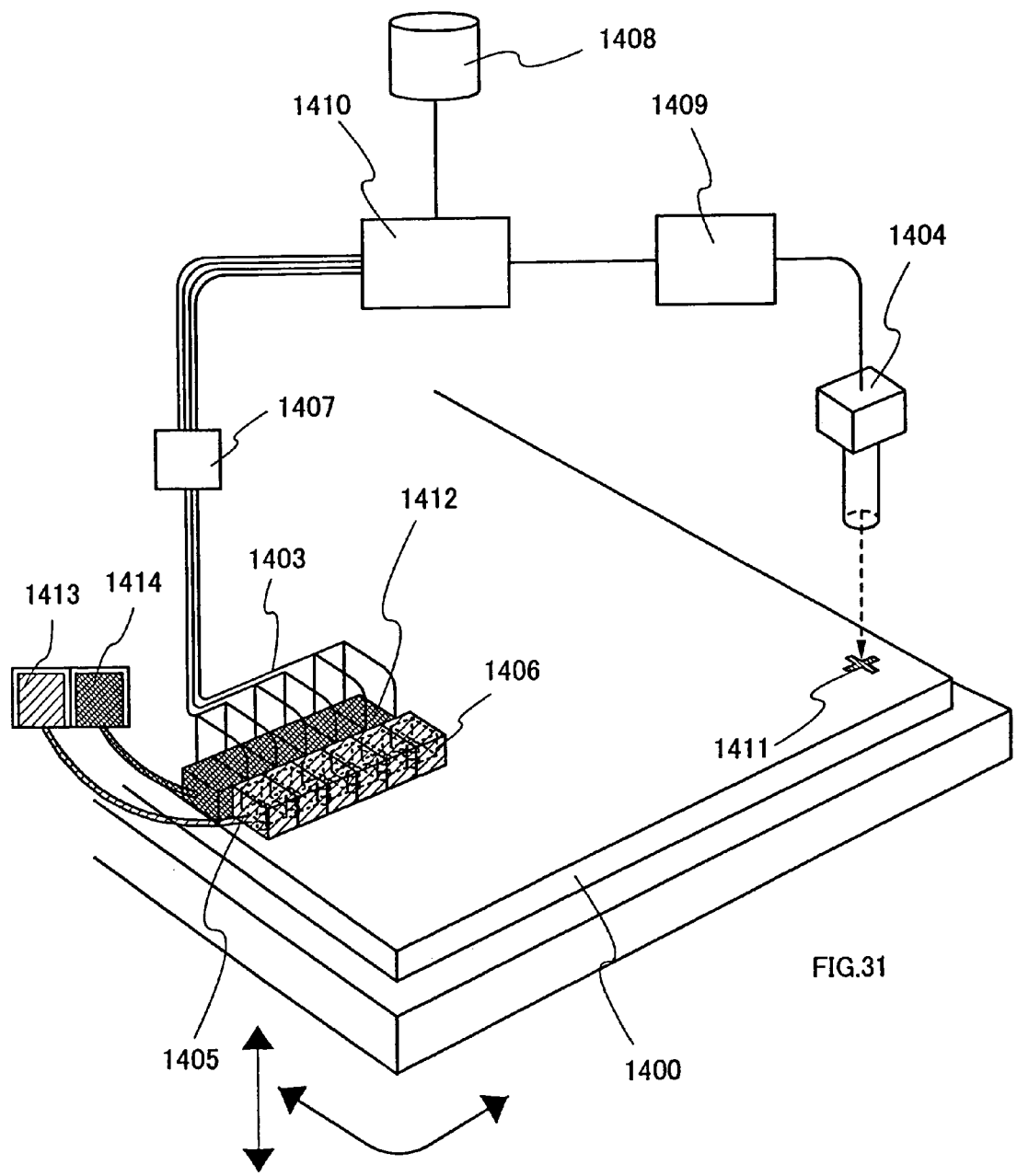
FIG. 31 is a diagram showing a structure of a droplet discharging device that can be applied to the present invention.

One mode of a droplet discharging device used for the droplet discharging method is shown in FIG. 31. Individual heads 1405 and 1412 of droplet discharging means 1403 are connected to controlling means 1407. By controlling the respective heads using a computer 1410, a predetermined pattern that has been programmed in the computer in advance can be written. For example, the timing of wiring the pattern may be determined with reference to a marker 1411 provided over a substrate 1400. Alternatively, the edge of the substrate 1400 may be determined as a reference point. Information about the marker 1411 is detected by imaging means 1404 and converted into a digital signal in image processing means 1409. When the digital signal is recognized by the computer 1410, a control signal is generated and sent to the controlling means 1407. As the imaging means 1404, a charge-coupled device (CCD) or an image sensor utilizing a complementary metal-oxide semiconductor (CMOS) can be used. Of course, information of the pattern to be formed over the substrate 1400 is stored in a recording medium 1408. The control signal is sent to the controlling means 1407 based on this information about the pattern so that the heads 1405 and 1412 of the droplet discharging means 1403 can be controlled individually. The material to be discharged is supplied to the heads 1405 and 1412 respectively through piping from material supply sources 1413 and 1414.

Spaces in which a liquid material is filled as depicted by dashed lines 1406 and nozzles, which are discharge ports, are provided inside of the head 1405. The head 1412 also comprises the same inner structure as the head 1405, though not shown in the drawing. When the sizes of nozzles for the head 1405 and the head 1412 are changed from each other, patterns with different widths can simultaneously be written using different materials. A conductive material, an organic material, an inorganic material and the like can be discharged respectively through one head to write patterns. When, for example, a pattern like an interlayer film is written in a large area, a same material can be simultaneously discharged through plural nozzles to write the film so that throughput can be increased. In the case of using a large size substrate, the heads 1405 and 1412 can scan freely over the substrate in directions of arrows, and therefore, a region to be written can be set freely. Accordingly, plural same patterns can be written over one substrate.

In the present invention, steps of irradiating a material containing photosensitive resist or a photosensitive substance with light and exposing it with the light are carried out in the process of patterning a substance. The light used in the exposure treatment is not particularly limited, and any one of infrared light, visible light, ultraviolet light or a combination thereof can be used. For instance, light emitted from an ultraviolet lamp, black light, a halogen lamp, a metal halide lamp, a xenon arc lamp, a carbon arc lamp, a high-pressure sodium vapor lamp or a high-pressure mercury lamp may be used. In this case, light of a light source may be emitted for a required period or emitted several times.

Figure 28:
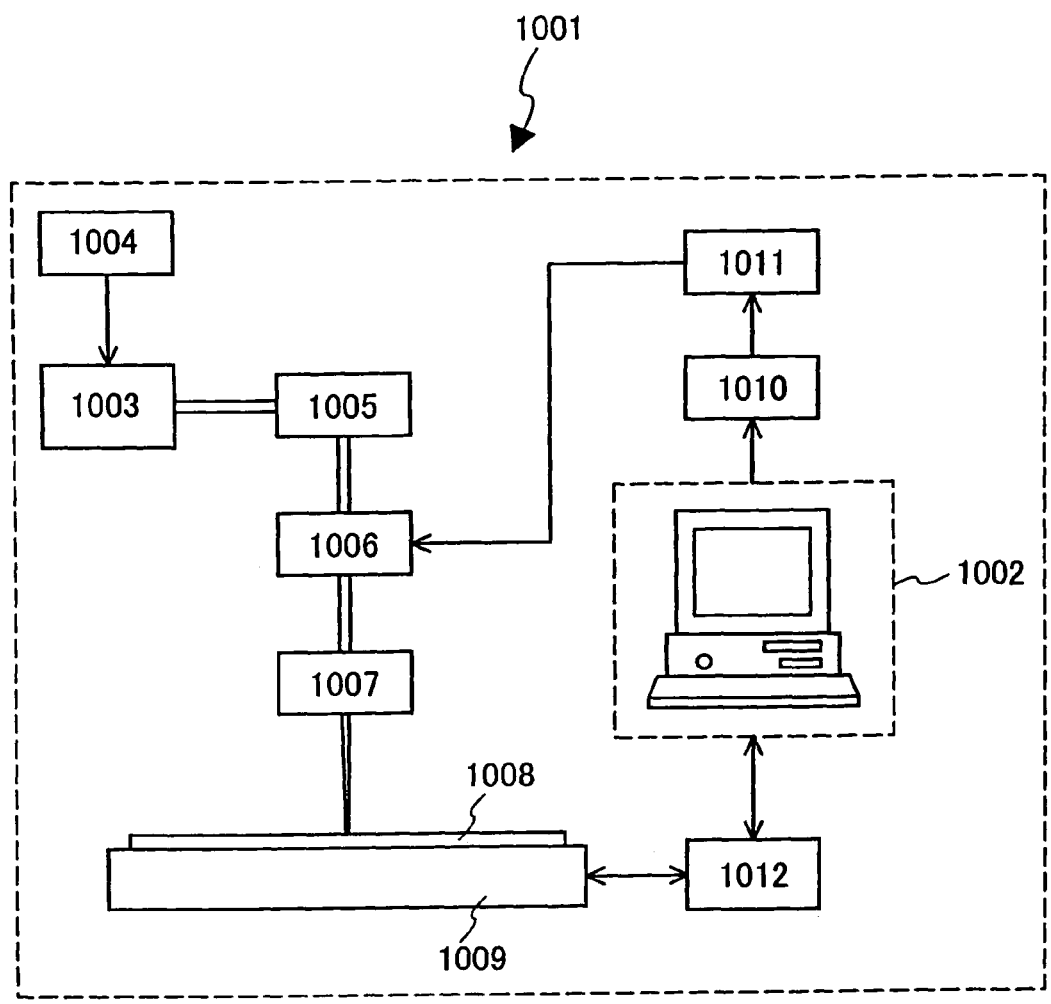
FIG. 28 is a diagram showing a structure of a laser beam direct writing device that can be used in the present invention.

In addition, laser light maybe employed. When using laser light in the exposure treatment, the exposure treatment can be carried out more precisely with respect to a subject region so that an object to be formed in the subject region can also be processed precisely. A laser light writing device for writing laser light (also referred to as laser beam) in a processing region, that can be applied to the present invention, will be described using FIG. 28. A laser light direct writing device is used in this embodiment mode since a region to be processed with laser light is selected to be directly irradiated with laser light rather than being irradiated with laser light through a mask or the like. As shown in FIG. 28, a laser light direct writing device 1001 comprises: a personal computer (hereinafter, PC) 1002 for executing various kinds of controls in irradiating laser light; a laser oscillator 1003 for oscillating laser light; a power source 1004 of the laser oscillator 1003; an optical system (ND filter) 1005 for attenuating laser light; an acoustooptical modulator (AOM) 1006 for modulating the intensity of laser light; a lens for zooming in or out a cross section of laser light; an optical system 1007 including a mirror for changing a light path and the like; a substrate transferring mechanism 1009 having an X stage and a Y stage; a D/A converter 1010 for converting control data output from the PC 1002 into digital/analog data; a driver 1011 for controlling the acoustooptical modulator 1006 in accordance with an analog voltage output from the D/A converter; and a driver 1012 for outputting a driving signal for driving the substrate transferring mechanism 1009.

As the laser oscillator 1003, a laser oscillator capable of oscillating ultraviolet light, visible light or infrared light can be used. As the laser oscillator, an excimer laser oscillator such as KrF, ArF, XeCl and Xe, a gas laser oscillator such as He, He—Cd, Ar, He—Ne and HF, a solid-state laser oscillator using a crystal such as YAG, GdVO$_4$, YVO$_4$, YLF and YAlO$_3$ added with Cr, Nd, Er, Ho, Ce, Co, Ti or Tm, and a semiconductor laser oscillator such as GaN, GaAs, GaAlAs and InGaAsP can be used. Further, second to fifth harmonics of a fundamental wave are preferably applied to the solid-state laser oscillator.

Next, an exposure treatment of a substance (surface) using the laser light direct writing device will be described. When a substrate 1008 is placed in the substrate transferring mechanism 1009, the PC 1002 detects a position of a marker marked on the substrate by a camera not shown in the drawing. The PC 1002 generates transferring data for moving the substrate transferring mechanism 1009 based on the positional data of the marker detected by the camera and a writing pattern data that has been input in the PC 1002 previously. Thereafter, the PC 1002 controls the amount of light output from the acoustooptical modulator 1006 through the driver 1011 and laser light output from the laser oscillator 1003 is attenuated by the optical system 1005 so that the amount of light is controlled by the acoustooptical modulator 1006 to have a predetermined amount. Meanwhile, a light path and a shape of the laser light (a beam spot) output from the acoustooptical modulator 1006 are changed by the optical system 1007 and the light is condensed by the lens. Thereafter, the condensed laser light is emitted to a subject material formed over the substrate to change a property of the subject material. At this moment, the substrate transferring mechanism 1009 is controlled to be moved in the X direction and the Y direction according to the transferring data generated by the PC 1002. Accordingly, the laser light is emitted to a predetermined portion so that the subject material is subjected to the exposure treatment.

As a consequence, the subject material is exposed to the laser light in the region irradiated with the laser light. Photosensitive substances are largely classified into negative types and positive types. In the case of the negative type photosensitive substance, chemical reaction is caused in a portion where is exposed to light and only the portion where the chemical reaction is caused is left by using a developing solution to form a pattern. Meanwhile, in the case of the positive type photosensitive substance, chemical reaction is caused in a portion where is exposed to light, and the portion in which the chemical reaction is caused is dissolved by a developing solution while a portion where is not exposed to light remains as a pattern. Since the energy of laser light is partly converted into heat by a substance of the subject material and the heat reacts with a part of the subject material, the width of the subject material, where is irradiated with the laser light, becomes sometimes slight larger than the width of the laser light. In addition, laser light with a shorter wavelength can be condensed to have a shorter diameter of the laser light, and therefore, laser light with a short wavelength is preferably emitted to form a subject region with a fine width.

The laser light is processed by an optical system so as to have a beam spot with a dot shape, a circular shape, an elliptical shape, a rectangular shape, or a linear shape (more specifically, an elongated rectangular shape) over the surface of a film.

FIG. 28 shows an example where the top surface of the substrate is irradiated with the laser light to be exposed. Alternatively, a laser beam writing device in which the back surface of the substrate is irradiated with the laser light by appropriately changing an optical system and a substrate transferring mechanism may be used.

Although the laser light is herein selectively emitted to the substrate while moving the substrate, the present invention is not limited thereto. Alternatively, laser light can be emitted to the substrate while scanning the laser light in the X-Y axis directions. In this case, a polygon mirror, a galvanometer mirror or an acoustic-optic deflector (AOD) is preferably used as the optical system 1007. Also, the laser beam may be scanned in one direction of the X and Y axes while the substrate may be moved in the other direction of the X and Y axes so that a predetermined part of the substrate may be irradiated with the laser beam.

Also, light of a lamp source can be used in combination with laser light. In this case, a large region can be irradiated with light of the lamp using a mask while only a microscopic region can be irradiated with laser light. According to this light irradiation treatment, the throughput can be improved and a wiring substrate or the like that is patterned precisely can be obtained.

The present embodiment mode will be described with reference to FIGS. 1A and 1B, FIGS. 2A to 2C, FIGS. 3A to 3C, FIGS. 4A to 4C, FIGS. 5A to 5C, FIGS. 6A to 6D, FIGS. 7A to 7D, and FIGS. 8A to 8F. Concretely, a method for manufacturing a display device according to the present invention will be described. At first, a method for manufacturing a display device having a top-gate type thin film transistor with a planar structure will be described. FIGS. 2A, 3A, 4A and 5A are top views of a pixel portion for display device. FIGS. 2B, 3B, 4B and 5B are cross sectional views along lines A-C of FIGS. 2A, 3A, 4A and 5A. FIGS. 2C, 3C, 4C and 5C are cross sectional views along lines B-D of FIGS. 2A, 3A, 4A and 5A.

As a substrate 100, a glass substrate made of barium borosilicate glass, alumino borosilicate glass or the like, a quartz substrate, a silicon substrate, a metal substrate, a stainless substrate or a plastic substrate that can withstand a processing temperature of the present manufacturing process is used. The surface of the substrate 100 may be polished by the CMP method to be leveled. An insulating layer may be formed on the substrate 100. The insulating layer is made from an oxide material containing silicon or a nitride material containing silicon by a known method such as CVD, plasma CVD, sputtering and spin coating so as to have a single layer or a lamination layer. A large-area substrate having an area of, for example, 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm can be used as the substrate 100.

An insulating layer 140 is preferably formed on the substrate 100, as a base film. This insulating layer 140 can prevent contaminants and the like from penetrating through the substrate 100. The insulating layer 140 is formed using an oxide material or a nitride material containing silicon on the substrate 100 as the base film by sputtering, CVD (chemical vapor deposition) such as PVD (physical vapor deposition), reduced pressure CVD (chemical vapor deposition) and plasma CVD, spin coating or the like to have a single layer or multiple layers. In this embodiment mode, a silicon nitride oxide (SiNO) film with a thickness of 10 to 300 nm (more preferably, 50 to 100 nm) is formed and a silicon oxynitride (SiON) film with a thickness of 50 to 300 nm (more preferably, 100 to 150 nm) is laminated thereon by plasma CVD to form the insulating layer 140.

As the insulating layer, silicon oxide (SiOx), silicon nitride (SiNx), silicon oxynitride (SiOxNy) (x>y), silicon nitride oxide (SiNxOy) (x>y), and the like can be used. The insulating layer may include a single layer or a lamination structure having two or more layers. Further, the silicon oxynitride indicates a substrate in which a composition ratio of oxygen is higher than that of nitrogen (SiOxNy) (x>y) in this specification, which is also referred to as silicon oxide containing nitrogen. Similarly, the silicon nitride oxide indicates a substance in which a composition ratio of nitrogen is higher than that of oxygen (SiNxOy) (x>y), which is also referred to as silicon nitride containing oxygen. In this embodiment mode, a silicon nitride oxide film is formed to have a thickness of 50 nm using $SiH_4$, $NH_3$, $N_2O$, $N_2$ and $H_2$ as reaction gases, and a silicon oxynitride film having a thickness of 100 nm is laminated thereon using $SiH_4$ and $N_2O$ as reaction gases. Alternatively, the thickness of the silicon nitride oxide film may be set to be 140 nm and the thickness of the silicon oxynitride film, which is laminated on the silicon nitride oxide film, may be set to be 100 nm. As other examples of laminated layers, a lamination structure formed by sequentially laminating a silicon nitride oxide film, a silicon oxynitride film and a silicon nitride oxide film over a substrate, or a lamination structure formed by sequentially laminating a silicon nitride film, a silicon oxide film and a silicon nitride film may be employed.

Preferably, a silicon nitride film or a silicon nitride oxide film with a thickness of 0.3 to 5 nm is formed in a top layer of the insulating layer 101 that will be in contact with a semiconductor layer. In this embodiment mode, a metal element that accelerates crystallization (nickel is used in this embodiment mode) is added to the semiconductor layer, and then the metal element is removed by a gettering treatment. A favorable interface is formed between the silicon oxide film and the silicon film. However, the metal element in the silicon film reacts with oxygen included in the silicon oxide in the interface therebetween to be easily changed into metal oxide (which is nickel oxide (NiOx) in this embodiment mode), and therefore, the metal element is sometimes difficult to be removed by the gettering treatment. Also, the silicon nitride film possibly adversely affects an interface with the semiconductor layer due to stress of the silicon nitride film or influence of a trap. Therefore, a silicon nitride film with a thickness of 0.3 to 5 nm or a silicon nitride oxide film is formed in a top layer of the insulating layer to be in contact with the semiconductor layer. In this embodiment mode, after laminating the silicon nitride oxide film and the silicon oxynitride film together over the substrate 100, a silicon nitride film or a silicon nitride oxide film with a thickness of 0.3 to 5 nm is formed on the silicon oxynitride film to form the insulating layer having three-layer structure. According to this structure, an effect of gettering the metal element included in the semiconductor layer can be improved, reducing the adverse effect of the silicon nitride film with respect to the semiconductor layer. The insulating layer is preferably formed by successively laminating the layers at a same temperature in a same chamber by changing reaction gases while maintaining a vacuum state. When the films are successively laminated while maintaining the vacuum state, interfaces between the laminated films can be prevented from being contaminated.

A semiconductor film is next formed. A specific method for manufacturing the semiconductor layer will be described with reference to FIGS. 7A to 7D. Although FIGS. 7A to 7D shows a method for manufacturing only a semiconductor layer 102, a semiconductor layer 103 may also be formed in the same manner. A semiconductor film may be formed to have a thickness of 25 to 200 nm (preferably, 30 to 150 nm) by a known method (e.g., sputtering, LPCVD, plasma CVD or the like). In this embodiment mode, a crystalline semiconductor film that is formed by crystallizing an amorphous semiconductor film is preferably used.

As a material of the semiconductor film, an amorphous semiconductor (hereinafter, "AS") manufactured by the vapor growth method or sputtering using a semiconductor material gas typified by silane or germanium; a polycrystalline semiconductor that is formed by crystallizing the amorphous semiconductor by utilizing heat energy; a semiamorphous semiconductor (also referred to as a fine crystal semiconductor or a microcrystalline semiconductor, hereinafter, "SAS") or the like can be used.

The SAS has an intermediate structure between an amorphous structure and a crystalline structure (including a single crystalline structure and a polycrystalline structure), and a third condition that is stable in term of free energy. The SAS further includes a crystalline region having a short range order along with lattice distortion. A crystal region with a size of 0.5 to 20 nm can be observed in at least a part of a semi-amorphous semiconductor film. In the case of containing silicon as its principal constituent, Raman spectrum is shifted toward lower wavenumbers than 520 $cm^{-1}$. The diffraction peaks of (111) and (220), which are believed to be derived from silicon crystal lattice, are observed in the SAS by X-ray diffraction. The SAS contains hydrogen or halogen of at least 1 atom % or more as a neutralizing agent for terminating dangling bonds. The SAS is formed by glow discharge decomposition with silicide gas (plasma CVD). As for the silicide gas, $SiH_4$, $Si_2H_6$, $SiH_2Cl_2$, $SiHCl_3$, $SiCl_4$, $SiF_4$ and the like can be used. In addition, $F_2$ or $GeF_4$ may be mixed in the silicide gas. The silicide gas may also be diluted with $H_2$, or a mixture of $H_2$ and one or more of rare gas elements selected from He, Ar, Kr and Ne. The dilution ratio is set to be in the range of 1:2 to 1:1,000. The pressure is set to be approximately in the range of 0.1 to 133 Pa. The power frequency is set to be 1 to 120 MHz, and preferably, 13 to 60 MHz. The substrate heating temperature is preferably 300° C. or less, and more preferably, 100 to 200° C. With respect to impurity elements contained in the film, each concentration of impurities for atmospheric constituents such as oxygen, nitrogen and carbon is preferably set to be $1\times10^{20}$ $cm^{-3}$ or less. In particular, the oxygen concentration is preferably set to be $5\times10^{19}$ $cm^{-3}$ or less, and more preferably, $1\times10^{19}$ $cm^{-3}$ or less. In addition, when the lattice distortion is further accelerated by adding a rare gas element such as helium, argon, krypton and neon, a favorable SAS having an increased stability can be obtained. Furthermore, an SAS layer formed using hydrogen gas may be laminated with an SAS layer formed using fluorine gas.

Figure 7A:
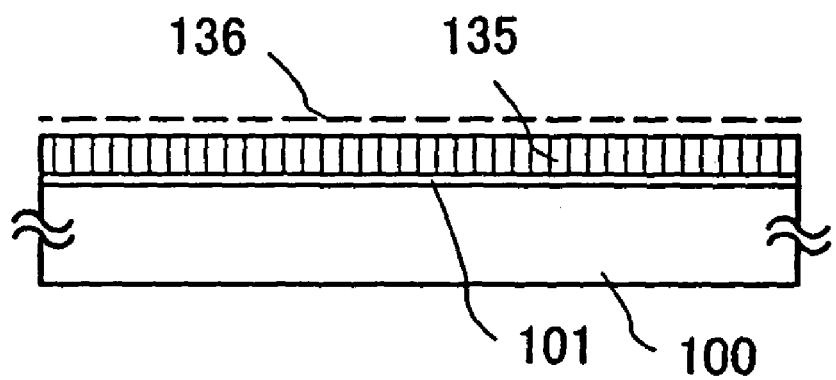
FIGS. 7A to 7D are cross sectional views explaining a method for manufacturing a display device according to the present invention.
Figure 7B:
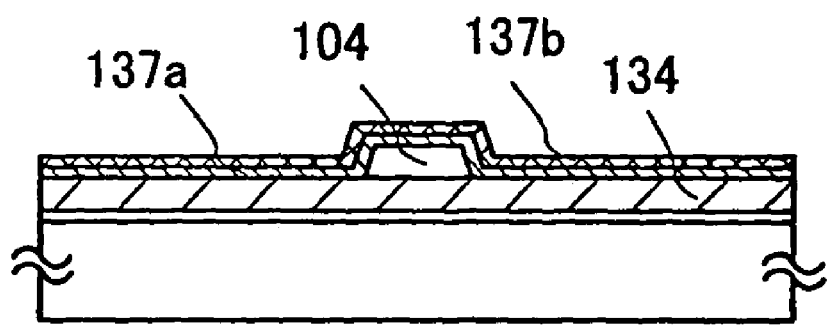

In order to obtain a semiconductor film having a favorable crystal structure after crystallization, the concentrations of impurities such as oxygen and nitrogen included in an amorphous semiconductor film 135 as shown in FIG. 7A are preferably reduced to be $5\times10^{18}$ $cm^3$ or less (hereinafter, a concentration is shown as an atomic concentration measured by secondary ion mass spectrometers (SIMS)). These impurities easily reacts with a catalytic element, inhibiting the crystallization that will be performed later and increasing the density of a trapping center or a recombination center after crystallization.

In this embodiment mode, thermal crystallization using an element that promotes the crystallization of an amorphous semiconductor film or an SAS film is used. As a heating method, there are RTA methods such as GRTA (gas rapid thermal annealing) and LRTA (lamp rapid thermal annealing).

A method for introducing a metal element into the amorphous semiconductor film is not particularly limited so long as it is a technique that can introduce the metal element into a surface or inside of the amorphous semiconductor film. For example, sputtering, CVD, plasma processing (including plasma CVD), absorbing, a method for coating a solution of metal salt, ion implantation, ion doping or the like can be used. The above-mentioned method using the solution of metal salt is easy and convenient, and has an advantage of easily controlling the concentration of the metal element. Also, to improve the wettability of the surface of the amorphous semiconductor film and spread an aqueous solution over an entire surface of the amorphous semiconductor film, an oxide film is preferably formed by irradiation with UV light under oxygen atmosphere, thermal oxidation, a treatment using ozone water containing hydroxyl radical or oxygenated water, or the like.

In this embodiment mode, the amorphous semiconductor film 135 is formed on the insulating layer 101, and the amorphous semiconductor film 135 is crystallized to form a crystalline semiconductor film 134. As the amorphous semiconductor film 135, amorphous silicon formed using reaction gases of $SiH_4$ and $H_2$ is used. In this embodiment mode, the concentration of oxygen included in the amorphous semiconductor film 135 is adjusted to be $5 \times 10^{19}$ atom/cm³ or less, more preferably, $2 \times 10^{19}$ atom/cm³ or less. When the concentration of an impurity element such as the oxygen is reduced, gettering defects such as gettering residue are difficult to be generated in gettering nickel that will be doped into the semiconductor film later as a metal element. The thickness of the amorphous semiconductor film 135 is preferably set to be 50 to 300 nm. In this embodiment mode, the amorphous semiconductor film 135 is formed to have a thickness of 50 nm.

After removing the oxide film formed on the amorphous semiconductor film, another oxide film with 10 to 50 Å is formed by irradiation with UV light under oxygen atmosphere, thermal oxidation, a treatment using ozone water containing hydroxyl radical or hydrogenated water, or the like. In this embodiment mode, Ni is used as an element for promoting the crystallization. An aqueous solution containing 10 to 100 ppm (preferably, 10 to 50 ppm) by weight of an Ni element is applied by spin coating to form a metal film 136 (see FIG. 7A). One or more of iron (Fe), nickel (Ni), cobalt (Co), ruthenium (Ru), rhodium (Rh), palladium (Pd), osmium (Os), iridium (Ir), platinum (Pt), copper (Cu) and gold (Au) can be used as the element(s) for promoting the crystallization to form the metal film 136. The metal film 136 has an extremely thin thickness depending on its formation condition, and it may not have a film form. The metal film 136 is preferably formed in contact with the amorphous semiconductor film 135 to exhibit an effect of promoting the crystallization.

Next, the amorphous semiconductor film 135 is heated to form a crystalline semiconductor film 134. In this case, silicide is formed in a part of the semiconductor film where is in contact with the metal element for promoting the crystallization of a semiconductor, and the crystallization is enhanced utilizing the silicide as a core. Here, after performing a heat treatment for dehydrogenation, a heat treatment for crystallization is performed (at 550 to 650° C. for 5 minutes to 24 hours). Alternatively, the crystallization may be carried out using RTA or GRTA. The crystallization is performed without using laser light irradiation in the heat treatment so that variation in crystallinity can be reduced, thereby making it possible to suppress variation in a TFT, which will be formed later.

The heat treatment is performed at 550° C. for 4 hours in this embodiment mode. Alternatively, the heat treatment may be performed at 650° C. for 6 minutes by RTA.

A minute amount of an impurity element (boron or phosphorus) may be doped into the thus obtained crystalline semiconductor film 134 to control the threshold voltage of a thin film transistor. This impurity element may be doped into the amorphous semiconductor film before the crystallization process. Alternatively, after reducing or removing the metal element included in the crystalline semiconductor film 134 through the gettering step, this impurity element may be doped into the crystalline semiconductor film. In this embodiment mode, boron is doped into the crystalline semiconductor film 134 by ion doping where diborane ($B_2H_6$) is plasma excited without mass-separating it. Further, an ion implantation method performing mass separation may be employed. When an impurity element is doped into an amorphous semiconductor film, the impurity element can be activated by the heat treatment that is performed later for crystallization of the amorphous semiconductor film. In addition, defects caused in doping the impurity element can also be improved by the heat treatment.

The crystalline semiconductor film 134 is patterned in a latter step to be plural semiconductor layers. An insulating layer that will be a channel protection layer for protecting each channel formation region of the respective semiconductor layers is formed on the crystalline semiconductor film 134. As the channel protection layer, a film including one or more kinds selected from an inorganic material (e.g., silicon oxide, silicon nitride, silicon oxynitride, silicon nitride oxide, or the like), a photosensitive or nonphotosensitive organic (resin) material (e.g., polyimide, acrylic, polyamide, polyimide amide, benzocyclobutene, and the like), resist, a low-k material that has a low dielectric constant, and the like can be used. Alternatively, a lamination layer of these films can be used. Also, siloxane resin may be used. Further, the siloxane resin corresponds to resin containing Si—O—Si bonds. The siloxane includes skeleton that is formed with bonds of silicon (Si) and oxygen (O). As a substituent of the siloxane, an organic group that includes at least hydrogen (for example, alkyl group or aromatic hydrocarbon) is used. Also, fluoro group may be used as its substituent. Further, the organic group including at least hydrogen and the fluoro group may be used as its substituent. The channel protection layer may be formed by the vapor growth method such as plasma CVD and thermal CVD, or sputtering. The channel protection layer may also be formed by dropping polyimide, polyvinyl alcohol or the like using the droplet discharging method. This allows to eliminate the exposure step. Furthermore, printing (that is a method for forming a pattern selectively such as screen printing and offset printing) may also be used for forming the channel protection layer. A TOF film or an SOG film obtained by a coating method can also be used. In this embodiment mode, after removing the oxide film formed on the crystalline semiconductor film 134, a silicon oxide film with a thickness of 50 nm is formed on the crystalline semiconductor film 134 and then patterned to selectively form a channel protection layer 104 in a channel formation region (see FIG. 7B). When a mask that is used in patterning the channel protection layer 104 is processed through the exposure treatment using laser light, the silicon oxide film can be patterned precisely and accurately, making it possible to form the channel protection layer having a desired shape with good controllability.

When the crystallization is carried out using a metal element, a gettering step is performed to reduce or eliminate the metal element. A semiconductor film is formed in contact with the crystalline semiconductor film 134 as a layer for absorbing the metal element included in the crystalline semiconductor film 134. In this embodiment mode, an amorphous semiconductor film including an impurity element is formed as a gettering sink to capture the metal element. At first, the oxide film formed on the crystalline semiconductor film 134 is removed through a washing treatment. Subsequently, a semiconductor film 137a and a semiconductor film 137b are formed thereon by plasma CVD. The thickness of the semiconductor film 137a is set to be 30 to 100 nm (typically, 40 to 60 nm) and the thickness of the semiconductor film 137b is set to be 20 to 200 nm (typically, 50 to 150 nm). The semiconductor films 137a and 137b both contain an impurity element. As the impurity element, an impurity element imparting an n-type conductivity, an impurity element imparting a p-type conductivity, a rare gas element and the like can be used. For example, one or more of phosphorus (P), nitrogen (N), arsenic (As), antimony (Sb), bismuth (Bi), boron (B), helium (He), neon (Ne), argon (Ar), krypton (Kr) and xenon (Xe) may be used. Alternatively, an rare gas element such as argon may be added into a semiconductor layer having an n-type conductivity that contains an impurity element imparting an n-type conductivity to be used. In this embodiment mode, the semiconductor films 137a and 137b contain an impurity element imparting an n-type conductivity (which is phosphorus in this embodiment mode), wherein the concentration of the impurity element of the semiconductor film 137a is set to be lower than that of the semiconductor film 137b. With respect to the impurity element, the semiconductor films may be formed to contain the impurity element by CVD or the like. Alternatively, the impurity element may be added into the semiconductor films by ion doping or the like after forming the semiconductor films.

The semiconductor film 137a is formed as an n-type low concentration impurity region (also denoted by an n⁻ region) while the semiconductor film 137b is formed as an n-type high concentration impurity region (also denoted by an n⁺ region). Accordingly, an impurity element imparting the n-type conductivity are dispersed in the respective semiconductor films 137a and 137b at a constant concentration in the depth direction, where the concentration of the impurity elements imparting the n-type conductivity, which is dispersed in the semiconductor film 137a, is lower than that of the semiconductor film 137b. The semiconductor film 137b, where is the n⁺ region, will serve as a source or drain region later whereas the semiconductor film 137a, where is the n⁻ region, will serve as an LDD (lightly doped drain) region. Further, there is an interface between the n⁺ region and the n⁻ region since they are formed individually. The thicknesses of the n⁺ region and the n⁻ region can be controlled by controlling the thicknesses of the respective semiconductor films having different concentrations of the impurity element.

Meanwhile, a semiconductor film may be formed and added with an impurity element imparting an n-type conductivity by ion doping or ion implantation. In this case, the distribution of the concentration for the impurity element included in the semiconductor film having one conductivity may be controlled by their doping condition. As well as the semiconductor films 137a and 137b of the present embodiment mode, an n-type high concentration impurity region (also denoted by an n⁺ region) having a concentration of an impurity element imparting an n-type conductivity of $1\times10^{19}/cm^3$ or more, which is a upper part, is provided in the surface of the semiconductor film in the thickness direction, while an n-type low concentration impurity region (also denoted by an n⁻ region) having a concentration of the impurity element imparting the n-type conductivity of $1\times10^{16}$ to $1\times10^{19}/cm^3$ (preferably, $5\times10^{18}/cm^3$), which is a lower part, is provided in the bottom of the semiconductor film where is far from the surface of the semiconductor film. The n⁺ region functions as a source region or a drain region while the n⁻ region functions as an LDD region. Further, there is no interface between the n⁺ region and the n⁻ region, and the n⁺ region and the n⁻ region are changed relative to each other depending on the amounts of the concentrations of the impurity element imparting the n-type conductivity. In the case of the semiconductor film containing the impurity element that imparts the n-type conductivity formed by ion doping or ion implantation, the thicknesses of the n⁺ region and the n⁻ region can be arbitrarily controlled by controlling the concentration profiles depending on the doping condition. Since the semiconductor film has both the n⁺ region and the n⁻ region, the effect of reducing the electric field is improved, making it possible to form a thin film transistor with an improved resistance property with respect to hot carriers.

In this embodiment mode, a silicon film containing phosphorus, which is an impurity element imparting an n-type conductivity (a donor-type element), is formed as the semiconductor films 137a and 137b by plasma CVD. Since the concentrations of the impurity element imparting the n-type conductivity are differed between the semiconductor films 137a and 137b, the semiconductor film 137a becomes an n-type low concentration impurity region while the semiconductor film 137b becomes an n-type high concentration impurity region. The impurity concentration of the n-type low concentration impurity region can be set to be $1\times10^{16}$ to $1\times10^{19}/cm^3$, preferably, $5\times10^{16}$ to $5\times10^{18}/cm^3$, whereas the impurity concentration of the n-type high concentration impurity region is preferably set to be 10 to 100 times of the concentration of the n-type low concentration impurity region, and can be set to be $1\times10^{19}$ to $3\times10^{21}$ /cm³. The thickness of the semiconductor film 137a, which is the n-type low concentration impurity region, is set to be 20 to 200 nm, and typically, 50 to 150 nm. In this embodiment mode, the semiconductor film 137a is formed to have a thickness of 50 nm. The thickness of the semiconductor film 137b, which is the n-type high concentration impurity region, is set to be 30 to 100 nm, typically, 40 to 60 nm. In this embodiment mode, the semiconductor film 137b is formed to have a thickness of 50 nm.

Figure 7C:
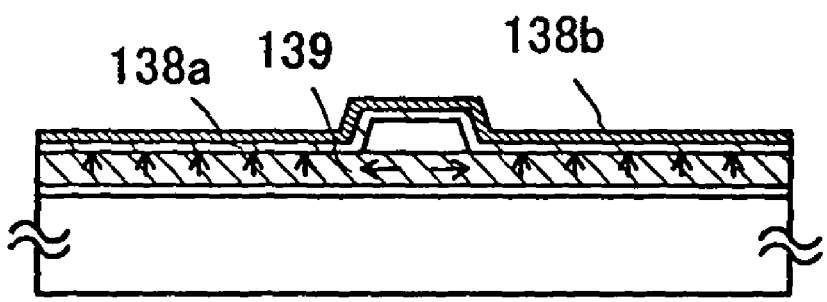
Figure 7D:
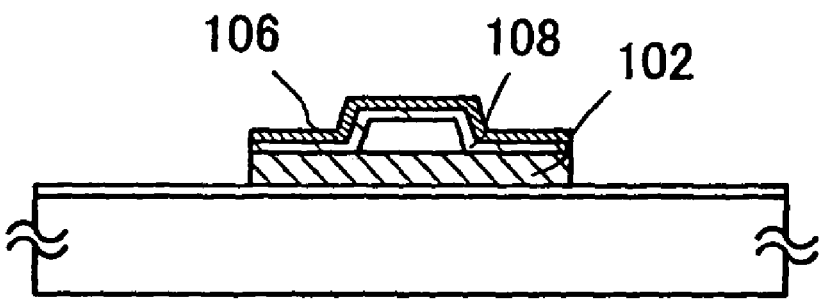

Thereafter, a heat treatment is performed to reduce or eliminate the metal element. The metal element included in the crystalline semiconductor film 134 moves in directions of arrows as shown in FIG. 7C by the heat treatment so that the metal element is captured in the semiconductor films 137a and 137b. The crystalline semiconductor film 134 where the metal element included therein is removed by the heat treatment becomes a crystalline semiconductor film 139 while the semiconductor films 137a and 137b become semiconductor films 138a and 138b containing the metal element that promotes the crystallization. In this embodiment mode, the semiconductor films 138a and 138b contain the impurity element imparting the n-type conductivity and the metal element promoting the crystallization. According to this process, the concentration of the metal element promoting the crystallization (a nickel element in this embodiment mode), which is included in the crystalline semiconductor film, can be adjusted not to adversely affect the device characteristics, or, set to be $1\times10^{18}/cm^3$ or less, and desirably, $1\times10^{17}/cm^3$ Further, the semiconductor films 138a and 138b, to which the metal element moves after the gettering treatment, are sometimes crystallized by the heat treatment. Furthermore, the impurity element (the donor type element) imparting the n-type conductivity is activated in this embodiment mode, along with the gettering step. The heat treatment may be carried out under nitrogen atmosphere. The heat treatment is carried out at 550° C. for 4 hours in this embodiment mode. Alternatively, the heat treatment may be performed at 650° C. for 6 minutes by RTA.

Next, the crystalline semiconductor film 139 and the semiconductor films 138a and 138b are patterned using a mask. In this embodiment mode, a photomask is fabricated, and these films are subjected to a patterning treatment using photolithography while using the photomask to form a semiconductor layer 102, a semiconductor layer 106 having an n-type conductivity, and a semiconductor layer 108 having an n-type conductivity (see FIG. 7D). Similarly, a semiconductor layer 103, a channel protection layer 105, a semiconductor layer 107 having an n-type conductivity and a semiconductor layer 109 having an n-type conductivity are formed (see FIG. 2C). The photomask may be formed over the entire surface of the substrate by spin coating or the like or selectively formed thereover by the droplet discharging method, and then exposed to laser light or the like to form a mask with a microscopic pattern. Using the mask with the microscopic pattern makes it possible to form a semiconductor film having a predetermined shape minutely and precisely.

Alternatively, by using a resin material such as epoxy resin, acrylic resin, phenol resin, novolac resin, melamine resin and urethane resin, a composition may be selectively discharged to form a mask without performing the exposure treatment. Also, the mask can be formed using an organic material such as benzocyclobutene, parylene, flare and polyimide having a light transmitting property; a compound material formed by polymerization of siloxane polymer and the like; a composition material containing a water-soluble homopolymer and a water-soluble copolymer; or the like by using the droplet discharging method. The surface tension and the viscosity of any material are appropriately adjusted by controlling the concentration of a solvent or by adding a surface-active agent, or the like.

Either plasma etching (dry etching) or wet etching may be employed for the etching treatment in patterning. In the case where a large-area substrate is processed by etching, the plasma etching is preferable. As an etching gas, a gas containing fluorine such as $CF_4$, $NF_3$, $SF_6$ and $CHF_3$, a gas containing chlorine typified by $Cl_2$, $BCl_3$, $SiCl_4$ or $CCl_4$, or $O_2$ gas may be used. In addition, an inert gas such as He and Ar may further be added thereto, appropriately. When the etching is performed under an atmospheric pressure discharge, electric discharge machining can be performed locally, and therefore, a mask layer is not necessary to be formed over an entire surface of a substrate.

A composition containing a conductive material is discharged to form a source or drain electrode layer 114, a source or drain electrode layer 115, a source or drain electrode layer 116 and a source or drain electrode layer 117. By utilizing the source or drain electrode layers 114, 115, 116 and 117 as masks, the semiconductor layer 106 having the n-type conductivity, the semiconductor layer 108 having the n-type conductivity, a semiconductor layer 107 having the n-type conductivity and a semiconductor layer 109 having the n-type conductivity are patterned to form semiconductor layers 110a, 110b, 111a, 111b, 112a, 112b, 113a, and 113b having the n-type conductivity (see FIGS. 3A to 3C). The source or drain electrode layer 114 also serves as a wiring layer and the source or drain electrode layer 116 also serves as a power supply line.

The source or drain electrode layers are preferably formed by a known method such as printing, electrolytic plating, PVD (physical vapor deposition), CVD (chemical vapor deposition) and evaporation. Also, the source or drain electrode layers can be formed into predetermined patterns by the droplet discharging method. As materials for the source or drain electrode layers, metal such as tungsten (W), molybdenum (Mo), zirconium (Zr), hafnium (Hf), vanadium (V), niobium (Nb), tantalum (Ta), chromium (Cr), cobalt (Co), nickel (Ni), platinum (Pt), aluminum (Al), silver (Ag), gold (Au) and copper (Cu), or an alloy thereof, or metal nitride thereof can arbitrarily be used. In addition, plural layers including the above mentioned materials may be laminated to form the source or drain electrode layers. Typically, a tantalum nitride film and a tungsten film may be sequentially laminated over the surface of the substrate. Additionally, a material formed by mixing silicon and an impurity element imparting one conductivity type may be used. For example, an amorphous silicon film having an n-type conductivity that contains an impurity element imparting an n-type conductivity such as phosphorus (P) can be used.

Moreover, the source or drain electrode layers may be formed using a conductive material with a light transmitting property. For instance, the source or drain electrode layers may be made from indium tin oxide (ITO), indium tin oxide containing silicon oxide (ITSO), zinc oxide (ZnO), tin oxide ($SnO_2$) or the like. Preferably, they are made from indium tin oxide (ITO), indium tin oxide containing silicon oxide (ITSO), zinc oxide (ZnO) or the like by sputtering. More preferably, they are formed using indium tin oxide containing silicon oxide by sputtering with use of a target in which 2 to 10 weight % silicon oxide is included in the ITO. In addition, a conductive material such as an alloy of indium oxide and zinc oxide including silicon oxide, in which 2 to 20% zinc oxide (ZnO) is mixed in indium oxide, may be used.

In this embodiment mode, a composition containing silver is discharged as a conductive material and then is baked at 550° C. to form the source or drain electrode layers 114, 115, 116 and 117. In a top-gate type planar structure formed in this embodiment mode, the step of forming the conductive layers such as a source electrode layer, a drain electrode layer and a gate electrode layer are performed after forming the semiconductor layer, which is a crystalline semiconductor, through the heat treatment, and therefore, a high heat-resistant material can be used as the conductive layers. Consequently, the range of choices for materials of the source or drain electrode layers is widened. In addition, the reliability is improved since defects in shape, functions and characteristics of the conductive layers such as the electrode layers are not caused due to the heat treatment.

Droplet discharging means generically represents means for discharging a droplet such as a nozzle comprising a discharge port for a composition and a head comprising one or plural nozzles. The diameter of a nozzle equipped with the droplet discharging means is set to be 0.02 to 100 μm (preferably, 30 μm or less). The amount of the droplet discharged through the nozzle is set to be 0.001 to 100 pl (preferably, 0.1 pl or more and 40 pl or less, more preferably, 10 pl or less). The discharge amount is increased in proportion to the size of the nozzle. The discharge port of the nozzle is preferably closer to a subject portion as much as possible. Preferably, the distance between the discharge port and the subject portion is set to be about 0.1 to 3 mm (more preferably, 1 mm or less).

As the composition discharged through the discharge port, a conductive material dissolved or dispersed in a solvent is used. As the conductive material, metal such as Ag, Au, Cu, Ni, Pt, Pd, Ir, Rh, W and Al, metallic sulfide such as Cd and Zn, oxide such as Fe, Ti, Si, Ge, Zr and Ba, a fine particle or a dispersant nanometer-size particle of silver halide or the like can be used. In addition, indium tin oxide (ITO) used as a conductive film with a light transmitting property, ITSO including indium tin oxide and silicon oxide, organic indium, organic tin, zinc oxide, titanium nitride and the like can be used. A plurality of the above-mentioned metal elements may be mixed in the conductive material. Further, in consideration of a specific resistance value, a solvent in which any one of gold, silver and copper is dissolved or dispersed is preferably used as the composition discharged through the discharge port. More preferably, low-resistance silver or copper is used. When using silver or copper, a barrier film is preferably provided in combination with the silver or copper to prevent impurities. As the barrier film, a silicon nitride film or nickel boron (NiB) can be employed.

Also, a particle having plural layers in which a conductive material is coated with another conductive material may be used. For example, a three-layered particle in which copper is coated with nickel boron (NiB) and the nickel boron is coated with silver, or the like may be used. As for the solvent, ester such as butyl acetate and ethyl acetate; alcohol such as isopropyl alcohol and ethyl alcohol; an organic solvent such as methyl ethyl ketone and acetone; and the like is used. The viscosity of the composition is preferably set to be 20 mPa·s (cps) or less in order to prevent dryness of the composition and discharge the composition fluently through the discharge port. The surface tension of the composition is preferably, set to be 40 mN/m or less. The viscosity and the like of the composition may be adjusted properly according to a solvent to be used and an intended purpose. For example, the viscosity of a composition in which ITO, organic indium and organic tin are dissolved or dispersed in a solvent is preferably set to be 5 to 20 mPa·s; the viscosity of a composition in which silver is dissolved or dispersed in a solvent may be set to be 5 to 20 mPa·s; and the viscosity of a composition in which gold is dissolved or dispersed in a solvent may be set to be 5 to 20 mPa·s.

Also, a plurality of conductive materials may be laminated to one another. Alternatively, conductive layers may be formed using silver as a conductive material by the droplet discharging method and then the conductive layers may be coated with copper and the like. The plating may be performed by electroplating or chemical (electroless) plating. A surface of the substrate may be soaked in a container filled with a solution including a material for plating. Alternatively, the substrate may be fixed obliquely (or perpendicularly) and a solution including a material for plating flows over the surface of the substrate such that the surface thereof is coated with the solution. This case has an advantage of miniaturizing a processing device.

Although the diameter of a conductive particle depends on the diameter of each nozzle, a shape of a predetermined pattern and the like, the size of the conductive particle is preferably as small as possible for the purpose of preventing a clogged nozzle and manufacturing a microscopic pattern. Preferably, the diameter of the particle is set to be 0.1 µm or less. The composition is formed by a known method such as electrolyzing, atomizing and wet reducing, and the particle size thereof is typically about 0.01 to 10 µm. However, in the case of using a gas evaporation method, each nanometer-size particle protected with a dispersing agent is microscopic and is about 7 nm in size. Further, when each surface of the nanometer-size particles is covered with a coating material, the nanometer particles in a solvent are not aggregated but are uniformly dispersed in the solvent at a room temperature, and show a property similar to that of aqueous fluid. Therefore, the coating material is preferably used.

When the step of discharging the composition is performed under reduced pressure, a solvent of the composition is vaporized until being attached to an object from discharged through a nozzle, and hence, steps of drying and baking that will be performed later can be omitted. Further, the step of discharging the composition is preferably performed under reduced pressure since an oxide film and the like are not formed on the surfaces of the conductive layers. After discharging the composition to the substrate, one or both of a drying step and a baking step is/are performed. Each step of drying and baking is a step of a heat treatment. For example, the drying step is performed at a temperature of 100° C. for about 3 minutes whereas the baking step is performed at temperatures of 200 to 350° C. for 15 to 60 minutes, and the purposes, temperatures, and time thereof are varied. The drying and baking steps are performed at normal pressure or under reduced pressure by laser light irradiation, rapid thermal annealing, a heating furnace, and the like. Further, the timing of performing the heat treatment is not particularly limited. The substrate may be heated in advance so as to carry out the drying and baking steps favorably. At this time, the heating temperature depends on a material of the substrate and the like, but it is generally set to be 100 to 800° C. (preferably, 200 to 350° C.). According to this process, the nanometer-size particles are in contact with one another and fusing together and fusing bond are accelerated by hardening and shrinking resin in the periphery as well as volatilizing the solvent in the composition or removing the dispersing agent chemically.

A continuous wave or pulsed gas laser or solid state laser may be used for laser light irradiation. An excimer laser, a YAG laser and the like are given as the former gas laser, while lasers using crystals such as YAG, $YVO_4$ and $GdVO_4$ added with Cr, Nd and the like are given for the latter solid state laser Preferably, the continuous wave laser is used in relation to the absorptance of laser light. Alternatively, a so-called hybrid laser irradiation method combining a pulsed oscillation and a continuous wave may be employed. Further, the heat treatment using laser light may be instantaneously performed for several microseconds to several tens seconds so as not to destroy the substrate 100 according to a heat resistant property of the substrate 100. Rapid thermal annealing (RTA) is performed by instantaneously heating the substrate for several microseconds to several minutes while rapidly raising the temperature with an infrared lamp, a halogen lamp, and the like that emits ultraviolet light through infrared light under an inert gas atmosphere. Since this treatment is performed instantaneously, only a thin film of a top surface is substantially heated so that underlying films are not adversely affected. That is, this heat treatment does not adversely affect a substrate having a low heat resistance property such as a plastic substrate. The laser light is controlled to irradiate the electrode layers selectively such that the semiconductor layers of the present invention are not irradiated with the laser light.

Figure 6A:
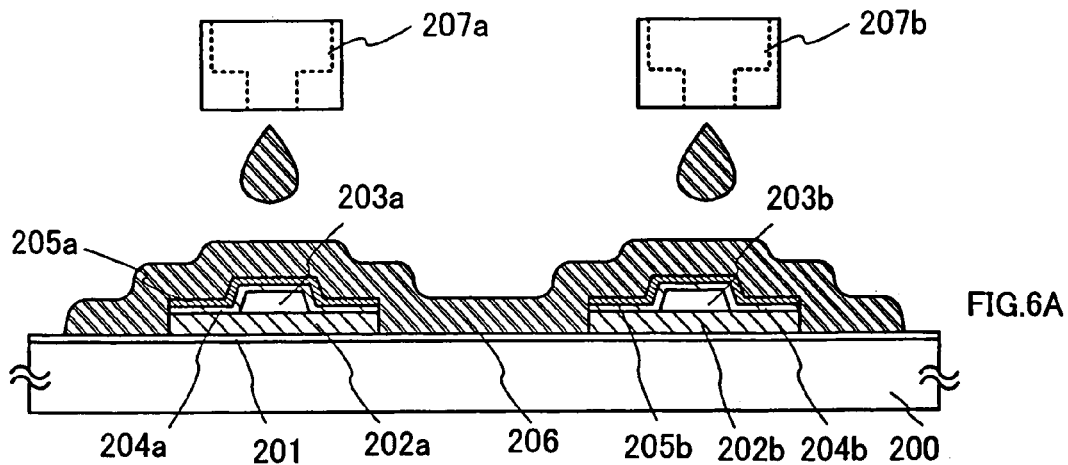
FIGS. 6A to 6D are cross sectional views explaining a method for manufacturing a display device according to the present invention.

A method for manufacturing the source or drain electrode layers will be described with reference to FIGS. 6A to 6D. Since the source or drain electrode layers 114, 115, 116 and 117 are formed to have microscopic patterns, defects such as short-circuiting due to a failure in forming the source or drain electrode layers may be caused so long as they are formed at good controllability. Accordingly, microscopic processing is performed using laser light to pattern the source or drain electrode layers over the semiconductor layers finely. As shown in FIG. 6A, an insulating layer 201, a semiconductor layer 202a, a semiconductor layer 202b, a channel protection layer 203a, a channel protection layer 203b, a semiconductor layer 204a having an n-type conductivity, a semiconductor layer 204b having an n-type conductivity, a semiconductor layer 205a having an n-type conductivity and a semiconductor layer 205b having an n-type conductivity are formed over a substrate 200, and a conductive film 206 is formed to cover these layers. The conductive film 206 can be formed by evaporation, CVD, sputtering or the like. In this embodiment mode, the conductive film 206 is selectively formed by using droplet discharging devices. 207a and 207b (see FIG. 6A). Thereafter, a mask 208 made from resist is formed.

Figure 6B:
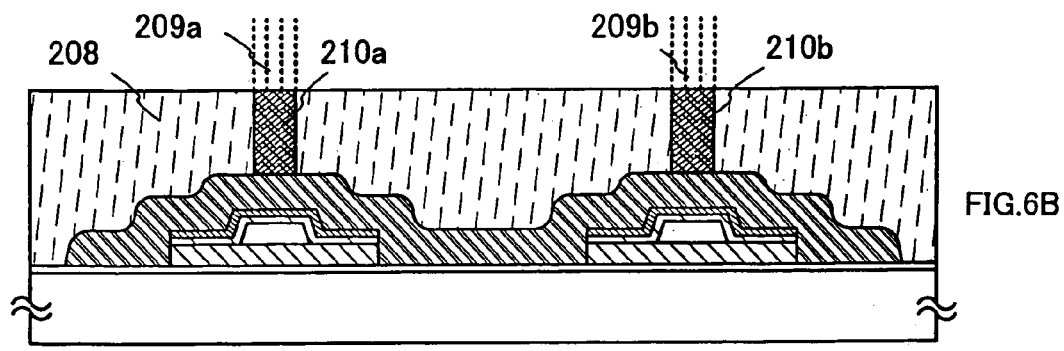
Figure 6C:
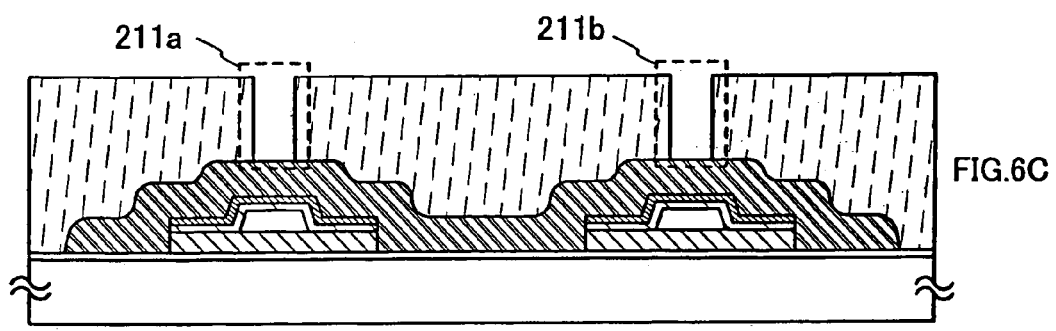
Figure 6D:
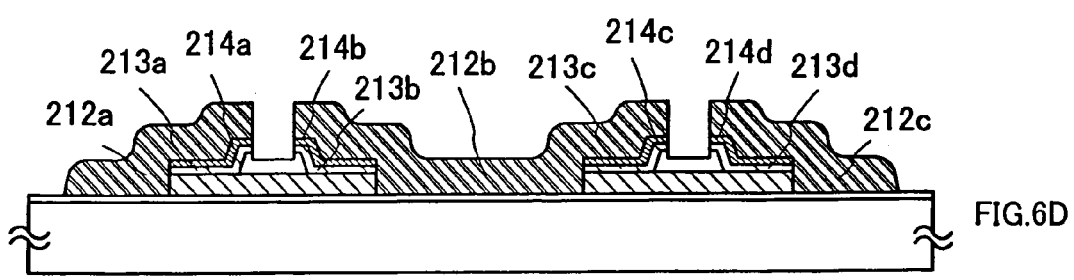

A mask 208 made from resist is irradiated with laser light 209a and laser light 209b and exposed to the light to form exposed regions 210a and 210b (see FIG. 6B). Since positive photosensitive resist is used in this embodiment mode, the mask is exposed to the laser light and the exposed regions 210a and 210b are removed by etchant to form openings 211a and 211b (see FIG. 6C). The conductive film 206 is patterned using the mask, which has the openings 211a and 211b, by etching to form source or drain electrode layers 212a, 212b and 212c. By utilizing the source or drain electrode layers 212a, 212b and 212c as masks, the semiconductor layers 204a, 204b, 205a and 205b having the n-type conductivity are etched, making it possible to form semiconductor layers 213a, 213b, 213c, 213d, 214a, 214b, 214c and 214d having the n-type conductivity (see FIG. 6D). Accordingly, the conductive film can be patterned precisely with good controllability by utilizing a microscopic mask, which is formed using laser light, and therefore, the source or drain electrode layers with predetermined shapes can be formed. Consequently, since failures in forming the source or drain electrode layers are not caused, the reliability of a thin film transistor is improved. Further, the edges of the source or drain electrode layers 212a and 212b where are not patterned by etching can have a curved shape with a radius of curvature. By using the droplet discharging method, the loss of materials is reduced and the manufacturing process is simplified so that there are advantages of low cost and improved productivity.

Channel protection layers are used as etching stoppers in patterning the semiconductor layers, having the n-type conductivity. However, the channel protection layers are sometimes partly etched depending on its etching condition as shown in FIGS. 6A to 6D. Since the channel protection layers are insulating layers for protecting channel formation regions of the semiconductor layers from being etched, etching is carried out under an etching condition so as not to remove all the channel protection layers and not to expose the channel formation regions.

After forming the source or drain electrode layers 114, 115, 116 and 117, they may be planarized by pressing or the like. In pressing the source or drain electrode layers, a heating step may also be carried out. Also, the surfaces of the source or drain electrode layers may be softened or dissolved by using a solvent or the like and the unevenness may be removed by an air knife. Alternatively, the unevenness may be polished by CMP. The source or drain electrode layers are formed by the droplet discharging method, pre-baking is performed, and the pressing step is carried out, followed by a baking step. When the pressing step is carried out prior to performing the baking step, oxygen included in the source or drain electrode layers is released to reduce the oxygen concentration. Therefore, this pressing step has an effect of reducing electric resistance, in addition to planarization of the source or drain electrode layers.

When electrode layers such as the source electrode layers, the drain electrode layers and the gate electrode layers, or wiring layers are formed using a conductive material containing a photosensitive substance with photosensitivity, a conductive film can be directly irradiated with laser light without forming a mask made from resist and an exposure treatment is carried out, followed by elimination using etchant. Accordingly, the conductive film can be patterned into a desired shape. This case has an advantage of simplifying the manufacturing process because of using no masks. As the conductive material containing the photosensitive substance, a material that contains metal such as Ag, Au, Cu, Ni, Al and Pt or an alloy thereof; and an organic high molecular weight resin, a photopolymerization initiator, a photopolymerization monomer, or a photosensitive resin made from a solvent or the like, may be used. As the high molecular weight resin, novolac resin, acrylic copolymer, methacrylic copolymer, a cellulose derivative, cyclized rubber resin, and the like can be used.

Next, a gate insulating layer 125 is formed on the source or drain electrode layers 114, 115, 116 and 117 and the channel protection layers 104 and 105. The gate insulating layer 125 is made using silicon oxide (SiOx), silicon nitride (SiNx), silicon oxynitride (SiOxNy) (x>y), silicon nitride oxide (SiNxOy) (x>y) or the like, arbitrarily. Also, the gate insulating layer 125 may be formed using a single layer including any one of silicon oxide (SiOx), silicon nitride (SiNx), silicon oxynitride (SiOxNy) (x>y), silicon nitride oxide (SiNxOy) (x>y) and the like, or a laminated layer including a combination thereof. Further, hydrogen is included in the gate insulating layer 125 in this embodiment mode. When the conductive layer formed by the droplet discharging method is made from silver, copper or the like, a silicon nitride film or an NiB film is preferably formed on the conductive layer as a barrier film so as to prevent an impurity from dispersing and to planarize the surface thereof. Further, in order to form a dense insulating film having less gate current leakage at a low temperature, a reactive gas containing a rare gas element such as argon may be mixed in the insulating film to be formed. In this embodiment mode, a silicon oxide film with a thickness of 120 nm is formed using $SiH_4$ and $N_2O$ as reactive gases. Furthermore, the gate insulating layer 125 is preferably formed to have a thickness of 80 to 200 nm.

An opening 126 that reaches the source or drain electrode layer 115 is formed in the gate insulating layer 125 by etching. Either dry etching or wet etching may be employed in this etching step. In this opening 126, the source or drain electrode layer 115 and a gate electrode layer 119 to be formed later are electrically connected to each other.

A composition containing a conductive material is discharged on the gate insulating layer 125 from droplet discharging devices 124a and 124b to form a gate electrode layer 118 and a gate electrode layer 119 thereon (see FIG. 4B). The step of forming the gate electrode layers 118 and 119 on the gate insulating layer 125 can be carried out in the same manner as the step of forming the above-described source or drain electrode layers. The gate electrode layer 118 also serves as a gate wiring layer. In this embodiment mode, a composition containing silver is discharged as the conductive material, and then baked at 300° C. to form the gate electrode layers 118 and 119. Forming the gate electrode layer 119 in the opening 126 allows the source or drain electrode layer 114 to be electrically connected to the gate electrode layer 119 in the opening 126.

As the conductive material used for forming the gate electrode layers, a composition mainly containing particles of metal such as Ag (silver), Au (gold), Cu (copper), W (tungsten) and Al (aluminum) can be used. Further, the composition may be used in combination with indium tin oxide (ITO), ITSO including indium tin oxide and silicon oxide, organic indium, organic tin, zinc oxide, titanium nitride or the like having a light transmitting property.

A planarizing step by pressing or the like may be carried out after forming the gate electrode layers 118 and 119 in the same manner as the step of forming the source or drain electrode layers. Further, when the gate electrode layers are formed by the droplet discharging method, pre-baking is performed, and the pressing step is performed prior to carrying out the final-baking, oxygen included in the gate electrode layers is released, in addition to planarization of the gate electrode layers. This provides an effect of reducing the electric resistance.

An insulating film 128 that will be a passivation film is preferably formed to cover the source or drain electrode layers, the semiconductor layers, the gate insulating layer, and the gate electrode layers. The insulating film 128 can be formed using silicon nitride, silicon oxide, silicon nitride oxide, silicon oxynitride, aluminum oxynitride, aluminum oxide, diamond like carbon (DLC), carbon containing nitride (CN), or other insulating material by using a method for forming a thin film such as plasma CVD and sputtering. Further, the passivation film may include a single layer or a laminated layer structure. In this embodiment mode, a silicon nitride film with a thickness of 100 nm is used as the insulating film 128.

Thereafter, the semiconductor layers 102 and 103 are preferably hydrogenated by heating under hydrogen atmosphere or nitrogen atmosphere. When they are heated under the nitrogen atmosphere, an insulating film containing hydrogen is preferably used as the insulating film 128.

Next, an insulating layer 129 is formed. In this embodiment mode, the insulating layer 129 is formed over the entire surface of the substrate and it is patterned by etching while using a mask made from resist or the like. When this insulating layer 129 is formed by the droplet discharging method or printing where a pattern can be formed directly and selectively, the insulating layer is not necessary to be patterned by etching. In this embodiment mode, a second insulating layer that serves as a partition wall is formed on the insulating layer 129 that is formed as an interlayer insulating layer. In this case, the insulating layer 129 is also referred to as a first insulating layer.

The insulating layer 129 may be formed using an inorganic insulating material such as silicon oxide, silicon nitride, silicon oxynitride, aluminum oxide, aluminum nitride, aluminum oxynitride, diamond like carbon (DLC), carbon containing nitride (CN) and polysilazan; acrylic acid, methacrylic acid, a derivative thereof; an organic insulating material such as polyimide, aromatic polyamide, polybenzimidazole, and benzocyclobutene; or siloxane resin. In addition, a photosensitive or nonphotosensitive material such as acrylic and polyimide may be used to form the insulating layer 129.

In this embodiment mode, a coating film formed using a siloxane resin material is used as the insulating layer 129. This coating film that has been baked is also referred to as a silicon oxide (SiOx) film containing an alkyl group.

An opening 132 that reaches the source or drain electrode layer 117 is formed in the insulating film 128, the insulating layer 129 and the gate insulating layer 125. This opening is also formed by etching using a mask made from resist. A mask having a microscopic shape that is formed by the exposure treatment using laser light can be used as the mask for etching. A wiring layer 131 is formed in the opening 132 manufactured above. The wiring layer 131 may also be formed using the same material as those of the source or drain electrode layers and the gate electrode layers. In this embodiment mode, the wiring layer 131 is formed using silver by the droplet discharging method.

Figure 5A:
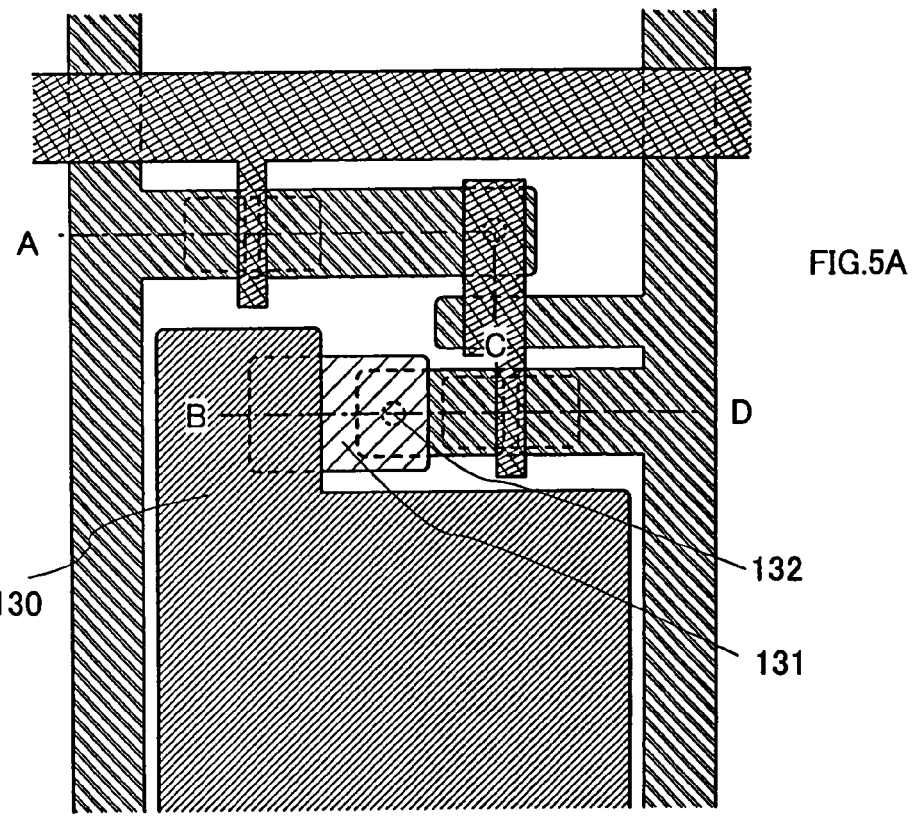
FIG. 5A is a top view and FIGS. 5B and 5C are cross sectional views explaining a method for manufacturing a display device according to the present invention.
Figure 5B:
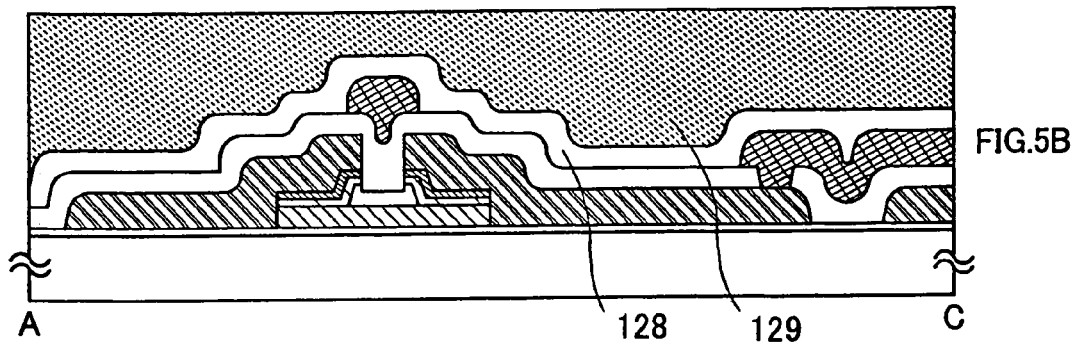
Figure 5C:
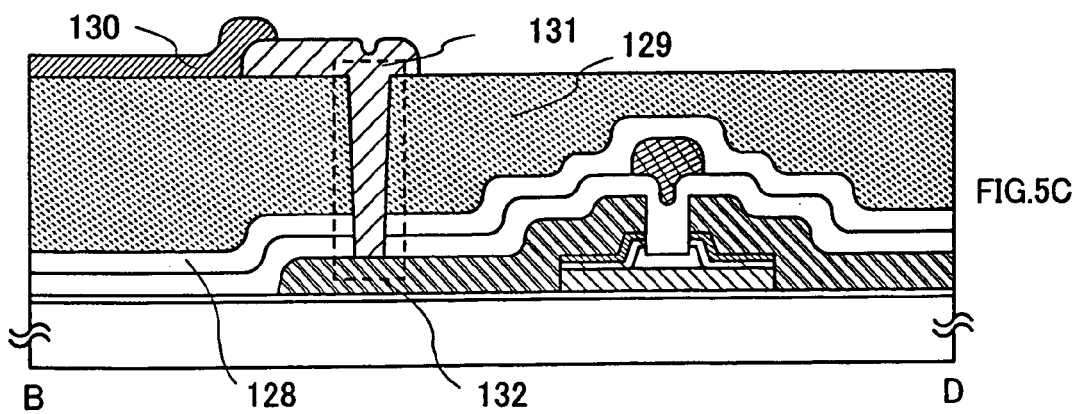

A composition containing a conductive material is selectively discharged on the insulating layer 129 so as to form a first electrode layer 130 in contact with the wiring layer 131 (see FIG. 5C). In the case where light is emitted through the substrate 100, or a transmissive display panel is manufactured, the first electrode layer 130 may be formed as follows: a composition containing a conductive material with a light transmitting property capable of transmitting at least visible light such as indium tin oxide (ITO), indium tin oxide including silicon oxide (ITSO), indium zinc oxide (IZO) including zinc oxide (ZnO), zinc oxide (ZnO), ZnO added with gallium (Ga) and tin oxide (SnO$_2$) is formed to have a predetermined pattern and then baked.

Also, the first electrode layer 130 is preferably formed using indium tin oxide (ITO), indium tin oxide including silicon oxide (ITSO), zinc oxide (ZnO) or the like by sputtering. More preferably, the first electrode layer is made from indium tin oxide containing silicon oxide by sputtering using a target in which 2 to 10 weight % silicon oxide is mixed in the ITO. In addition, a conductive material of ZnO added with gallium (Ga), indium zinc oxide (IZO) that contains silicon oxide and indium oxide mixed with 2 to 20% zinc oxide (ZnO), which is a conductive oxide material may be used. After forming the first electrode layer 130 by sputtering, a mask layer is formed by the droplet discharging method, and the mask layer may be etched into a predetermined pattern. In this embodiment mode, the first electrode layer 130 is formed using a conductive material with a light transmitting property by the droplet discharging method. Concretely, the first electrode layer 130 is formed using indium tin oxide or ITSO including ITO and silicon oxide.

In this embodiment mode, after forming the wiring layer 131, the first electrode layer 130 is formed in contact with the wiring layer 131 to be electrically connected to each other. Alternatively, after selectively forming the first electrode layer 130 on the insulating layer 129, the wiring layer 131 may be formed to be in contact with the first electrode layer 130 and the source or drain electrode layer 117 so that they are electrically connected to one another. In this case, the lamination order of the wiring layer 131 and the first electrode layer 130 is inverted, and the first electrode layer 130 is formed on the insulating layer 129 and then the wiring layer 131 is formed on the first electrode layer.

According to the above described process, a TFT substrate (also denoted by a element substrate) for a display device in which a top-gate type thin film transistor with a planar structure and the first electrode layer, which is a pixel electrode layer, are connected to each other over the substrate 100 is completed.

Subsequently, an insulating layer (also, referred to as a partition wall or a bank) 121 is selectively formed. The insulating layer 121 is formed on the first electrode layer 130 to have an opening and cover the wiring layer 131. In this embodiment mode, the insulating layer 121 is formed over the entire surface of the substrate, and is patterned by etching while using a mask made from resist or the like. When this insulating layer 121 is formed by the droplet discharging method or printing where a pattern can be formed directly and selectively, the insulating layer is not necessary to be patterned by etching.

The insulating layer 121 is formed using an inorganic insulating material such as silicon oxide, silicon nitride, silicon oxynitride, aluminum oxide, aluminum nitride and aluminum oxynitride; acrylic acid, mathacrylic acid or a derivative thereof; a heat-resistant high molecular weight material such as polyimide, aromatic polyamide and polybenzoimidazole; or an insulating material such as inorganic siloxane that includes Si—O—Si bonds among compounds including silicon, oxygen and hydrogen that is formed using a siloxane material as a raw material or organic siloxane in which hydrogen in silicon is substituted by an organic group such as methyl and phenyl. Additionally, a photosensitive or nonphotosensitive material such as acrylic and polyimide may be used to form the insulating layer 121. Preferably, the insulating layer 121 has a shape in which the radius of curvature is continuously varied so as to improve the coverage of an electroluminescent layer 122 and a second electrode layer 123 formed over the insulating layer 121.

Alternatively, after discharging a composition of the insulating layer 121 by the droplet discharging method, the surface of the composition may be pressed with pressure to planarize the surface thereof. As a method for pressing the surface thereof, a roller or the like may be scanned over a surface to level unevenness formed on the surface, or the surface may be perpendicularly pressed with a flat plate. Also, the surface may be softened or dissolved by using a solvent or the like and the unevenness formed on the surface may be removed by an air knife. Alternatively, the unevenness may be polished by CMP. This step can be arbitrarily applied in the case of generating unevenness due to the droplet discharging method so as to level the uneven surface. When the flatness is improved by this step, non-uniformities in display performance of a display device can be prevented, making it possible to display a high-definition image.

Figure 1B:
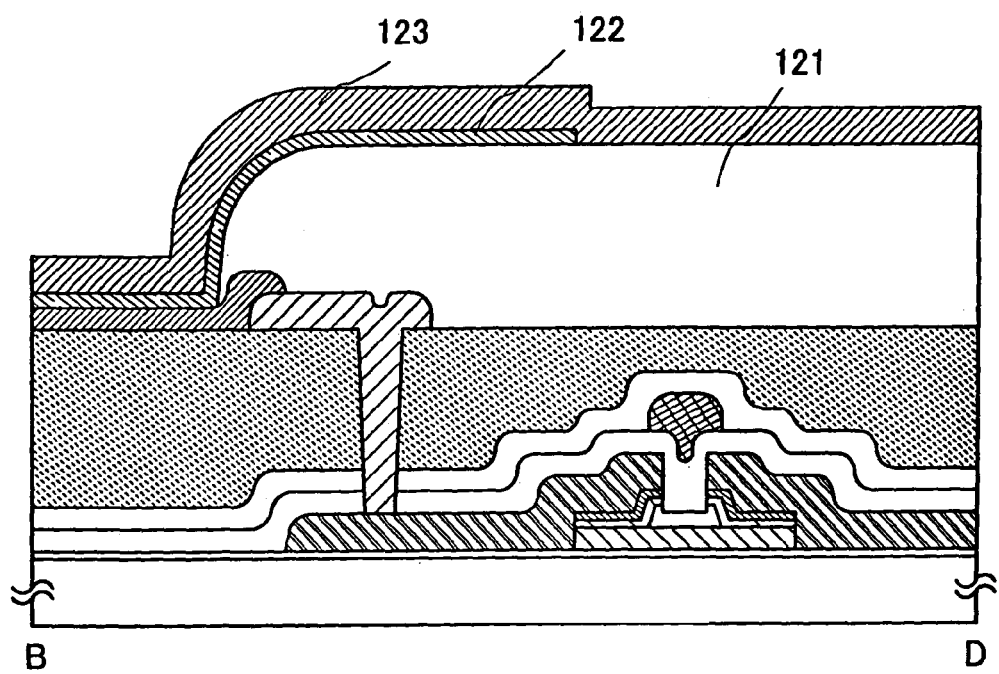
Figure 2A:
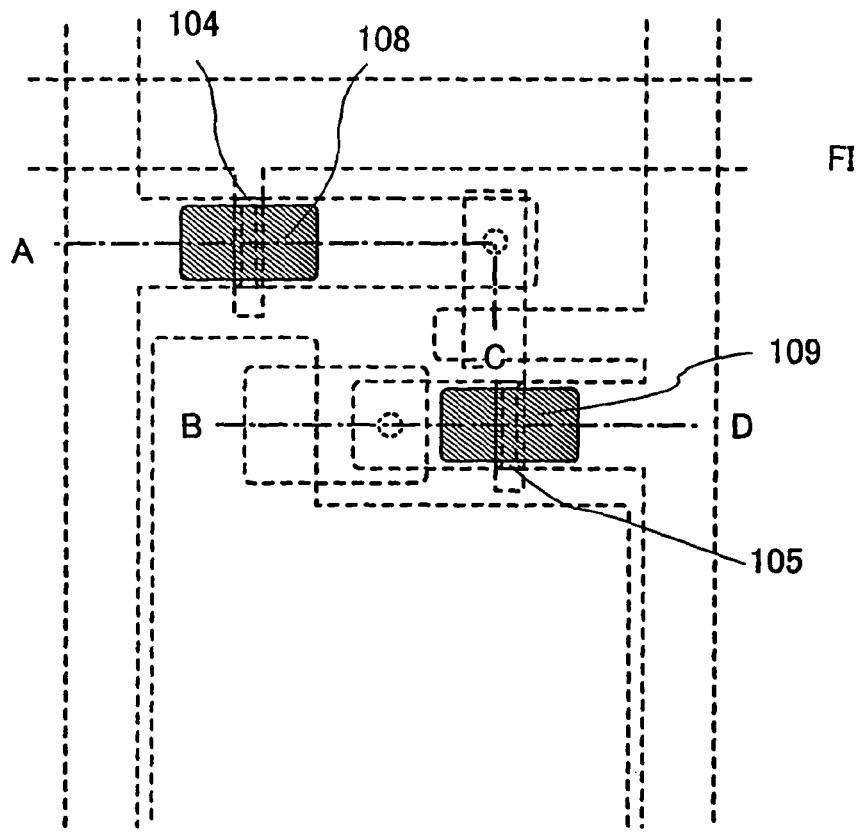
FIG. 2A is a top view and FIGS. 2B and 2C are cross sectional views explaining a method for manufacturing a display device according to the present invention.
Figure 2B:
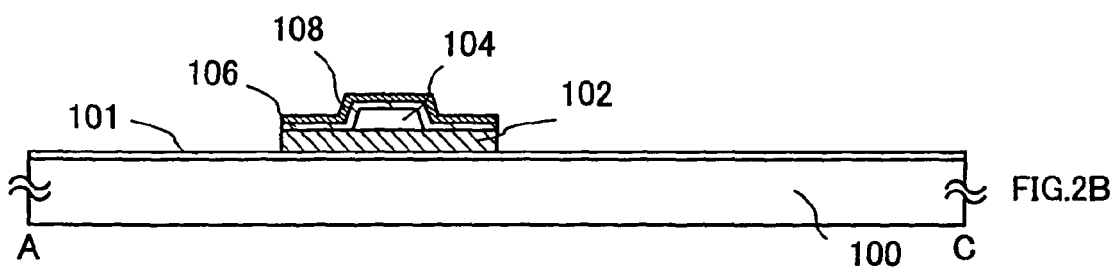
Figure 2C:
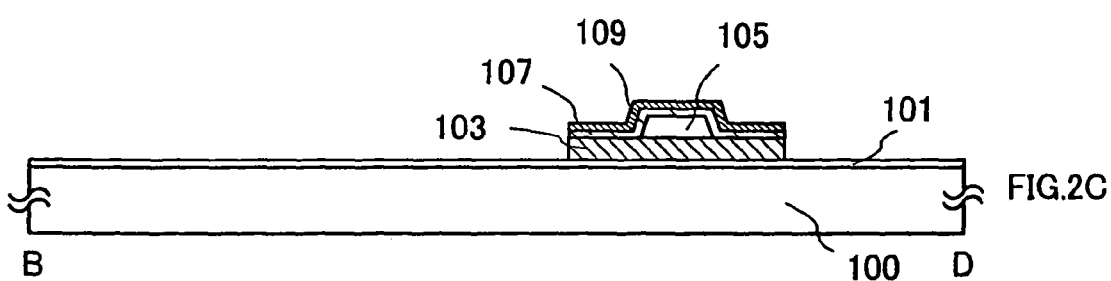
Figure 3A:
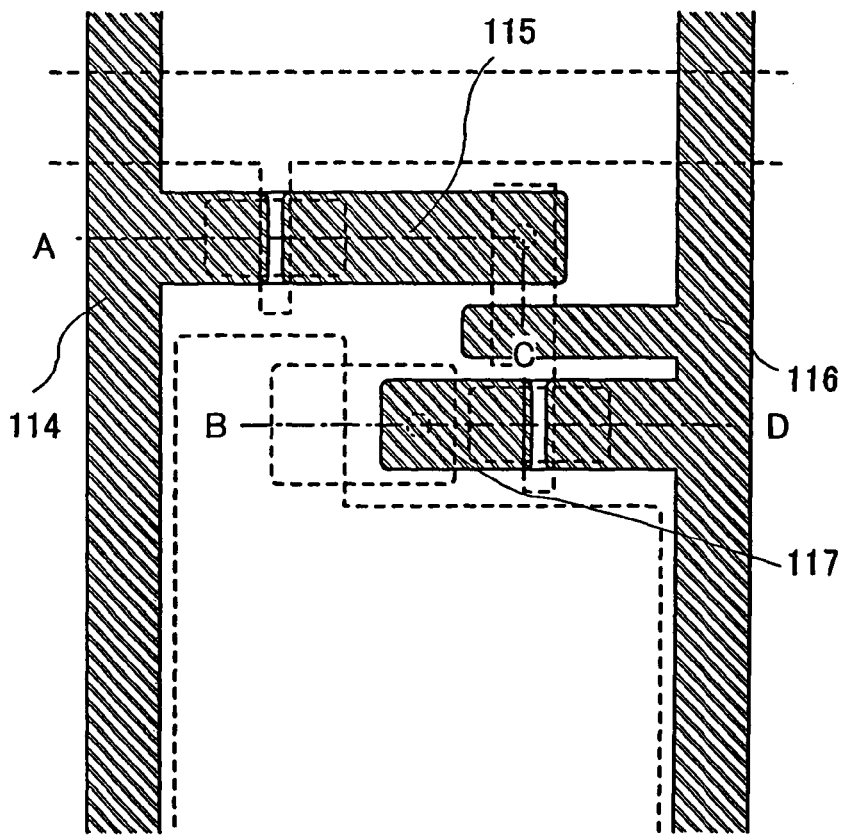
FIG. 3A is a top view and FIGS. 3B and 3C are cross sectional views explaining a method for manufacturing a display device according to the present invention.
Figure 3B:
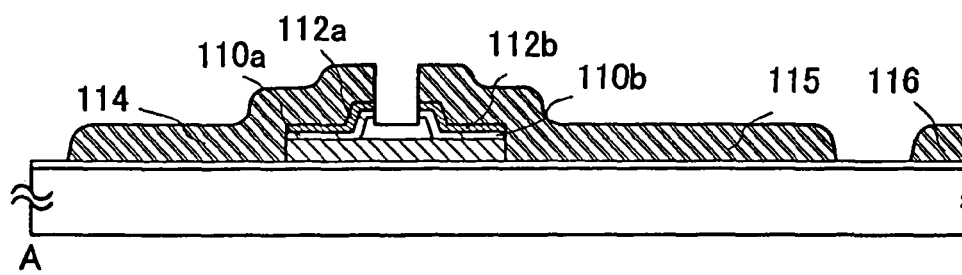
Figure 3C:
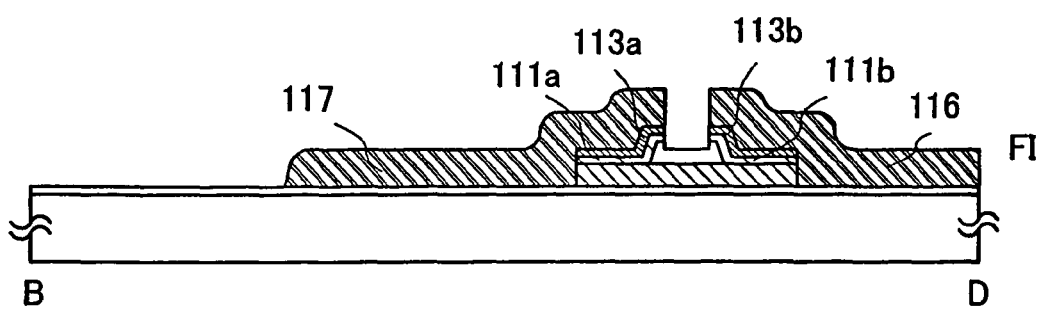

A light emitting element is formed to be electrically connected to the thin film transistor (see FIG. 1B).

A heat treatment is performed at atmospheric pressure at 200° C. to remove moisture included in the first electrode layer 130 and the insulating layer 121 or attached to the surfaces thereof prior to forming the electroluminescent layer 122. Preferably, the heat treatment is carried out at 200 to 400° C., and preferably, at 250 to 350° C. under reduced pressure, and the electroluminescent layer 122 is successively formed by vacuum evaporation or by the droplet discharging method under reduced pressure without exposing it to atmospheric air.

As the electroluminescent layer 122, materials showing red (R), green (G) and blue (B) light are selectively formed by evaporation using an evaporation mask, respectively. The materials showing red (R), green (G) and blue (B) light can also be formed by the droplet discharging method (e.g., using a low molecular weight material, a high molecular weight material or the like) in the same manner as a color filter. This case is preferable since the materials showing red (R), green (G) and blue (B) light can be independently formed without using a mask. A second electrode layer 123 is laminated on the electroluminescent layer 122 to achieve a display device using the light emitting element with a display function.

Although not shown in the drawings, it is effective that a passivation film be formed to cover the second electrode layer 123. A protection film formed in fabricating the display device may include either a single layer structure or a multi-layer structure. The passivation film may be formed using an insulating film that contains silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide (AlNO) having higher nitrogen content than oxygen content, diamond like carbon (DLC), and carbon containing nitrogen. ($CN_x$). A single layer or a lamination layer of the above-mentioned insulating films can be used. For example, a lamination layer of carbon containing nitrogen ($CN_x$) and silicon nitride (SiN) may be used. Further an organic material may be used as the passivation film. For instance, a lamination layer of a high molecular weight organic material such as styrene polymer may be used. In addition, it is possible to use a material in which a skeleton structure is formed with bonds of silicon (Si) and oxygen (O), where at least hydrogen is included in a substituent, or at least one kind of fluorine, alkyl group and aromatic carbon hydrogen is included in a substituent.

At this moment, a film having excellent coverage is preferably used as the passivation film. For example, a carbon film, and in particular, a DLC film are preferably used as the passivation film. Since the DLC film can be formed at a temperatures of 100° C. or less, it can be easily formed over the electroluminescent layer having low heat resistance. The DLC film can be formed by plasma CVD (typically, RF plasma CVD, microwave CVD, electron cyclotron resonance (ECR), CVD, thermal filament CVD or the like), combustion flame, sputtering, ion beam evaporation, laser evaporation, and the like. Hydrogen gas and a gas containing hydrocarbon (for example $CH_4$, $C_2H_2$, $C_6H_6$, etc.) are used as reactive gases which are used for forming the film. The reactive gases are ionized by glow discharge. The ions are accelerated to collide with a negatively self-biased cathode. A CN film may be formed using $C_2H_4$ gas and $N_2$ gas as reactive gases. The DLC film has a high blocking property with respect to oxygen and can prevent the electroluminescent layer from being oxidized. Accordingly, the DLC film can prevent the electroluminescent layer from being oxidized during a subsequent sealing step.

Subsequently, a sealing material is formed and the TFT substrate is sealed with a sealing substrate. Afterwards, a flexible printed wiring substrate may be attracted to the gate wiring layer electrically connecting to the gate electrode layer 118 and the source wiring layer electrically connecting to the source or drain electrode layer 114 so that they are electrically connected to an external portion.

Next, a wiring substrate for connection is provided such that the wiring layers inside of the display device are electrically connected thereto through an anisotropic conductive layer. The wiring substrate serves to transmit a signal and a potential from the external portion. For example, FPCs (flexible printed circuits) and the like can be used. Through the above-described process, a display device (also, denoted by a display panel) comprising a top-gate type switching TFT with a planar structure, a driving TFT and a capacitor element is completed. The capacitor element is formed using the source or drain electrode layer 116, a gate insulating layer 125 and the gate electrode layer 119.

The wiring layers inside of the display device and the FPCs are connected to one another using terminal electrode layers. The terminal electrode layers can be manufactured using the same materials and the same fabrication process of the gate electrode layers, the same materials and the same fabrication process of the source or drain electrode layers, and the same materials and the same fabrication process of the gate wiring layer, respectively. Examples of connecting the FPCs and the wiring layers inside of the display device to one another will be described with reference to FIGS. 43A1 and 43A2, FIGS. 43B1 and 43B2, and FIGS. 43C1 and 43C2.

In FIG. 43A1, a thin film transistor 9 and a wiring layer 6 that electrically connects the thin film transistor 9 and a first electrode layer provided with a light emitting element together are formed over a substrate 1. The substrate 1 is attached to a counter substrate 8 with a sealing material 3. A wiring layer extending from the inside of the display device that is formed outside of the sealing material 3, an FPC 2a and an FPC 2b are attached with anisotropic conductive films 7a and 7b.

FIGS. 43A1, 43B1 and 43C1 are top views of display devices, and FIGS. 43A2, 43B2 and 43C2 are cross sectional views along a line G-H and a line M-N of FIGS. 43A1, 43B1 and 43C1. In FIGS. 43A1 and 43A2, a terminal electrode layer 5a and a terminal electrode layer 5b are formed through the same process of manufacturing the source or drain electrode layers using the same material thereof. A source wiring layer 4a that is formed to extend to the outside of the sealing material is provided in the terminal electrode layer 5a, and the terminal electrode layer 5a and the FPC 2c are connected to each other through the anisotropic conductive film 7a. On the other hand, a gate wiring layer 4b extending to outside of the sealing material is connected to the terminal electrode layer 5b, and the terminal electrode layer 5b is connected to the FPC 2b through the anisotropic conductive film 7b. In this embodiment mode, the gate wiring layer is formed through the same process of manufacturing the gate electrode layer using the same materials thereof, while the source wiring layer is formed through the same process of manufacturing the wiring layers using the same materials thereof.

In FIGS. 43B1 and 43B2, terminal electrode layers 55a and 55b are formed through the same process of manufacturing the gate wiring layer using the same material thereof. The terminal electrode layer 55b is formed using a gate wiring layer extending to outside of the sealing material and the terminal electrode layer 55b and the FPC 2b are connected to each other through the anisotropic conductive film 7b. On the other hand, a source wiring layer 54a that is formed through the same process of manufacturing the wiring layer extending to outside of the sealing material using the same material thereof is connected to the terminal electrode layer 55a, and the terminal electrode layer 55a and the FPC 2a are connected to each other through the anisotropic conductive film 7a.

In FIGS. 43C1 and 43C2, terminal electrode layers 65a and 65b are formed through the same process of manufacturing the wiring layers and using the same materials thereof The terminal electrode layer 65b is connected to a gate wiring layer 64b that is formed to extend to the outside of the sealing material, and the terminal electrode layer 65b and the FPC 2b are connected to each other through the anisotropic conductive film 7b. On the other hand, the terminal electrode layer 65a is formed using a source wiring layer that is formed through the same fabrication process and using the same materials as the wiring layer extending to the outside of the sealing material, and the terminal electrode layer 65a and the FPC 2a are connected to each other through the anisotropic conductive film 7a.

Although the switching TFT having a single-gate structure is shown in this embodiment mode, a switching TFT having a multi-gate structure such as a double-gate structure may be formed.

According to the above described process, a top-gate type thin film transistor with a planar structure having a crystalline semiconductor film can be formed. Since the thin film transistor formed in this embodiment mode is formed using the crystalline semiconductor film, it has higher mobility (about 2 to 70 cm$^2$/Vsec, and typically, about 20 to 50 cm$^2$/Vsec) compared to a thin film transistor formed using an amorphous semiconductor film. Also, the source and drain regions contain a metal element that has a function of promoting the crystallization, in addition an impurity element imparting one conductivity type. Consequently, the source and drain regions having low resistivity can be formed. As a result, a display device that can be operated at high speed can be manufactured.

As compared with a thin film transistor formed using an amorphous semiconductor film, the variation in threshold value is difficult to be caused in the thin film transistor formed using the crystalline semiconductor film, making it possible to reduce the variation in characteristics of the thin film transistor.

Furthermore, the metal element, which is mixed in the semiconductor film in the film formation process, is removed by the gettering step, and hence, the off current can be reduced. Accordingly, by providing such a TFT in a switching element of a display device, the contrast can be improved.

Moreover, microscopic processing with use of laser light allows to design a fine wiring and the like freely. According to the present invention, a desired pattern can be formed with good controllability, reducing loss of materials and the cost. As a consequence, a high-performance, highly-reliable display device can be manufactured with good yield.

Embodiment Mode 2

Another embodiment mode of the present invention will be described with reference to FIGS. 8A to 8F. This embodiment mode shows an example of manufacturing a circuit that includes a plurality of n-channel thin film transistors (NMOS) through a gettering step that is different from the gettering step carried out in manufacturing the thin film transistor of Embodiment Mode 1. Therefore, identical portions and portion having identical functions to those of Embodiment Mode 1 will not be further explained in this embodiment mode.

An insulating layer 401 and an amorphous semiconductor film 402 are formed over a substrate 400. A metal film 403 containing a metal element that promotes crystallization (which is nickel (Ni) in this embodiment mode) is formed thereon (see FIG. 8A). Thereafter, the amorphous semiconductor film 402 is crystallized by a heat treatment to form a crystalline semiconductor film 404.

Figure 8A:
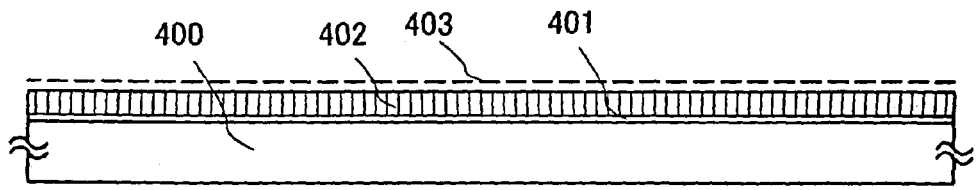
FIGS. 8A to 8F are cross sectional views explaining a method for manufacturing a display device according to the present invention.
Figure 8B:
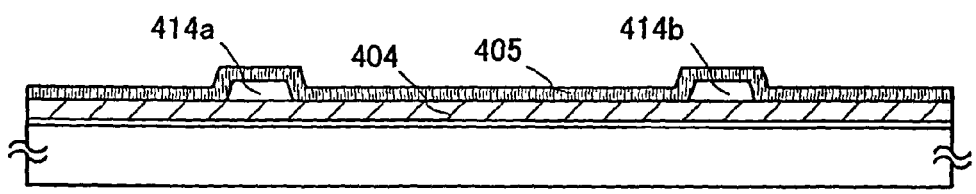
Figure 8C:
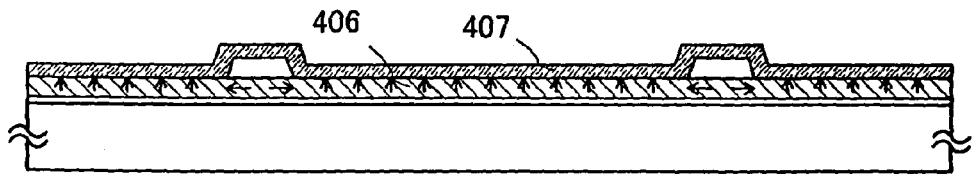

In this embodiment mode, after selectively forming a channel protection layer 414a and a channel protection layer 414b on the crystalline semiconductor film 404, a semiconductor film 405 containing a rare gas element as an impurity element is formed as a gettering layer to eliminate the metal element for promoting the crystallization, which is included in the crystalline semiconductor film 404 (see FIG. 8B). As the rare gas element, helium, argon, xenon, krypton, or the like can be used. In this embodiment mode, the semiconductor film 405 containing argon as an impurity element is formed. Thereafter, by carrying out a heat treatment, the metal element included in the crystalline semiconductor film 404 moves toward the directions depicted by arrows in FIG. 8C, and thus is captured in the semiconductor film 405. Consequently, a crystalline semiconductor film 406, in which the metal element included therein is reduced, is formed. Subsequently, a semiconductor film 407 containing the metal element for promoting the crystallization that becomes a gettering sink and an oxide film formed on the surface of the crystalline semiconductor film 406 are removed by hydrofluoric acid so that the crystalline semiconductor film 406 in which the metal element is reduced or eliminated can be obtained. In this embodiment mode, the semiconductor film 407, which becomes the gettering sink, is removed by using TMAH (tetramethyl ammonium hydroxide).

Figure 8D:
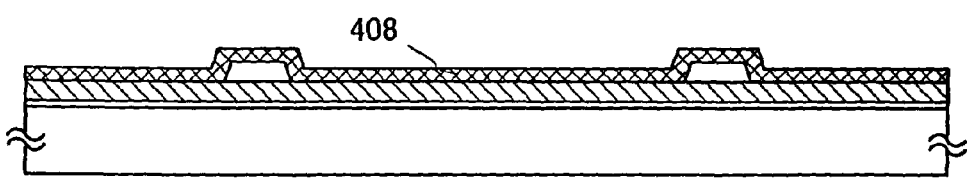

A semiconductor film 408 having an n-type conductivity is formed as a semiconductor film having one conductivity type on the crystalline semiconductor film 406, the channel protection layer 414a and the channel protection layer 414b (see FIG. 8D). After patterning the crystalline semiconductor film 406 and the semiconductor film 408 having the n-type conductivity, source or drain electrode layers 411a, 411b and 411c are formed. In this embodiment mode, the semiconductor film 408 having the n-type conductivity that contains phosphorus (P) as an impurity element imparting an n-type conductivity is formed.

Figure 8E:
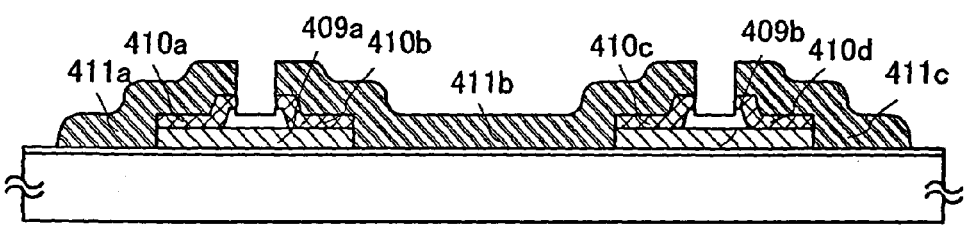
Figure 8F:
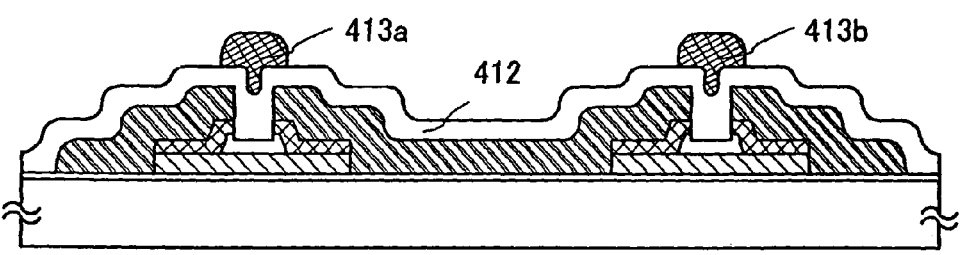

While utilizing the source or drain electrode layers 411a, 411b and 411c as masks, the semiconductor film having the n-type conductivity and the crystalline semiconductor film are etched to form semiconductor layers 409a, 409b, semiconductor layers 410a, 410b, 410c and 410d having n-type conductivity and serving as source regions or drain regions (see FIG. 8E). A gate insulating layer 412 is formed thereon and a gate electrode layer 413a and a gate electrode layer 413b are formed on the gate insulating layer 412 (see FIG. 8F).

According to the above described process, the thin film transistors comprising the crystalline semiconductor layers in which the metal element used for crystallization is reduced by subjecting the crystalline semiconductor layers crystallized by the metal element to the gettering treatment; and the semiconductor layers having one conductivity and serving as the source or drain regions that do not include the metal element, can be formed.

Accordingly, the n-channel thin film transistors that are electrically connected to one another can be manufactured so as to manufacture an NMOS circuit. A display device can be manufactured by incorporating this circuit into a pixel region or a driving region.

The present embodiment mode can be implemented in combination with Embodiment Mode 1.

Embodiment Mode 3

Another embodiment mode of the invention will be described with reference to FIGS. 9A to 9E. The present embodiment mode shows an example of manufacturing a circuit including a plurality of p-channel thin film transistors (PMOS) that are formed through different gettering step from the gettering step carried out in forming the thin film transistor of Embodiment Mode 1. The identical portions and portions having identical functions to those of Embodiment Mode 1 will not be further explained in this embodiment mode.

An insulating layer 401 and an amorphous semiconductor film 402 are formed over a substrate 400. A metal film 403 containing a metal element for promoting crystallization (which is nickel (Ni) in this embodiment mode) is formed thereon (see FIG. 9A). Thereafter, the amorphous semiconductor film 402 is crystallized by a heat treatment to form a crystalline semiconductor film 404.

Figure 9A:
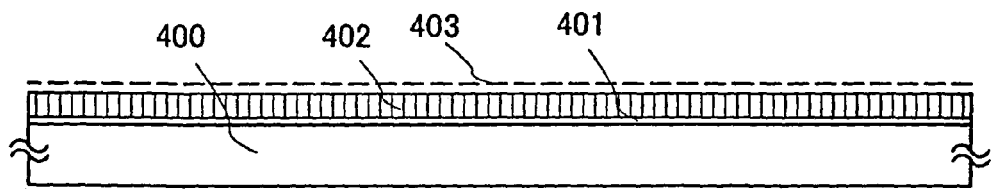
FIGS. 9A to 9E are cross sectional views explaining a method for manufacturing a display device according to the present invention.
Figure 9B:
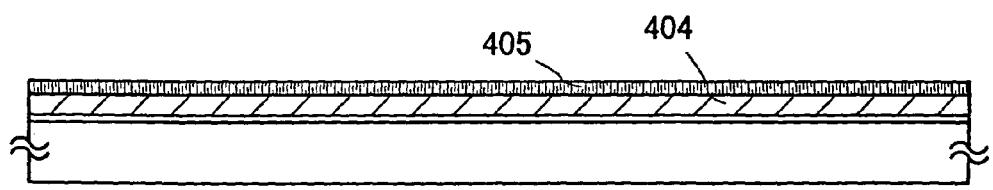
Figure 9C:
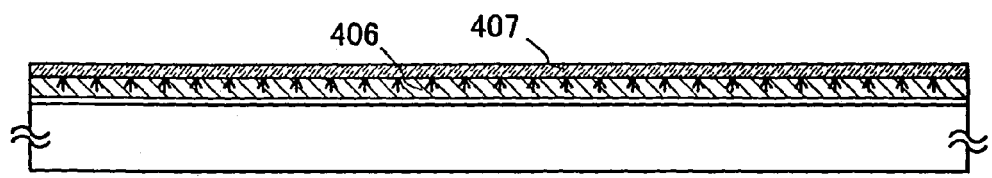
Figure 9D:
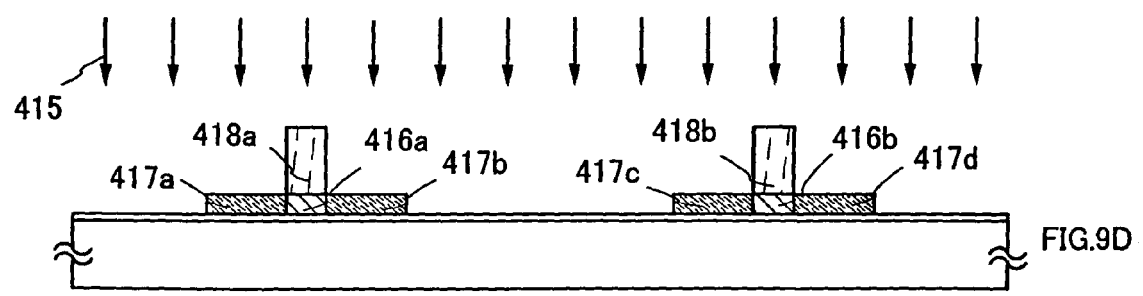
Figure 9E:
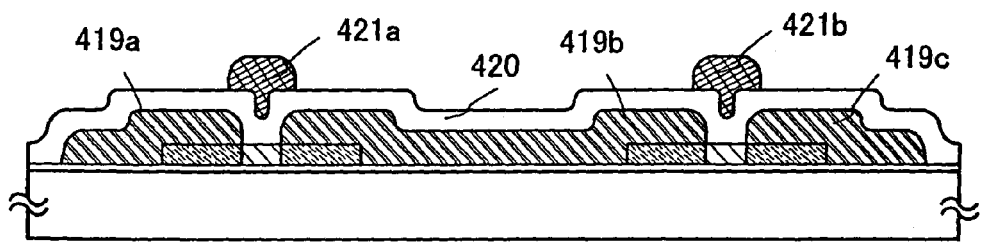

A semiconductor film 405 containing a rare gas element as an impurity element is formed in contact with the crystalline semiconductor film 404 as a gettering layer that getters the metal element for promoting the crystallization, which is included in the amorphous semiconductor film 404 (see FIG. 9B). Helium, argon, xenon, krypton, and the like can be used as the rare gas element. In this embodiment mode, the semiconductor film 405 containing argon as the impurity element is formed. Thereafter, by performing a heat treatment, the metal element included in the crystalline semiconductor film 404 moves toward the directions as denoted by arrows to be captured in the semiconductor film 405. Therefore, a crystalline semiconductor film 406, in which the metal element included therein is reduced, is formed. Subsequently, a semiconductor film 407 containing the metal element for promoting the crystallization, which becomes a gettering sink, and an oxide film formed on the surface of the crystalline semiconductor film 406 are removed by hydrofluoric acid or the like so that a crystalline semiconductor film 406 in which the metal element is reduced or removed can be obtained. In this embodiment mode, the semiconductor film 407, which becomes the gettering sink, is removed using TMAH (tetramethyl ammonium hydroxide).

The crystalline semiconductor film 406 is patterned, and then masks 418a and 418b are formed on channel formation regions 416a and 416b of semiconductor layers. By utilizing the masks 418a and 418b, an impurity element 415 imparting a p-type conductivity (boron (B) is used in this embodiment mode) is added into the semiconductor layers to form p-type impurity regions 417a, 417b, 417c and 417d as source or drain regions in the semiconductor layers (see FIG. 9D). The p-type impurity regions are formed by adding the impurity element imparting the p-type conductivity in this embodiment mode. Alternatively, semiconductor layers having the p-type conductivity may be formed over the semiconductor layers selectively to serve as source regions or drain regions.

Source or drain electrode layers 419a, 419b and 419c are formed on the p-type impurity regions 417a, 417b, 417c and 417d. In this embodiment mode, the source or drain electrode layers 419a, 419b and 419c are selectively formed by using the droplet discharging method, rather than patterning them by etching. Therefore, since the edges of the source or drain electrode layers 419a, 419b and 419c are not removed by etching, the edges are affected by the shapes in liquid state and have a gently sloping shape with a radius of curvature. Accordingly, the shapes of the electrode layers or the wiring layers can be controlled depending on the types of fabrication methods. A gate insulating layer 420 is formed on the source or drain electrode layers, and gate electrode layers 421a and 421b are formed on the gate insulating layer 420 (see FIG. 9F).

According to the above described process, the thin film transistors comprising the crystalline semiconductor layers in which the metal element used for crystallization is reduced by subjecting the crystalline semiconductor layers to the gettering; and the semiconductor layers having one conductivity and serving as the source or drain regions that do not include the metal element, can be formed. Accordingly, the p-channel thin film transistors that are electrically connected to one another are formed, making it possible to manufacture a PMOS circuit. A display device can be manufactured by incorporating such a circuit into a pixel region or a driving region.

The present embodiment mode can be implemented in combination with Embodiment Modes 1 and 2.

Embodiment Mode 4

Another embodiment mode of the invention will be described with reference to FIGS. 10A to 10E. This embodiment mode shows an example of manufacturing a circuit (CMOS circuit) that includes two types of thin film transistors, i.e., an n-channel thin film transistor and a p-channel thin film transistor. Further, same portions and portions having same functions as those of Embodiment Mode 1 will not be further explained.

An insulating layer 401 and an amorphous semiconductor film 402 are formed over a substrate 400. A metal film 403 containing a metal element for promoting crystallization (which is nickel (Ni) in this embodiment mode) is formed on the amorphous semiconductor film 402 (see FIG. 10A). Thereafter, the amorphous semiconductor film 402 is crystallized by a heat treatment to form a crystalline semiconductor film 404.

In this embodiment mode, after selectively forming channel protection layers 414a and 414b on the amorphous semiconductor film 404, a semiconductor film 422 containing an impurity element with an n-type conductivity is formed as a gettering layer that getters the metal element for promoting the crystallization, which is included in the crystalline semiconductor film 404 (see FIG. 10B). The semiconductor film 422 having the n-type conductivity that contains phosphorus (P) as the impurity element is formed in this embodiment mode. Thereafter, by performing a heat treatment, the metal element included in the crystalline semiconductor film 404 moves toward the directions shown by arrows in FIG. 10C to be captured in the semiconductor film 422 having the n-type conductivity. This semiconductor film 422 having the n-type conductivity thus contains the metal element becomes a semiconductor film 435 having the n-type conductivity. Accordingly, a crystalline semiconductor film 423, in which the metal element included therein is reduced, is formed.

The crystalline semiconductor film 423 and the semiconductor film 435 having the n-type conductivity are patterned to form semiconductor layers 426a and 426b. A mask 429a that covers the semiconductor layer 426a and the semiconductor layer 427 having the n-type conductivity and a mask 429b that covers the semiconductor layer 426b, and the semiconductor layer 424 having the n-type conductivity, which is formed on a channel formation region of the semiconductor layer 426b are formed, respectively. While utilizing these masks, an impurity element 425 having a p-type conductivity is added to form semiconductor layers 428a and 428b having the p-type conductivity. The impurity element that imparts the p-type conductivity (which is boron (B) in this embodiment mode) is selectively added into the semiconductor layers having the n-type conductivity by doping or ion implantation such that the concentration of the impurity element imparting the p-type conductivity becomes 2 to 10 times of the concentration of the impurity element imparting the n-type conductivity, and hence, the conductivity of the semiconductor layers having the n-type conductivity are inverted into the p-type conductivity. Thus, the semiconductor layers 428a and 428b having the p-type conductivity are formed (see FIG. 10D). Furthermore, in the surfaces of the semiconductor layers, the concentration of the impurity element imparting the n-type conductivity is sometimes increased in the step of adding the impurity element imparting the n-type conductivity depending on its addition condition. In this case, the surfaces of the semiconductor layers having the n-type conductivity may be thinly etched to remove the regions with the high concentration of the n-type impurity element, followed by performing the step of adding the impurity element imparting the p-type conductivity.

The semiconductor layer having the n-type conductivity is formed as the gettering sink in this embodiment mode. However, when a semiconductor layer having the p-type conductivity that includes the impurity element for imparting the p-type conductivity is formed as a semiconductor layer having one conductivity type, an impurity element imparting the n-type conductivity may selectively be added in the same manner. Moreover, when the channel protection layer 414b is made thick to block the impurity element, the channel protection layer can be used as a mask. In this case, the mask 429b used for preventing the channel formation region from being added with the impurity element is not necessary to be provided.

Source or drain electrode layers 432a, 432b and 432c are formed on the semiconductor layers having the n-type conductivity, which serves as the source or drain regions, and the semiconductor layers having the p-type conductivity. While utilizing the source or drain electrode layers 432a, 432b and 432c as masks, the semiconductor layers having the n-type conductivity are etched to form semiconductor layers 430a and 430b having the n-type conductivity, which serve as the source or drain regions, and semiconductor layers 431a and 431b having the p-type conductivity. A gate insulating layer 433 is formed thereon, and gate electrode layers 434a and 434b are formed on the gate insulating layer 433 (see FIG. 10E).

As set forth above, the CMOS circuit, in which the n-channel thin film transistors and the p-channel thin film transistors are electrically connected to one another, can be manufactured. In addition, the source and drain regions contain the metal element for promoting the crystallization, in addition to the impurity element for imparting one conductivity type in this embodiment mode, making it possible to form the source and drain regions having low resistivity. As a result, a circuit that is necessary to be operated at high speed can be manufactured. By incorporating such a circuit into a pixel region or a driving region, a display device can be manufactured.

The present embodiment mode can be implemented in combination with any of Embodiment Modes 1 through 3, respectively.

Embodiment Mode 5

Another embodiment mode of the present invention will be described with reference to FIGS. 11A to 11E. This embodiment mode shows an example of manufacturing a CMOS circuit including two types of thin film transistors, i.e., an n-channel thin film transistor and a p-channel thin film transistor that are formed through the different gettering step of that of the thin film transistor manufactured in Embodiment Mode 1. Further, same portions and portions having same functions as those of Embodiment Mode 1 will not be further explained.

An insulating layer 401 and an amorphous semiconductor film 402 are formed over a substrate 400. A metal film 403 containing a metal element that promotes the crystallization (which is nickel (Ni) in this embodiment mode) is formed thereon (see FIG. 11A). Thereafter, the amorphous semiconductor film 402 is crystallized by a heat treatment to form a crystalline semiconductor film 404. The crystalline semiconductor film is then patterned to form semiconductor layers.

A mask 455a covering a channel formation region 453a and a mask 455b covering a channel formation region 453b are formed. While utilizing these masks, an impurity element 452 imparting an n-type conductivity (which is phosphorus (P) in this embodiment mode) is added into the semiconductor layers to form n-type impurity regions 454a, 454b, 454c and 454d (see FIG. 11B). Afterwards, a heat treatment is performed at 550° C. for 4 hours.

By performing the heat treatment, the metal element for promoting the crystallization, which is included in the channel formation regions 453a and 453b of the semiconductor layers, is gettered and moves toward the directions denoted by arrows in the drawing, so that the metal element is captured in the n-type impurity regions 461a, 461b, 461c and 461d. Thus, channel formation regions 460a and 460b where the metal element is removed or reduced are formed (see FIG. 11C). Additionally, by this heat treatment, the added impurity element imparting the n-type conductivity can be activated.

A mask 463a that covers the n-type impurity regions 461a, 461b and the channel formation region 460a and a mask 463b that covers the channel formation region 460b are formed. By utilizing these masks, an impurity element 462 imparting a p-type conductivity (which is boron (B) in this embodiment mode) is added into the n-type impurity regions 461c and 461d to invert their n-type conductivity into p-type conductivity, and therefore, p-type impurity regions 464a and 464b are formed (see FIG. 11D). By adding the impurity element imparting the p-type conductivity such that the concentration thereof is 2 to 10 times of the concentration of the impurity element imparting the n-type conductivity, the conductivity type of the impurity regions is inverted into the p-type conductivity, making it possible to form the p-type impurity regions 464a and 464b. Thereafter, a heat treatment is carried out to activate the added impurity element imparting the p-type conductivity.

Source or drain electrode layers 465a, 465b and 465c are formed on the n-type impurity regions 461a and 461b and the p-type impurity regions 464a and 464b. A gate insulating layer 466 covering the semiconductor layers and the source or drain electrode layers is formed, and then gate electrode layers 467a and 467b are formed thereon (see FIG 11E).

As set forth above, the CMOS circuit, in which the n-channel thin film transistors and the p-channel thin film transistors are electrically connected to one another, can be manufactured. Also, the source and drain regions contain the metal element for promoting the crystallization in this embodiment mode, in addition to the impurity element imparting one conductivity type. Therefore, the source and drain regions having low resistivity can be formed. As a result, a circuit that is necessary to be operated at high speed can be manufactured. A display device can be manufactured by incorporating such a circuit into a pixel region or a driving region.

The present embodiment mode can be implemented in combination with Embodiment Modes 1 through 4.

Embodiment Mode 6

Another embodiment mode of the present invention will be described with reference to FIGS. 12A to 12F. This embodiment mode shows an example of manufacturing a CMOS circuit including two types of thin film transistors, i.e., an n-channel thin film transistor and a p-channel thin film transistor that are formed through the different gettering process of that of the thin film transistor manufactured in Embodiment Mode 1. Further, same portions and portions having same functions as those of Embodiment Mode 1 will not be further explained.

An insulating layer 401 and an amorphous semiconductor film 402 are formed over a substrate 400. A metal film 403 containing a metal element that promotes the crystallization (which is nickel (Ni) in this embodiment mode) is formed thereon (see FIG. 12A). Thereafter, the amorphous semiconductor film 402 is crystallized by a heat treatment to form a crystalline semiconductor film 404.

Figure 12A:
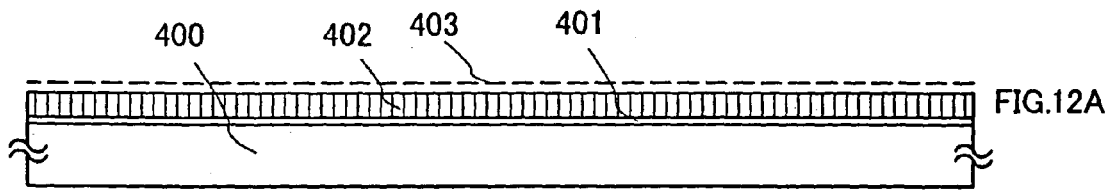
FIGS. 12A to 12F are cross sectional views explaining a method for manufacturing a display device according to the present invention.
Figure 12B:
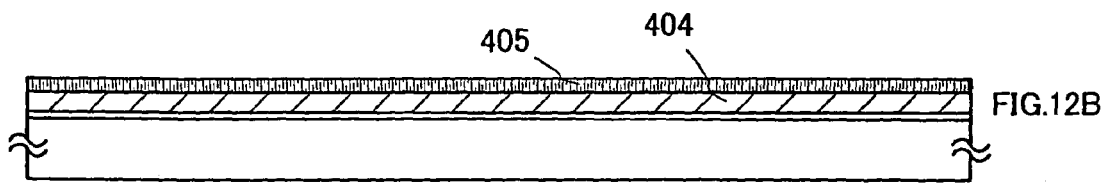
Figure 12C:
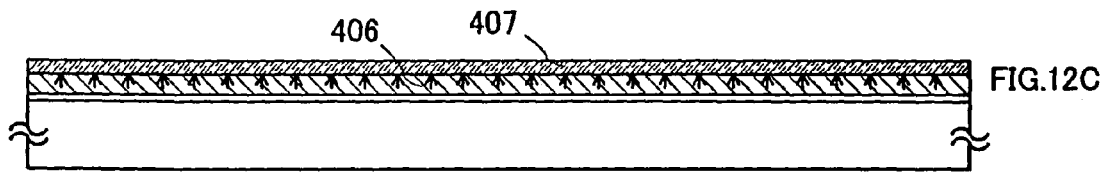
Figure 12D:
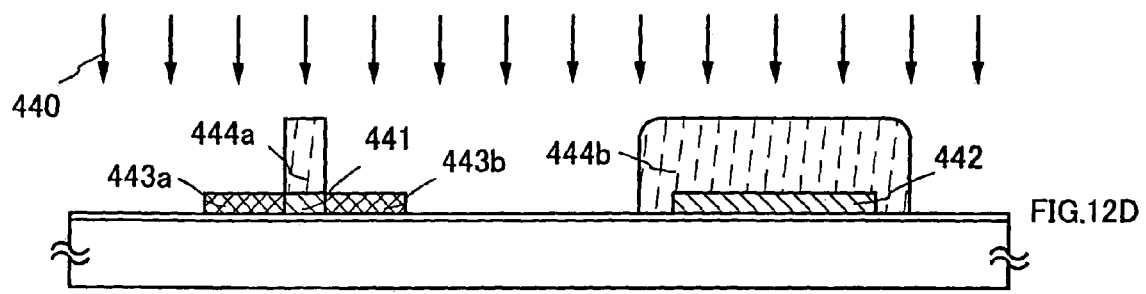
Figure 12E:
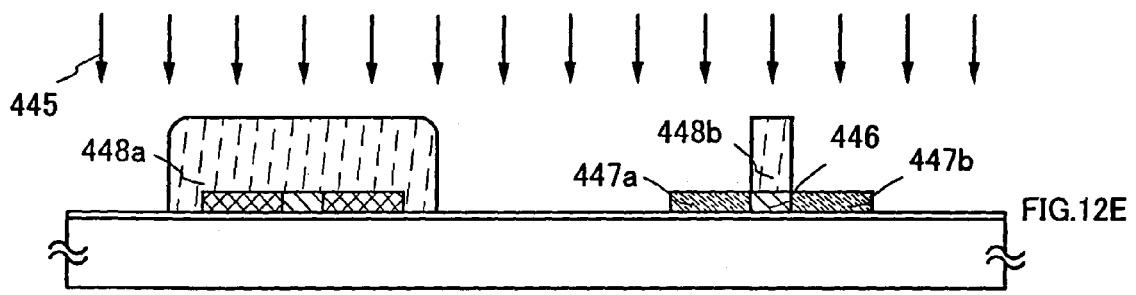
Figure 12F:
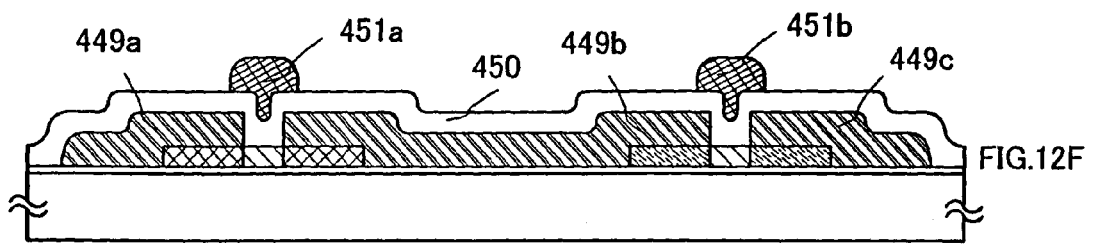

A semiconductor film 405 containing a rare gas element as an impurity element is formed in contact with the crystalline semiconductor film 404 as a gettering layer that getters the metal element for promoting the crystallization, which is included in the amorphous semiconductor film 404 (see FIG. 12B). Helium, argon, xenon, krypton or the like can be used as the rare gas element. In this embodiment mode, the semiconductor film 405 containing argon as the impurity element is formed. Thereafter, by performing a heat treatment, the metal element included in the crystalline semiconductor film 404 moves toward the directions denoted by arrows of FIG. 12C and thus is captured in the semiconductor film 405. Therefore, a crystalline semiconductor film 406 in that the metal element included therein is reduced is formed. A semiconductor film 407 containing the metal element for promoting the crystallization, which becomes a gettering sink, and an oxide film formed on the surface of the crystalline semiconductor film 406 are removed by hydrofluoric acid or the like, and hence, the crystalline semiconductor film 406, in which the metal element is reduced or removed, can be obtained. In this embodiment mode, the semiconductor film 407, which becomes the gettering sink, is removed by using TMAH (tetramethyl ammonium hydroxide). Afterwards, the crystalline semiconductor film is patterned to form semiconductor layers.

A mask 444a covering a channel formation region 441 and a mask 444b covering a semiconductor layer 442 are formed. While utilizing these masks, an impurity element 440 imparting an n-type conductivity (which is phosphorus (P) in this embodiment mode) is added into the semiconductor layers to form n-type impurity regions 443a and 443b (see FIG. 12D).

Next, a mask 448a covering the n-type impurity regions 443a, 443b and the channel formation region 441 and a mask 448b covering the channel formation region 446 are formed. While utilizing these masks, an impurity element 445 imparting a p-type conductivity (which is boron (B) in this embodiment mode) is added to form p-type impurity regions 447a and 447b (see FIG. 12E). Since the semiconductor layer 442 is covered with the mask 444b in this embodiment mode, the semiconductor layer 442 does not contain the impurity element imparting the n-type conductivity. As shown in Embodiment Mode 5, however, when the n-type impurity element is also included in a semiconductor layer, that is used for forming a p-channel thin film transistor, an impurity element imparting the p-type conductivity may be added into the semiconductor layer such that the concentration of the impurity element imparting the p-type conductivity is 2 to 10 times of that of the impurity element imparting the n-type conductivity. This allows the n-type conductivity of the semiconductor layer to be inverted into the p-type, making it possible to form a p-type impurity region. Thereafter, a heat treatment is carried out to activate the impurity element imparting the n-type conductivity and the impurity element imparting the p-type conductivity.

Source or drain electrode layers 449a, 449b and 449c are formed on the n-type impurity regions 443a and 443b and the p-type impurity regions 447a and 447b. A gate insulating layer 450 covering the semiconductor layers and the source or drain electrode layers is formed, and gate electrode layers 451a and 451b are formed on the gate insulating layer 450 (see FIG. 12F).

Through the above described process, the thin film transistors comprising the crystalline semiconductor layers in which the metal element used for crystallization is reduced by subjecting the crystalline semiconductor layers to the gettering; and the semiconductor layers having one conductivity and serving as the source or drain regions that do not include the metal element, can be formed. Accordingly, a CMOS circuit, in which the p-channel thin film transistors are electrically connected to each other, can be manufactured. A display device can be manufactured by incorporating such a circuit into a pixel region or a driving region.

The present embodiment mode can be implemented in combination with Embodiment Modes 1 through 5.

Embodiment Mode 7

Another embodiment mode of the present invention will be described with reference to FIGS. 47A to 47F. The present embodiment mode shows an example of manufacturing a circuit (CMOS circuit) including two kinds of thin film transistors, i.e., a channel-etched type n-channel thin film transistor and a channel-etched type p-channel thin film transistor having no channel protection layers. Same portions and portions having same functions as those of Embodiment Mode 1 will not be further explained.

An insulating layer 401 and an amorphous semiconductor film 485 are formed over a substrate 400. A metal film 403 containing a metal element for promoting crystallization (which is nickel (Ni) in this embodiment mode) is formed on the amorphous semiconductor film 485 (see FIG. 47A). Thereafter, the amorphous semiconductor film 485 is crystallized by a heat treatment to form a crystalline semiconductor film 486. Since channel protection layers for protecting semiconductor layers from the etching treatment in patterning the semiconductor layers are not formed in this embodiment mode, the semiconductor layers are partly etched. Therefore, the amorphous semiconductor film, that will be the semiconductor layers, is preferably formed to have a thickness of 150 to 200 nm.

A semiconductor film 470 containing an n-type impurity element is formed as a gettering layer that getters the metal element for promoting the crystallization, which is included in the crystalline semiconductor film 486 (see FIG. 47B). In this embodiment mode, a semiconductor film 422 having an n-type conductivity that contains phosphorus (P) as an impurity element is formed. Thereafter, by performing a heat treatment, the metal element contained in the crystalline semiconductor film 456 moves toward the directions depicted by arrows of FIG. 47C, and thus is captured in the semiconductor film 470 containing the n-type impurity element. This semiconductor film. 470 containing the n-type impurity element becomes a semiconductor film 471 containing the n-type impurity element together with the metal element. Therefore, a crystalline semiconductor film 472 in that the metal element included therein is reduced can be formed.

The crystalline semiconductor film 472 and the semiconductor film 471 having the n-type conductivity are patterned to form semiconductor layers 474a and 474b. A mask 479a covering the semiconductor layer 474a and a semiconductor layer 475 having the n-type conductivity and a mask 479b covering the semiconductor layer 474b and a semiconductor layer 476 having the n-type conductivity formed on a channel formation region of the semiconductor layer 474b are formed. While utilizing these masks, an impurity element 473 imparting a p-type conductivity is added to form semiconductor layers 478a and 478b having the p-type conductivity. When the impurity element imparting the p-type conductivity (which is boron (B) in this embodiment mode) is selectively added into the semiconductor layer having the n-type conductivity by doping or ion implantation such that the concentration of the impurity element imparting the p-type conductivity is 2 to 10 times of that of the impurity element imparting the n-type conductivity, the n-type conductivity is inverted into the p-type conductivity to form the semiconductor layers 478a and 478b having the p-type conductivity (see FIG. 47D). The semiconductor layer having the n-type conductivity is formed to be used as a gettering sink in this embodiment mode. However, when semiconductor layers having a p-type conductivity that contain an impurity element imparting the p-type conductivity are formed as semiconductor layers having one conductivity type, an impurity element imparting an n-type conductivity may selectively be added thereto in the same manner.

Source or drain electrode layers 480a, 480b and 480c are formed on the semiconductor layer having the n-type conductivity that serves as source or drain regions and the semiconductor layers having the p-type conductivity. While utilizing the source or drain electrode layers 480a, 480b and 480c as masks, the semiconductor layer having the n-type conductivity, the semiconductor layers having the p-type conductivity and the semiconductor layers 474a, 474b are etched to form semiconductor layers 482a and 482b having the n-type conductivity and serving as the source or drain regions, semiconductor layers 487a and 487b having the p-type conductivity, and semiconductor layers 481a and 481b (see FIG. 47E). Since the semiconductor layers of the present embodiment mode do not have the channel protection layers, they are partly etched, and hence, the channel-etched type thin film transistors can be formed. A gate insulating layer 483 covering the semiconductor layers and the source or drain electrode layers is formed. Gate electrode layers 434a and 434b are formed on the gate insulating layer 483 (see FIG. 47F).

As set forth above, the CMOS circuit, in which the channel-etched type n-channel thin film transistor and the channel-etched type p-channel thin film transistor are connected to each other, can be formed. In addition, in this embodiment mode, the source and drain regions include the metal element for promoting the crystallization, in addition to the impurity element imparting one conductivity type so that the source and drain regions having low resistivity can be formed. As a consequence, a circuit that is necessary to be operated at high speed can be manufactured. A display device can be manufactured by incorporating such a circuit into a pixel region or a driving region.

The present embodiment mode can be implemented in combination with Embodiment Modes 1 through 6.

Embodiment Mode 8

Another embodiment mode of the present invention will be described with reference to FIGS. 13A to 13E, FIGS. 14A to 14C, FIGS. 15A and 15B and FIGS. 16A and 16B. This embodiment mode employs the pixel region manufactured in Embodiment Mode 1, a peripheral driver circuit region that is formed using the thin film transistor manufactured according to the present invention, and a CMOS circuit comprising the n-channel thin film transistor and the p-channel thin film transistor manufactured according to Embodiment Mode 4. Further, same portions and portions having same functions as those of Embodiment Modes 1 and 4 will not be further explained.

Figure 16A:
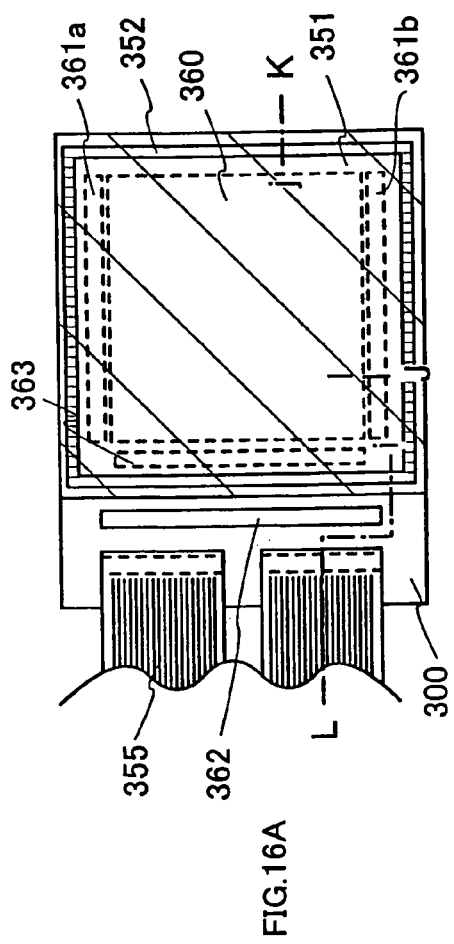
FIG. 16A is a top view and FIG. 16B is a cross sectional view explaining a method for manufacturing a display device according to the present invention.
Figure 16B:
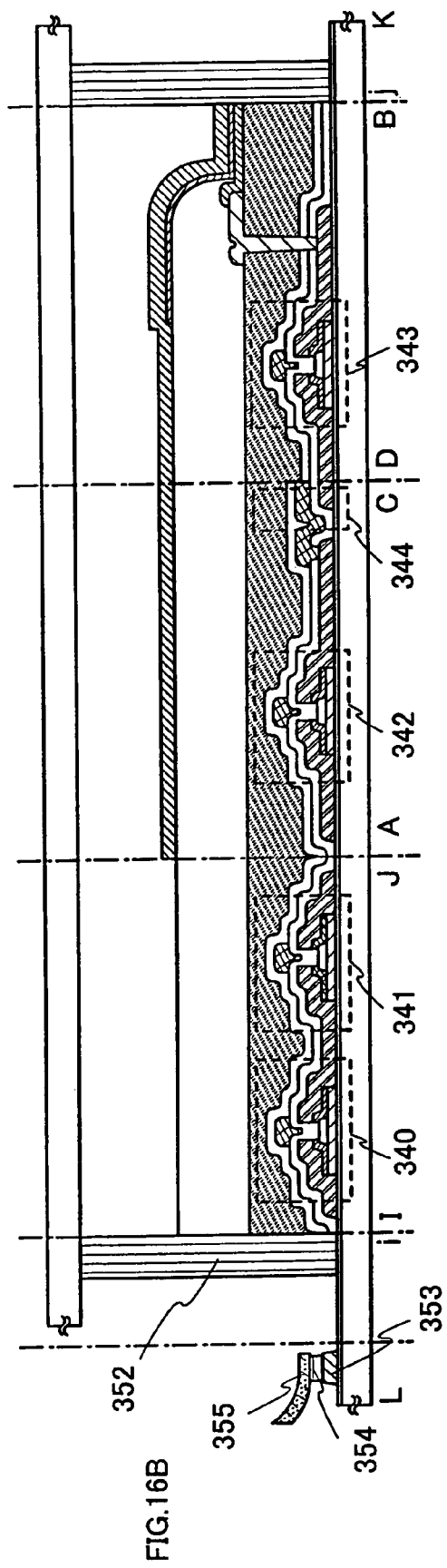

FIG. 16A is a top view of a pixel region of a display device manufactured in this embodiment mode. FIGS. 13A to 13E, FIGS. 14A to 14C, FIGS. 15A and 15B and FIG. 16B are cross sectional views along lines A-C and B-D. Further, regions along lines L-i, I-J and j-K in FIGS. 13A to 13E, FIGS. 14A to 14C, FIGS. 15A and 15B and FIG. 16B are cross sectional views corresponding to lines I-J and j-K of a display device as shown in FIG. 16A and a line L-i of a peripheral driver circuit region.

An insulating layer 301, an amorphous semiconductor film 302 and a metal film 303 that includes an element promoting crystallization are formed over a substrate 300 (see FIG. 13A). Further, since the metal film 303 is extremely thin in thickness, it sometimes does not have a film form. In this embodiment mode, an aqueous solution containing 10 ppm of Ni is applied over the substrate by spin coating to form the metal film 303. The amorphous semiconductor film 302 on which the metal film 303 is applied is crystallized by a heat treatment to form a crystalline semiconductor film 304. This heat treatment is carried out at 550° C. for 4 hours.

The thus obtained crystalline semiconductor film 304 may be added with a minute amount of an impurity element (boron or phosphorus) to control the threshold value of a thin film transistor. In this embodiment mode, boron (B) is added to the crystalline semiconductor film 304 by ion doping, where plasma is activated without mass-separating diborane ($B_2H_6$). Alternatively, ion implantation in which mass-separation is performed may be employed.

The crystalline semiconductor film 304 will be patterned in a latter step to form a plurality of semiconductor layers. An insulating layer that will be channel protection layers for protecting channel formation regions of the respective semiconductor layers is formed on the crystalline semiconductor layer 304. In this embodiment mode, after removing an oxide film formed on the surface of the crystalline semiconductor film 304, a silicon oxide film is formed with a thickness of 50 nm, and then is patterned to selectively form channel protection layers 305a, 305b, 305c, and 305d on the channel formation regions. When a mask used for patterning the channel protection layers 305a, 305b, 305c and 305d is processed by an exposure treatment using laser light, microscopic and accurate patterning can be carried out. Therefore, the channel protection layers having desired shapes can be formed with good controllability.

When the crystallization is carried out utilizing a metal element, a gettering step is performed to reduce or remove the metal element. A semiconductor film is formed as a layer for absorbing the metal element, which is included in the crystalline semiconductor film 304, to be in contact with the crystalline semiconductor film 304 (see FIG. 13B). In this embodiment mode, an amorphous semiconductor film including an impurity element is formed as a gettering sink for capturing the metal element. At first, the oxide film formed on the surface of the crystalline semiconductor film 304 is removed by a washing treatment. A semiconductor film 306 is next formed with a thickness of 100 nm by plasma CVD. In this embodiment mode, the semiconductor film 306 contains an impurity element imparting an n-type conductivity (phosphorus is used in this embodiment mode). The semiconductor film may be formed by CVD or the like to contain the impurity element. Alternatively, after forming a semiconductor film, the impurity element may be added thereinto by ion doping or the like.

Thereafter, a heat treatment is carried out to reduce or eliminate the metal element included in the crystalline semiconductor film 304. As shown in FIG. 13C, the metal element included in the crystalline semiconductor film 304 moved toward the directions denoted by arrows and then is captured in the semiconductor film 306. The metal element included in the crystalline semiconductor film 304 is removed so that the crystalline semiconductor film 304 is changed to a crystalline semiconductor film 307 while the semiconductor film 306 is changed to a semiconductor film 308 containing the metal element for promoting the crystallization. In this embodiment mode, the impurity element for imparting the n-type conductivity and the metal element for promoting the crystallization are included in the semiconductor film 308. According to the above described step, the concentration of the metal element (nickel in this embodiment mode) for promoting the crystallization, which is included in the crystalline semiconductor film, can be set to a level that does not adversely affect the device characteristics, that is, a nickel concentration can be set to be $1\times10^{18}/cm^3$ or less, and desirably, $1\times10^{17}/cm^3$ or less. Further, the semiconductor film 308 to which the metal element moves by the gettering treatment is sometimes crystallized by the heat treatment. Furthermore, in this embodiment mode, the impurity element imparting the n-type conductivity (donor element) included in the semiconductor film 308 is also activated in the gettering step. The heat treatment may be performed under nitrogen atmosphere. In this embodiment mode, the heat treatment is carried out at 550° C. for 4 hours.

Next, the crystalline semiconductor film 307 and the semiconductor film 308 are patterned by using a mask. In this embodiment mode, a photomask is formed. The crystalline semiconductor film 307 and the semiconductor film 308 are patterned to form semiconductor layers 310, 311, 312, 313 and the semiconductor layers having the n-type conductivity. The photomask may be applied over the entire surface of the substrate by spin coating or the like, or, the photomask may be selectively formed by the droplet discharging method, and then be exposed to laser light to have a microscopic pattern. The semiconductor films can be patterned into minute, precise desired shapes by using the mask with the microscopic pattern.

Meanwhile, a mask can be formed by selectively discharging a composition using a resin material such as epoxy resin, acrylic resin, phenol resin, novolac resin, melamine resin and urethane resin, without performing the exposure treatment. Also, the mask can be formed using an organic material such as benzocyclobutene, parylene, flare and polyimide having a light transmitting property; a compound material formed by polymerization of siloxane polymer and the like; a composition material containing a water-soluble homopolymer and a water-soluble copolymer; or the like by using the droplet discharging method. The surface tension and the viscosity of any material are appropriately adjusted by controlling the concentration of a solvent or by adding a surface-active agent, or the like.

Either plasma etching (dry etching) or wet etching may be employed for the etching treatment in patterning. In the case where a large-area substrate is processed by etching, the plasma etching is preferable. As an etching gas, a gas containing fluorine such as $CF_4$, $NF_3$, $SF_3$ and $CHF_3$, a gas containing chlorine typified by $Cl_2$, $BCl_3$, $SiCl_4$ or $CCl_4$, or $O_2$ gas may be used. In addition, an inert gas such as He and Ar may further be added thereto, appropriately. When the etching is performed under an atmospheric pressure discharge, electric discharge machining can be performed locally, and therefore, a mask layer is not necessary to be formed over an entire surface of a substrate.

A mask 319a covering the semiconductor layer 310 and the semiconductor layer 314 having the n-type conductivity, a mask 319b covering the semiconductor layer 311 and the semiconductor layer 315 having the n-type conductivity formed over the channel formation region of the semiconductor layer 311, a mask 319c covering the semiconductor layer 312 and the semiconductor layer 317 having the n-type conductivity, and a mask 319d covering the semiconductor layer 313 and the semiconductor layer 318 having the n-type conductivity are formed. An impurity element 309 imparting a p-type conductivity is added to form semiconductor layers 316a and 316b having the p-type conductivity. The impurity element imparting the p-type conductivity (boron (B) in this embodiment mode) is selectively doped into the semiconductor layers having the n-type conductivity by doping or ion implantation such that the concentration of the impurity element imparting the p-type conductivity is set to be 2 to 10 times of that of the impurity element imparting the n-type conductivity. Accordingly, the n-type conductivity is inverted into the p-type conductivity, thereby forming the semiconductor layers 316a and 316b having the p-type conductivity (see FIG. 13D). Afterwards, a heat treatment is carried out to activate the impurity element imparting the p-type conductivity. In this embodiment mode, this heat treatment is performed at 550° C. for 4 hours.

A composition containing a conductive material is discharged from droplet discharging devices 320a, 320b and 320c to form conductive layers 321, 322, 323a and 323b (see FIG. 13E). In this embodiment mode, silver is used as the conductive material, and the composition containing silver is baked at 300° C. after discharging it over the substrate.

The conductive layers 321, 322, 323a and 323b are patterned while utilizing a mask that is processed with laser light to form source or drain electrode layers 328a, 328b, 328c, 329a, 329b, 330a, 330b and 330c. In this embodiment mode, the conductive layers 321, 322, 323a and 323b are wet-etched using etchant.

While utilizing the source or drain electrode layers 328a, 328b, 328c, 329a, 329b, 330a, 330b and 330c as masks, the semiconductor layers 314, 317 and 318 having the n-type conductivity and the semiconductor layers 316a and 316b having the p-type conductivity are patterned to form semiconductor layers 324a, 324b, 326a, 326b, 327a, and 327b having the n-type conductivity and semiconductor layers 325a and 325b having the p-type conductivity (see FIG. 14A). The semiconductor layers having the n-type and p-type conductivities are patterned by dry etching using an etching gas such as $CF_4$ and $O_2$. Further, the mask used in patterning the source or drain electrode layers is removed after the completion of the patterning treatment of the semiconductor layers having the n-type and p-type conductivities.

The source or drain electrode layers are preferably formed by a known method such as printing, electrolytic plating, PVD (physical vapor deposition), CVD (chemical vapor deposition) and evaporation. Also, the source or drain electrode layers can be formed into predetermined patterns by the droplet discharging method. As materials for the source or drain electrode layers, metal such as tungsten (W), molybdenum (Mo), zirconium (Zr), hafnium (Hf), vanadium (V), niobium (Nb), tantalum (Ta), chromium (Cr), cobalt (Co), nickel (Ni), platinum (Pt), aluminum (Al), silver (Ag), gold (Au) and copper (Cu), or an alloy thereof, or metal nitride thereof can arbitrarily be used. In addition, plural layers including the above mentioned materials may be laminated to form the source or drain electrode layers. Typically, a tantalum nitride film and a tungsten film may be sequentially laminated over the substrate. Additionally, a material formed by mixing silicon and an impurity element imparting one conductivity type may be used. For example, a silicon film having an n-type conductivity that contains an impurity element imparting an n-type conductivity such as phosphorus (P) can be used as an amorphous silicon film.

Moreover, the source or drain electrode layers may be formed using a conductive material with a light transmitting property. For instance, the source or drain electrode layers may be made from indium tin oxide (ITO), indium tin oxide containing silicon oxide (ITSO), zinc oxide (ZnO), tin oxide ($SnO_2$) or the like. Preferably, they are made from indium tin oxide (ITO), indium tin oxide containing silicon oxide (ITSO), zinc oxide (ZnO) or the like by sputtering. More preferably, they are formed using indium tin oxide containing silicon oxide by sputtering with use of a target in which 2 to 10 weight % silicon oxide is included in the ITO. In addition, a conductive material such as an alloy of indium oxide and zinc oxide including silicon oxide, in which 2 to 20% zinc oxide (ZnO) is mixed in indium oxide, may be used.

With respect to the top-gate planar structure manufactured in this embodiment mode, the semiconductor layers, which are the crystalline semiconductor layers, are formed by the heat treatment, followed by the step of forming the conductive layers such as the source electrode layers, the drain electrode layers and gate electrode layers. Therefore, a high heat resistant material can be used as the thus-manufactured conductive layers. Consequently, the range of choices for materials of the source or drain electrode layers is widened. In addition, the reliability is improved since defects in shape, functions and characteristics of the conductive layers such as the electrode layers are not caused due to the heat treatment.

Next, a gate insulating layer 364 is formed on the source or drain electrode layers 328a, 328b, 328c, 329a, 329b, 330a, 330b, 330c, the channel protection layers 305a, 305b, 305c and 305d. The gate insulating layer 364 can be formed by arbitrarily using silicon oxide (SiOx), silicon nitride (SiNx), silicon oxynitride (SiOxNy) (x>y), silicon nitride oxide (SiNxOy) (x>y), and the like. The gate insulating layer may also be formed using a single layer or a lamination layer including any of silicon oxide (SiOx), silicon nitride (SiNx), silicon oxynitride (SiOxNy) (x>y), silicon nitride oxide (SiNxOy) (x>y), and the like. Further, the gate insulating layer 364 contains hydrogen in this embodiment mode. In this embodiment mode, a silicon nitride film is formed with a thickness of 110 nm by CVD as the gate insulating layer in this embodiment mode.

An opening that reaches the source or drain electrode layer 329b is formed by etching in the gate insulating layer 364. Either dry etching or wet etching can be used in this etching step. The source or drain electrode layer 329b and a gate electrode layer 335 that will be formed later are electrically connected to each other through this opening 365.

A composition containing a conductive material is discharged from droplet discharging devices 331a, 331b, 331c, 331d and 331e to form gate electrode layers 332, 333, 334, 335 and 336 on the gate insulating layer 364 (see FIG. 14B). The step of forming the gate electrode layers 332, 333, 334, 335 and 336 on the gate insulating layer 364 can, be performed in the same manner as the above-described process of forming the source or drain electrode layers. In this embodiment mode, a composition containing silver as the conductive material is discharged on the gate insulating layer, and then baked at 300° C. to form the gate electrode layers 332, 333, 334, 335 and 336 on the gate insulating layer 364. Formation of the gate electrode layer 335 in the opening 365 allows the source or drain electrode layer 329b to be electrically connected to the gate electrode layer 335 through the opening.

As the conductive material for forming the gate electrode layers, a composition mainly containing a particle of metal such as silver (Ag), gold (Au), copper (Cu), tungsten (W), and aluminum (Al) can be used. Also, the conductive material may be used in combination with indium tin oxide (ITO), ITSO containing indium tin oxide and silicon oxide, organic indium, organic tin, zinc oxide, titanium nitride and the like having light transmitting properties.

After forming the gate electrode layers 332, 333, 334, 335 and 336, a planarizing step using a pressing treatment or the like may also be carried out in the same manner as the process of forming the source or drain electrode layers. Further, in the case where the gate electrode layers are formed by the droplet discharging method, pre-baking is performed, and the pressing step is performed prior to carrying out the final-baking. Therefore, this pressing step has also an effect of reducing the electric resistance since the oxygen included in the gate electrode layers is released and the oxygen concentration is reduced therein, in addition to an effect of planarizing the electrode layers.

An insulating film 337 that will be a passivation film is preferably formed to cover the source or drain electrode layers, the semiconductor layers, the gate insulating layer, and the gate electrode layers. The insulating film 337 can be formed using silicon nitride, silicon oxide, silicon nitride oxide, silicon oxynitride, aluminum oxynitride, aluminum oxide, diamond like carbon (DLC), carbon containing nitride (CN), or other insulating material by using a method for forming a thin film such as plasma CVD and sputtering. Further, the passivation film may include a single layer or a laminated layer structure. In this embodiment mode, a silicon nitride film with a thickness of 110 nm is used as the insulating film 337.

Thereafter, the semiconductor layers 310, 311, 312 and 313 are preferably hydrogenated by heating under hydrogen atmosphere or nitrogen atmosphere. When they are heated under the nitrogen atmosphere, an insulating film containing hydrogen is preferably used as the insulating film 337.

Next, an insulating layer 338 is formed. In this embodiment mode, the insulating layer 338 is formed over the entire surface of the substrate and it is patterned by etching while using a mask made from resist or the like. When this insulating layer 338 is formed by the droplet discharging method or printing where a pattern can be formed directly and selectively, the insulating layer is not necessary to be patterned by etching. In this embodiment mode, a second insulating layer that serves as a partition wall is formed on the insulating layer 338 that is formed as an interlayer insulating layer. In this case, the insulating layer 338 is also referred to as a first insulating layer.

The insulating layer 338 may be formed using an inorganic insulating material such as silicon oxide, silicon nitride, silicon oxynitride, aluminum oxide, aluminum nitride, aluminum oxynitride, diamond like carbon (DLC), carbon containing nitride (CN) and polysilazan; acrylic acid, mathacrylic acid and a derivative thereof; an organic insulating material such as polyimide, aromatic polyamide, polybenzimidazole and benzocyclobutene; or siloxane resin (including inorganic siloxane and organic siloxane). In addition, a photosensitive or nonphotosensitive material such as acrylic and polyimide may be used to form the insulating layer 338.

In this embodiment mode, a siloxane resin material is used as a material for the insulating layer 338, and the insulating layer is formed using a silt coater. A film of the siloxane resin material that has been baked can be also referred to as a silicon oxide (SiOx) film.

An opening 339 that reaches the source or drain electrode layer 330b is formed in the insulating film 337, the insulating layer 338 and the gate insulating layer 364 (see FIG. 14C). This opening is also formed by etching using a mask made from resist. A mask having a microscopic shape that is formed by being irradiated with laser light through the exposure treatment can be used as the mask for etching. A wiring layer 345 is formed in the opening 339 manufactured above. The wiring layer 345 may also be formed using the same material as the materials of the source or drain electrode layers and the gate electrode layers. In this embodiment mode, the wiring layer 345 is formed using silver by the droplet discharging method, and then is baked at 300° C.

A composition containing a conductive material is selectively discharged on the insulating layer 338 so as to form a first electrode layer 346 in contact with the wiring layer 345 (see FIG. 15A). In the case where light is emitted through the substrate 300, or a transmissive display panel is manufactured, the first electrode layer 346 may be formed as follows: a composition containing a conductive material with a light transmitting property capable of transmitting at least visible light such as indium tin oxide (ITO), indium tin oxide including silicon oxide (ITSO), indium zinc oxide (IZO) including zinc oxide (ZnO), zinc oxide (ZnO), ZnO added with gallium (Ga) and tin oxide ($SnO_2$) is formed to have a predetermined pattern and then baked.

Also, the first electrode layer 346 is preferably formed using indium tin oxide (ITO), indium tin oxide including silicon oxide (ITSO), zinc oxide (ZnO) or the like by sputtering. More preferably, the first electrode layer is made from indium tin oxide containing silicon oxide by sputtering using a target in which 2 to 10 weight % silicon oxide is mixed in the ITO. In addition, a conductive material of ZnO added with gallium (Ga), indium zinc oxide (IZO) that contains silicon oxide and indium oxide mixed with 2 to 20% zinc oxide (ZnO), which is a conductive oxide material, may be used. After forming the first electrode layer 346 by sputtering, a mask layer is formed by the droplet discharging method, and the first electrode layer may be etched into a predetermined pattern while utilizing the mask. In this embodiment mode, the first electrode layer 346 is formed using a conductive material with a light transmitting property by the droplet discharging method. Concretely, the first electrode layer 346 is formed using indium tin oxide or ITSO including ITO and silicon oxide.

According to the above described process, a TFT substrate (also denoted by a element substrate) for a display device in which the top-gate type thin film transistors with a planar structure and the first electrode layer, which is a pixel electrode layer, are connected to one another over the substrate 300 is completed.

Subsequently, an insulating layer (also, referred to as a partition wall or a bank) 349 is selectively formed. The insulating layer 349 is formed on the first electrode layer 346 to have an opening and cover the wiring layer 345. In this embodiment mode, the insulating layer 349 is formed over the entire surface of the substrate, and is patterned by etching while using a mask made from resist or the like. When the insulating layer 349 is formed by the droplet discharging method or printing where a pattern can be formed directly and selectively, the insulating layer is not necessary to be patterned by etching.

The insulating layer 349 is formed using an inorganic insulating material such as silicon oxide, silicon nitride, silicon oxynitride, aluminum oxide, aluminum nitride and aluminum oxynitride; acrylic acid, mathacrylic acid, a derivative thereof; a heat-resistant high molecular weight material such as polyimide, aromatic polyamide and polybenzoimidazole; or an insulating material such as inorganic siloxane that includes Si—O—Si bonds among compounds including silicon, oxygen and hydrogen that is formed using a siloxane material as a raw material or organic siloxane in which hydrogen in silicon is substituted by an organic group such as methyl and phenyl. Additionally, a photosensitive or nonphotosensitive material such as acrylic and polyimide may be used to form the insulating layer 349. Preferably, the insulating layer 349 has a shape in which the radius of curvature is continuously varied so as to improve the coverage of an electroluminescent layer 347 and a second electrode layer 348 formed over the insulating layer 349.

Alternatively, after discharging a composition of the insulating layer 349 by the droplet discharging method, the surface of the composition may be pressed with pressure to planarize the surface thereof. As a method for pressing the surface thereof, a roller may be scanned over a surface to level unevenness formed on the surface, or a surface may be perpendicularly pressed with a flat plate. Also, the surface may be softened or dissolved by using a solvent or the like and the unevenness may be removed by an air knife. Alternatively, the unevenness may be polished by CMP. This step can be arbitrarily applied in the case of causing unevenness due to the droplet discharging method so as to level the uneven surface. When the planarity is improved by this step, non-uniformities in display performance of a display device can be prevented, making it possible to display a high-definition image.

A light emitting element is formed to be electrically connected to the thin film transistors (see FIG. 15B).

A heat treatment is performed at 200° C. under atmospheric pressure to remove moisture included in the first electrode layer 346 and the insulating layer 349 or attached to the surfaces thereof prior to forming the electroluminescent layer 347. Preferably, the heat treatment is carried out at 200 to 400° C., and preferably, at 250 to 350° C. under reduced pressure, and the electroluminescent layer 347 is successively formed by vacuum evaporation or by the droplet discharging method under reduced pressure without exposing it to atmospheric air As the electroluminescent layer 347, materials showing red (R), green (G) and blue (B) light are selectively formed by evaporation using an evaporation mask, respectively. The materials showing red (R), green (G) and blue (B) light can be formed by the droplet discharging method (e.g., using a low molecular weight material, a high molecular weight material or the like) in the same manner as a color filter. This case is preferable since the materials showing red (R), green (G) and blue (B) light can be independently formed without using a mask. The second electrode layer 348 is laminated on the electroluminescent layer 347 to achieve a display device using the light emitting element with a display function.

Although not shown in the drawings, it is effective that a passivation film be formed to cover the second electrode layer 348. A protection film formed in fabricating the display device may include either a single layer structure or a laminated layer structure. The passivation film may be formed using an insulating film that contains silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide (AlNO) having higher nitrogen content than oxygen content, aluminum oxide, diamond like carbon (DLC), and a carbon film containing nitrogen ($CN_x$). A single layer or a lamination layer of the above-mentioned insulating films can be used. For example, a lamination layer of a carbon film containing nitrogen ($CN_x$) and silicon nitride (SiN) may be used. Further an organic material may be used as the passivation film. For instance, a lamination layer of a high molecular weight organic material such as styrene polymer may be used. In addition, a siloxane resin material may be used.

At this moment, a film having excellent coverage is preferably used as the passivation film. For example, a carbon film, in particular, a DLC film are preferably used as the passivation film. Since the DLC film can be formed at a temperature of 100° C. or less, it can be easily formed over the electroluminescent layer having low heat resistance. The DLC film can be formed by plasma CVD (typically, RF plasma CVD, microwave CVD, electron cyclotron resonance (ECR), CVD, thermal filament CVD or the like), combustion flame, sputtering, ion beam evaporation, laser evaporation, and the like. Hydrogen gas and a gas containing hydrocarbon (for example $CH_4$, $C_2H_2$, $CH_6$, etc.) are used as reactive gases which are used for forming the film. The reactive gases are ionized by glow discharge. The ions are accelerated to collide with a negatively self-biased cathode. A CN film may be formed using $C_2H_4$ gas and $N_2$ gas as reactive gases. The DLC film has a high blocking effect with respect to oxygen and can prevent the electroluminescent layer from being oxidized. Accordingly, the DLC film can prevent the electroluminescent layer from being oxidized during a subsequent sealing step.

Figure 29:
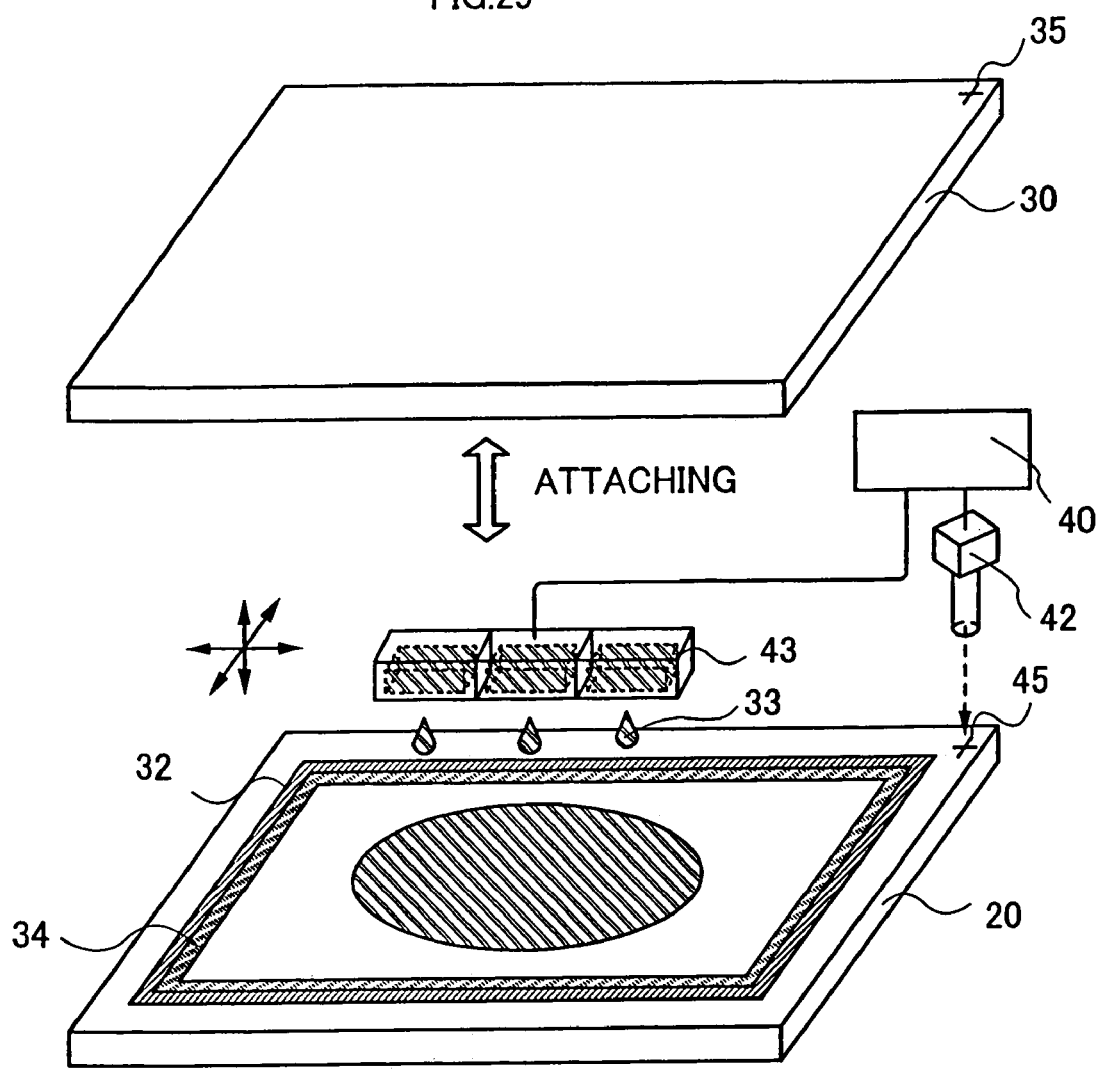
FIG. 29 is a diagram showing a method for dropping a liquid crystal that can be applied to the present invention.

Subsequently, the TFT substrate is sealed with a sealing substrate 351 while filling a filler 350 therebetween. The filler may be filled therebetween by using dripping in the same manner as shown in FIG. 29. An inert gas such as nitrogen may be filled between the substrates as substitute for the filler 350. Further, providing a drying agent inside of the display device makes it possible to prevent deterioration of the light emitting element due to moisture. The drying agent may be provided over the sealing substrate 351 or the substrate 300, over which the light emitting element is formed. Furthermore, a depression portion may be provided over any one of the substrates to accommodate the drying agent therein. When the drying agent is placed in a portion where corresponds to a region that does not contribute to display performance such as a driver circuit region and a wiring region of the sealing substrate 351, the aperture ratio is not deteriorated even if the drying agent is an opaque substance. The filler 350 may be mixed with a material having a moisture absorbing property to also serve as a drying agent. As mentioned above, the display device using the light emitting element and having the display function can be completed (see FIGS. 16A and 16B).

Moreover, a terminal electrode layer 353 for electrically connecting the internal portion of the display device and an external portion is attached with an FPC 355 by an anisotropic conductive film 354 so that the terminal electrode layer 353 is electrically connected to the FPC 355.

FIG. 16A shows a top view of the display device. As shown in FIG. 16A, a pixel region 360, a scanning line driver circuit region 361*a*, a scanning line driver circuit region 361*b* and a connection region 363 are sealed between the substrate 300 and the sealing substrate 351 using a sealing material 352. A signal line driver circuit 362 that is formed using an IC driver is provided over the substrate 300.

According to the above described process, the top-gate type thin film transistors with a planar structure comprising the crystalline semiconductor films can be formed. Since the thin film transistors manufactured in this embodiment mode are formed using the crystalline semiconductor film, they have higher mobility than that of a thin film transistor formed using an amorphous semiconductor film. In addition, the source and drain regions contain the metal element, which has a function of promoting the crystallization of the semiconductor films, in addition to the impurity element imparting one conductivity type. Therefore, the source and drain regions having low resistivity can be formed. As a result, a display device that is necessary to be operated at high speed can be formed.

Moreover, as compared with a thin film transistor formed using an amorphous semiconductor film, the variation in threshold value is difficult to be caused in the thin film transistor formed using the crystalline semiconductor film, thereby reducing the variation in the characteristics of the thin film transistor.

Furthermore, since the metal element mixing in the semiconductor film is gettered in forming the thin film transistor through the gettering step, off current can be reduced. Therefore, by providing such a thin film transistor into a switching element of the display device, the contrast can be improved.

The present embodiment mode can be implemented in combination with Embodiment Modes 1 through 7.

Embodiment Mode 9

In this embodiment mode, an example of manufacturing a liquid crystal display device using a liquid crystal display element as its display element by utilizing the display device manufactured in Embodiment Mode 1, with reference to FIGS. 17A and 17B and FIGS. 18A and 18B. Further, same portions and portions having similar functions as those of Embodiment Mode 1 will not be further explained.

Figure 17A:
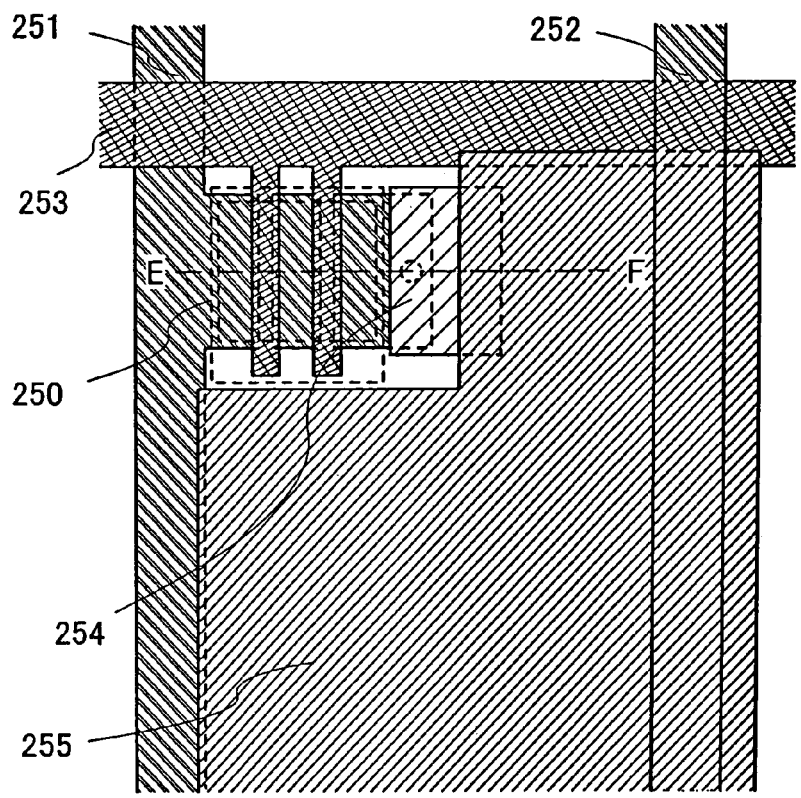
FIG. 17A is a top view and FIG. 17B is a cross sectional view explaining a method for manufacturing a display device according to the present invention.
Figure 17B:
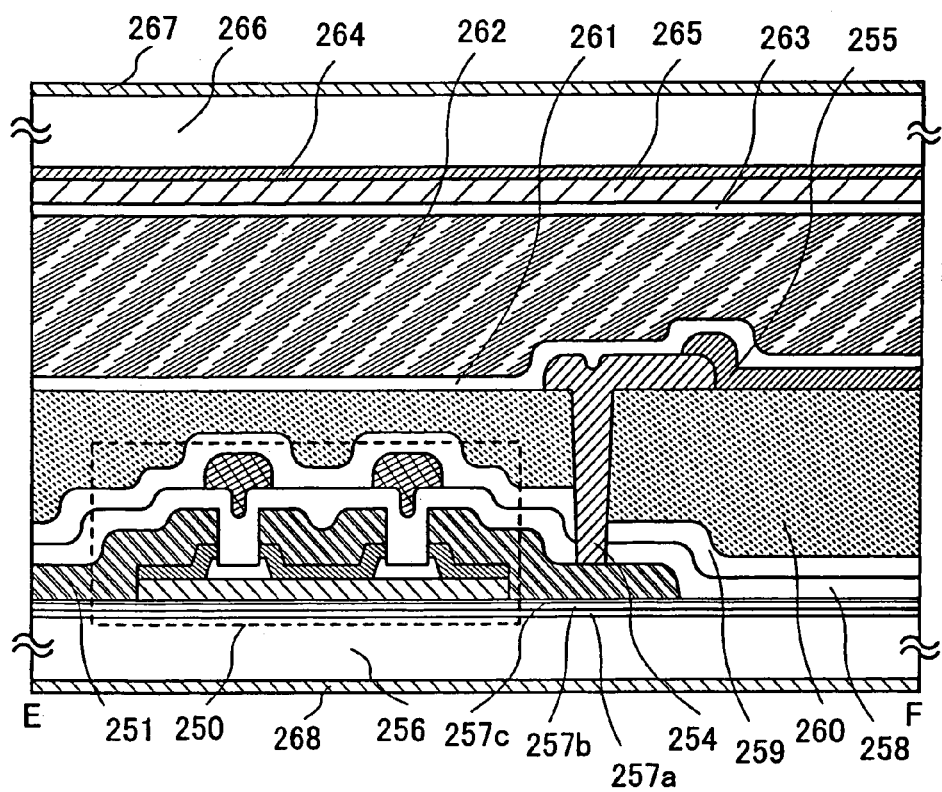

FIG. 17A is a top view of a pixel portion of a display device, while FIG. 17B is a cross sectional view along a line E-F of FIG. 17A. In a pixel region, a top-gate type thin film transistor 250 having a planar structure according to the present invention, a source or drain electrode layer 25*i* that also servers as a source or drain wiring layer, a capacitor wiring layer 252, a gate electrode layer 253 that also serves as a gate wiring layer, a wiring layer 254, a pixel electrode layer 255, an insulating film 259, and an insulating layer 260 are provided. The thin film transistor 250 has a multi-gate structure. The source or drain electrode layer of the thin film transistor 250 is electrically connected to the pixel electrode layer 255 by the wiring layer 254.

Insulating layers 257a, 257b and 257c, which will be a base film of a semiconductor layer, are formed over a substrate 256. In this embodiment mode, a silicon nitride oxide film is formed as the insulating film 257a and a silicon oxynitride film is formed as the insulating film 257b over the substrate 256. Thereafter, a silicon nitride oxide film with a thickness of 0.3 to 5 nm is formed as the insulating film 257c on the silicon oxynitride film. Thus, the base layer is formed to have a three-layered structure. By employing this three-layered structure, an efficiency of gettering a metal element included in the semiconductor layer is improved, reducing an adverse effect of the silicon nitride oxide film with respect to the semiconductor layer. These insulating films may be laminated to one another successively in vacuum at a same temperature in a chamber while changing reactive gases. When the insulating films are successively formed while maintaining the vacuum state, the interfaces of these laminated films can be prevented from being contaminated. Note that these insulating films 257a, 257b and 257c are abbreviated as one layer in FIGS. 18B for the sake of convenience.

In the liquid crystal display device of this embodiment mode, the driver circuit region is also formed over the same substrate as the pixel region. The liquid crystal display device of this embodiment mode is shown in FIGS. 18A and 18B. FIG. 18A is a top view of the liquid crystal display device while FIG. 18B is a cross sectional views taken along lines O-o and p-P, and a cross sectional view taken along a line U-W where is a peripheral driver circuit region.

In the peripheral driver circuit of this embodiment mode, an NMOS circuit including an n-channel thin film transistor 280a and an n-channel thin film transistor 280b is provided. The n-channel thin film transistor 280a and the n-channel thin film transistor 280b include source or drain electrode layers 285a, 285b, 285c; semiconductor layers 281, 282; channel protection layers 286a, 286b; a gate insulating layer 287; and gate electrode layers 288 and 289.

Figure 40:
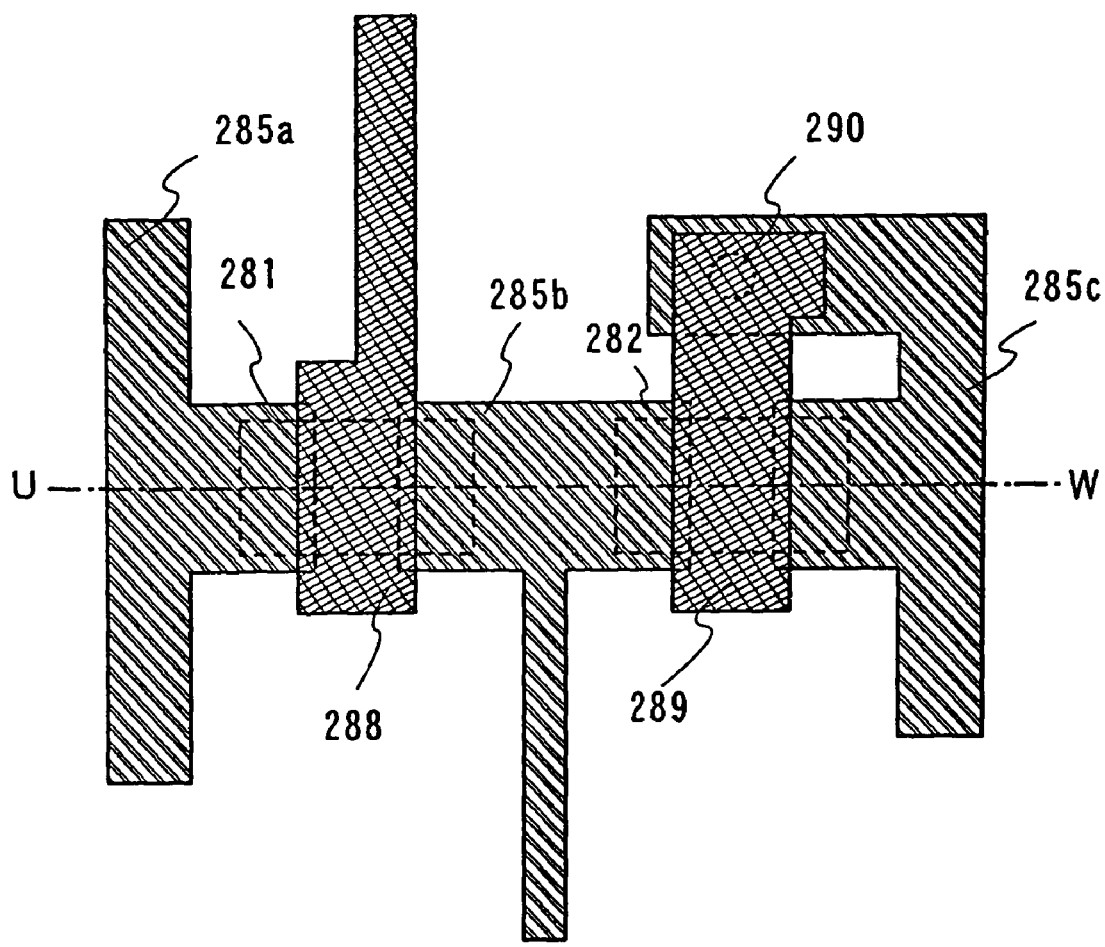
FIG. 40 is a diagram explaining a display device according to the invention.

In this embodiment mode, the driver circuit region serves as an inverter using an NMOS structure. In the case of only a PMOS or NMOS structure in this way, a gate electrode layer and a source or drain electrode layer of a part of TFTs are connected to each other. Such an example is shown in FIG. 40. A gate insulating layer 287 is partly etched using a photomask to form a contact hole 290 as shown in FIG. 40. A gate electrode layer 289 is formed in the contact hole 290 to electrically connect a source or drain electrode layer 285c to the gate electrode layer 289. By electrically connecting the source or drain electrode layer 285c to the gate electrode layer 289, the n-channel thin film transistor 280a and the n-channel thin film transistor 280b can serve as inverters even though they have the NMOS structure.

An insulating layer 261, which is also referred to as an orientation film, is formed by printing or spin coating so as to cover the thin film transistor 250, the pixel electrode layer 255, the wiring layer 254, the insulating film 259, and the insulating layer 260. The insulating layer 261 can be selectively formed by using screen printing or offset printing. Thereafter, a rubbing treatment is performed. Subsequently, a sealing material 378 is formed in the periphery of a pixel region by the droplet discharging method.

Thereafter, a counter substrate 266, over which an insulating layer 263 functioning as an orientation film, a colored layer 264 functioning as a color filter, a conductive layer 265 functioning as a counter electrode and a polarizing plate 267 are provided, is attached to the substrate 256 having the TFTs while sandwiching a spacer 273 therebetween. A liquid crystal layer 262 is provided in a gap between the counter substrate 266 and the substrate 256 so as to achieve a liquid crystal display device (see FIG. 17B). A polarizing plate 268 may also be provided on a surface of the substrate 256 over which the TFTs are not provided. The sealing material may be mixed with a filler. In addition, a light shielding film (black matrix) and the like may be formed over the counter substrate 266. Further, the liquid crystal layer can be formed by using a dispenser (a dropping method), a dipping method in which a liquid crystal is injected between the attached substrates by utilizing capillary phenomenon, and the like.

A liquid crystal dropping method employing a dispenser will be described with reference to FIG. 29. In FIG. 29, reference numeral 40 represents a controlling device; 42, image means; 43, a head; 33, a liquid crystal; 35, a marker; 41, a marker; 34, a barrier layer, 32, a sealing material; 30, a TFT substrate; and 20, a counter substrate. A closed loop is formed over the counter substrate 20 by using a sealing material 32, and the liquid crystal 33 is dropped therein at one or more times from the head 43. The head 43 is equipped with a plurality of nozzles so that a great amount of the liquid crystal material can be dropped at once, thereby improving the throughput. At this moment, the barrier layer 34 is provided to prevent the sealing material 32 from reacting with the liquid crystal 33. Subsequently, the substrates are attached to each other in vacuum. The sealing material is cured by being irradiated with ultraviolet light so that the liquid crystal is enclosed between the substrates.

With respect to spacers, particles having several μm in size may be dispersed. However, in this embodiment mode, a resin film is formed over the entire surface of the substrate, and then the resin film is patterned to form the spaces. After a material for such spacers is applied over the entire surface of the substrate by spinner, the material is patterned into a predetermined shape through exposure and development treatments. Also, the material is baked at 150 to 200° C. using a clean oven or the like to be cured. The shapes of these spacers manufactured above can be varied depending on the conditions of the exposure and development treatments. Preferably, when the spacers are formed to have a columnar shape that has a flat top and a flat bottom, the liquid crystal display device can secure mechanical intensity when being attached with the counter substrate. Spacers having a cone shape, a pyramidal shape or the like can be used, and the shapes of the spacers are not particularly limited.

A connection portion is formed to connect the pixel portion formed through the above described process to an external wiring substrate. The insulating layer in the connection portion is removed by an ashing treatment using oxygen gas under atmospheric pressure or almost atmospheric pressure. This ashing treatment is carried out by using the oxygen gas along with one or more of hydrogen, $CF_4$, $NF_3$, $H_2O$ and $CHF_3$. Although the ashing treatment is performed after sealing the liquid crystal with the counter substrate in order to prevent the deterioration or destruction due to electrostatic charge in this process, the ashing treatment may be performed at any time if the electrostatic charge hardly affect adversely.

FPCs 272 are attached to terminal electrode layers 270 for electrically connecting an internal portion of the liquid crystal display device to an external portion by using an anisotropic conductive film 271 so that the FPCs are electrically connected to the terminal electrode layers 270. In FIG. 18A, a pixel region 275, a scanning line driver circuit region 276a, a scanning line driver circuit region 276b and a signal line driver circuit region 277 are provided over the substrate 256.

Through the above described process, the liquid crystal display device (or the liquid crystal display panel) using the present invention is completed. Since the top-gate type thin film transistors having a planar structure manufactured in this embodiment mode are formed using a crystalline semiconductor film, they have higher mobility than that of a thin film transistor formed using an amorphous semiconductor film. In addition, source and drain regions contain a metal element in addition to an impurity element imparting one conductivity type so that the source and drain regions having low resistivity can be formed. As a result, a liquid crystal display device that is necessary to be operated at high speed can be manufactured. Consequently, a liquid crystal display device having high response speed like an OCB mode with wide viewing angle can be manufactured.

Moreover, as compared with the thin film transistor formed using the amorphous semiconductor film, the variation in threshold value is difficult to be caused in the thin film transistors formed using the crystalline semiconductor film in this embodiment mode, reducing the variation in characteristics of the thin film transistors.

Further, a metal element mixed in a semiconductor film is removed in manufacturing a thin film transistor through a gettering step, making it possible to reduce off current. Therefore, by providing such a thin film transistor in a switching element of a liquid crystal display device, the contrast can be improved.

Furthermore, microscopic processing with use of laser light allows to design a fine wiring and the like freely. According to the present invention, a desired pattern can be formed with good controllability while reducing loss of materials and the cost. As a result, a high-performance, highly-reliable display device can be manufactured with good yield.

The present embodiment mode can be implemented in combination with Embodiment Modes 1 through 7.

Embodiment Mode 10

A multilayer structure, in which the source or drain electrode layers (including the source wiring layer) and the gate electrode layers (including the gate wiring layer) are laminated to one another while interposing the gate insulating layer therebetween, and the gate electrode layers (including the gate wiring layer) and the wiring layer are laminated to one another while interposing the interlayer insulating layer therebetween, is employed in Embodiment Mode 1. In this embodiment mode, examples of different lamination structures from the above described multilayer structure of Embodiment Mode 1 will be described with reference to FIGS.: 19A and 19B,. 20A and 20B, 21A and 21B, 22A and 22B, 23A and 23B and 24A and 24B. Same portions and portion having same functions of those of Embodiment Mode 1 will not be further explained.

Figure 19A:
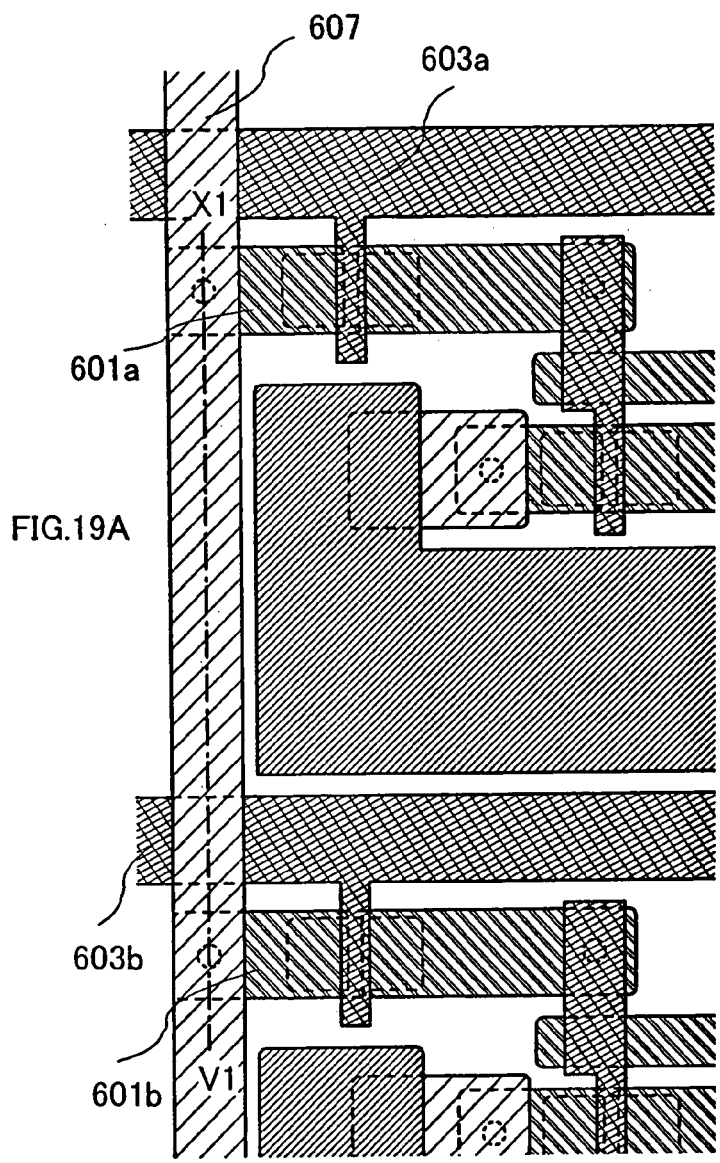
FIG. 19A is a top view and FIG. 19B is a cross sectional view explaining a method for manufacturing a display device according to the present invention.
Figure 19B:
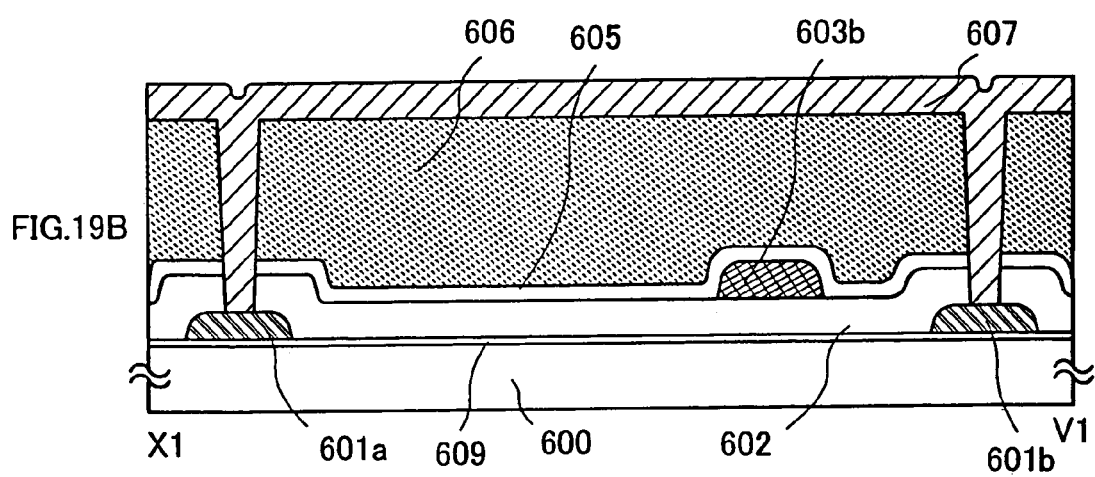

FIG. 19A is a top view of a display device, while FIG. 19B is a cross sectional view taken along a line X1-V1 of FIG. 19A.

In FIGS. 19A and 19B, an insulating layer 609, which will be a base film, source or drain electrode layers 601a and 601b, a gate insulating layer 602, gate electrode layers 603a and 603b, a wiring layer 607, an insulating film 605, which is a passivation film, and an insulating layer 606 are provided over a substrate 600 inside of a pixel region of the display device.

The insulating film 605 is not necessary to be provide. However, since the insulating film 605 serves as a passivation film, when the insulating film 605 is formed, the reliability of the display device can be further improved. Also, when the insulating film 605 is formed and then a heat treatment is performed, a semiconductor layer can be hydrogenated due to hydrogen included in the insulating film 605.

As shown in FIG. 19B, the gate electrode layer 603b and the wiring layer 607 are laminated together while interposing the insulating layer 606, which is the interlayer insulating layer, therebetween. The wiring layer 607 is connected to the source or drain electrode layers 601a and 601b through contact holes that are formed in the insulating layer 606, the insulating film 605 and the gate insulating layer 602. Therefore, the wiring layer 607 is not short-circuited with the gate electrode layer 603b. The wiring layer 607 serves as a source wiring layer.

Figure 20A:
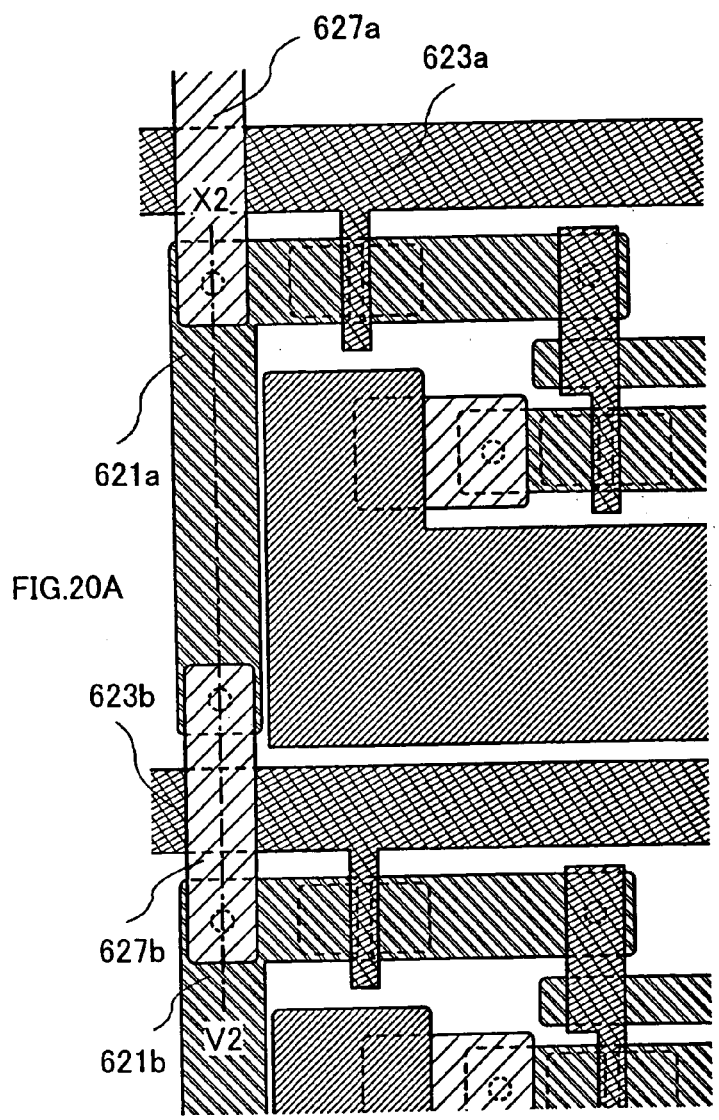
FIG. 20A is a top view and FIG. 20B is a cross sectional view explaining a method for manufacturing a display device according to the present invention.
Figure 20B:
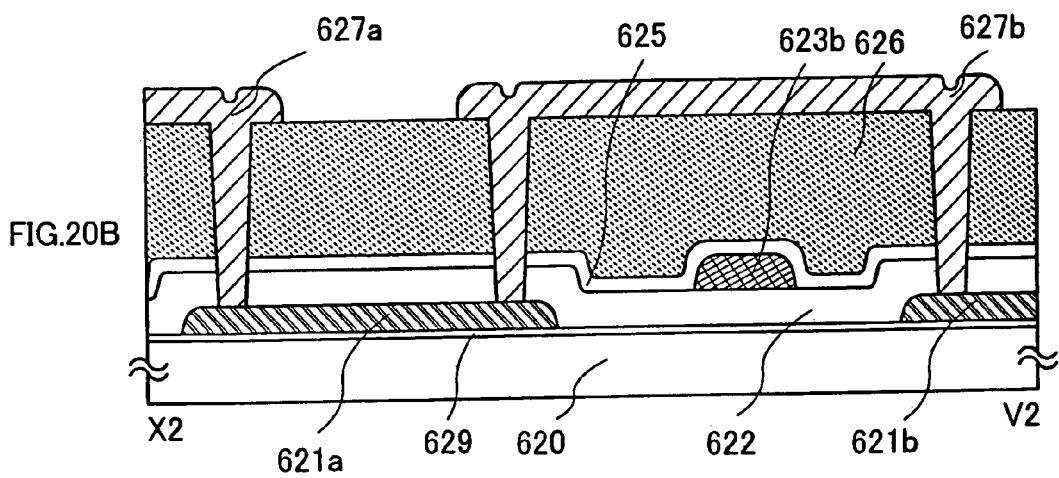

FIG. 20A is a top view of a display device while FIG. 20B is a cross sectional views taken along a line X2-V2 of FIG. 20A. In FIGS. 20A and 20B, an insulating layer 629, which will be a base film, source or drain electrode layers 621a and 621b, a gate insulating layer 622, gate electrode layers 623a and 623b, wiring layers 627a and 627b, an insulating film 625, which is a passivation film, and an insulating layer 626 are provided over a substrate 620 inside of a pixel region of the display device.

As shown in FIG. 20B, the gate electrode layer 623b and the wiring layer 627b are laminated together while interposing the insulating layer 626, which is the interlayer insulating layer, therebetween. The wiring layer 627b is connected to the source or drain electrode layers 621a and 621b through contact holes that are formed in the insulating layer 626, the insulating film 625 and the gate insulating layer 622. Therefore, the wiring layer 627b is not short-circuited with the gate electrode layer 623b. Also, in the display device as shown in FIGS. 20A and 20B, a source wiring layer is formed intermittently rather than formed continuously, and is electrically connected to the source or drain electrode layers through contact holes. Therefore, in a region where the gate electrode layer 623b is formed, the source or drain electrode layers 621a and 621b are electrically connected to the wiring layer 627b formed on the insulating layer 626 through the contact holes.

Figure 21A:
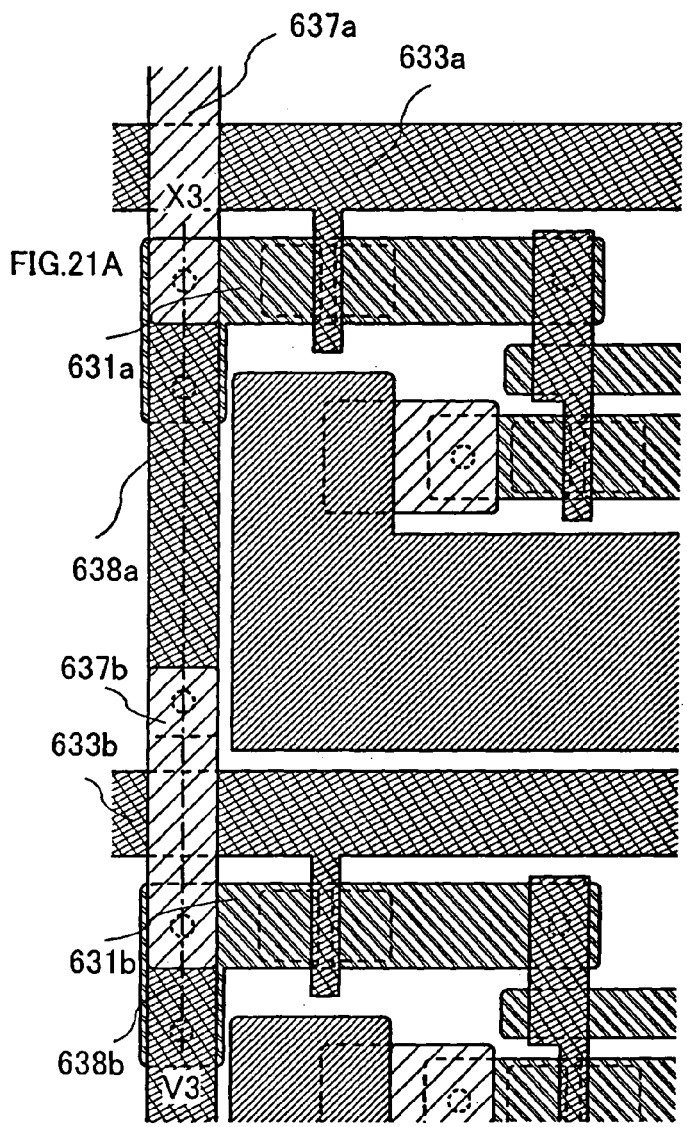
FIG. 21A is a top view and FIG. 21B is a cross sectional view explaining a method for manufacturing a display device according to the present invention.
Figure 21B:
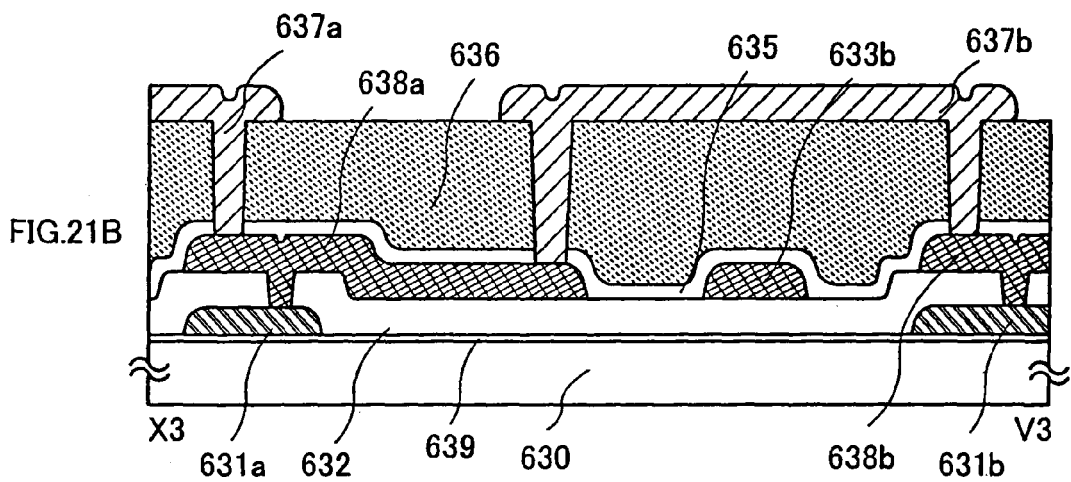

FIG. 21A is a top view of a display device while FIG. 21B is a cross sectional views taken along a line X3-V3 of FIG. 21A. In FIGS. 21A and 21B, an insulating layer 639, which will be a base film, source or drain electrode layers 631a and 631b, a gate insulating layer 632, gate electrode layers 633a and 633b, wiring layers 637a and 637b, wiring layers 638a and 638b, an insulating film 635, which is a passivation film, and an insulating layer 636 are provided over a substrate 630 inside of a pixel region of the display device.

As shown in FIG. 21B, the gate electrode layer 633b and the wiring layer 637b are laminated together while interposing the insulating layer 636, which is the interlayer insulating layer, therebetween. In the display device as shown in FIG. 20B, the source or drain electrode layer 621a, the wiring layers 627a and 627b are directly connected to one another. However, in the display device as shown in FIG. 21B, the source or drain electrode layer 631a, the wiring layers 637a and 637b are electrically connected to one another through the wiring layer 638a that is formed using the same material through the same step as the gate electrode layers. Therefore, the source or drain electrode layer 631a is connected to the wiring layer 638a that is formed on the gate insulating layer 632 through a contact hole. The wiring layer 638a is connected to the wiring layers 637a and 637b through a contact hole. Accordingly, the source or drain electrode layer 631a, the wiring layers 637a and 637b are electrically connected to one another. The gage electrode layer 633b and the wiring layer 637b are laminated together while interposing the insulating layer 636, which is the interlayer insulating layer, therebetween, and hence, the gate electrode layer 633b is not short-circuited with the wiring layer 637b.

FIGS. 19A and 19B, FIGS. 20A and 20B and FIGS. 21A and 21B show the cases where the insulating layers are formed as the interlayer insulating layers over the wide areas of the substrates. Meanwhile, FIGS. 22A and 22B, FIGS. 23A and 23B, FIGS. 24A and 24B and FIGS. 25A and 25B will show examples where interlayer insulating layers interposing between wiring layers are selectively formed in required portions by using the droplet discharging method.

Figure 22A:
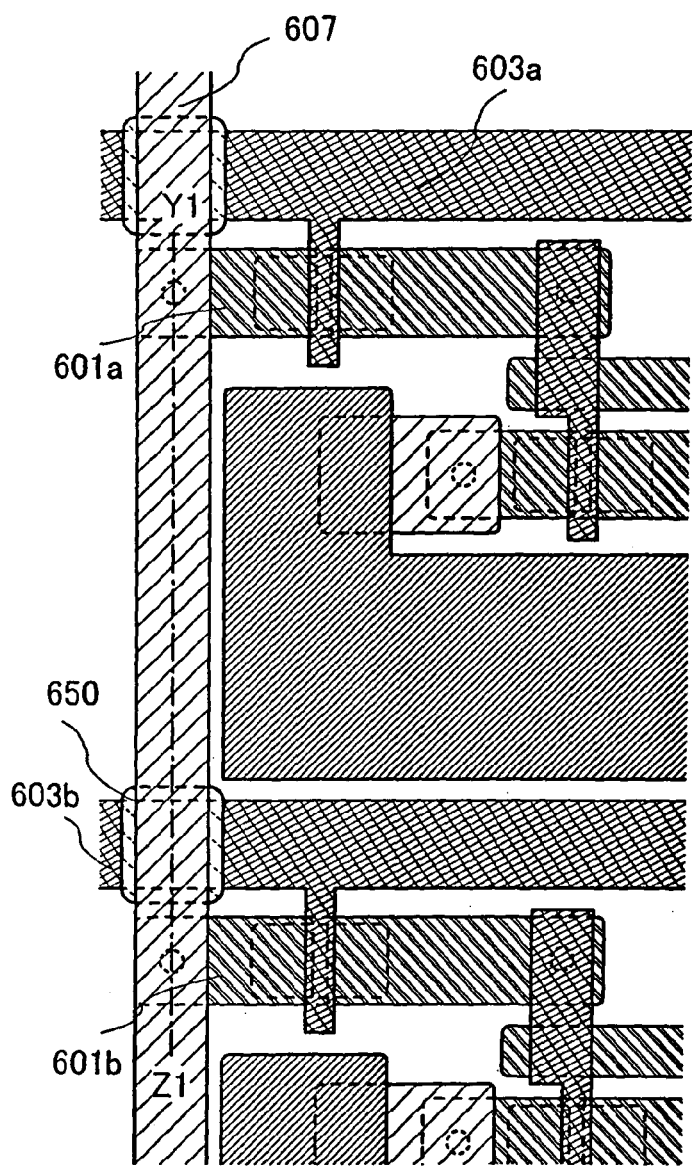
FIG. 22A is a top view and FIG. 22B is a cross sectional view explaining a method for manufacturing a display device according to the present invention.
Figure 22B:
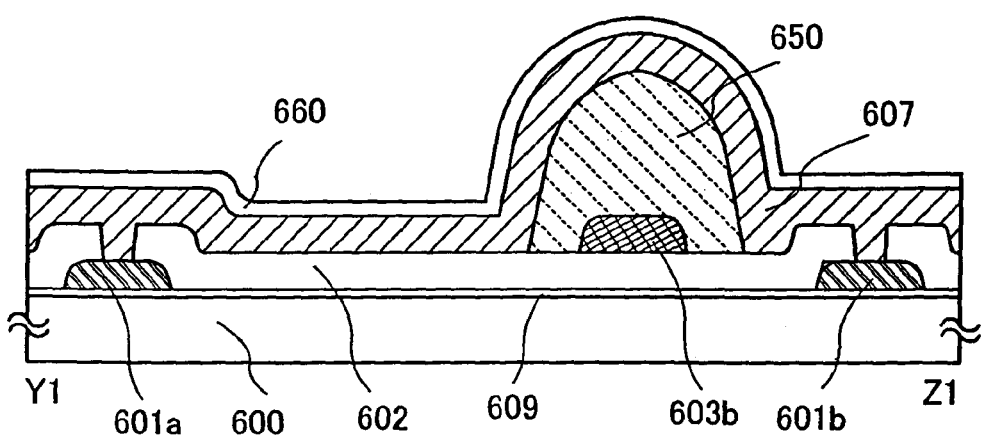
Figure 23A:
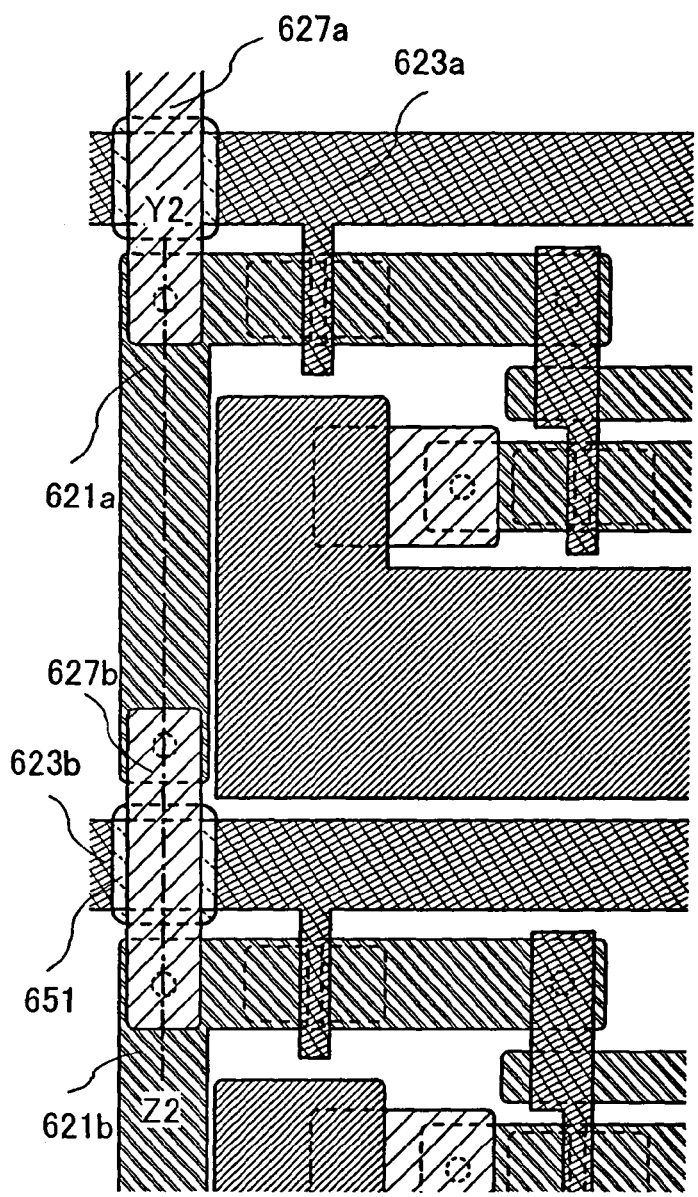
FIG. 23A is a top view and FIG. 23B is a cross sectional view explaining a method for manufacturing a display device according to the present invention.
Figure 23B:
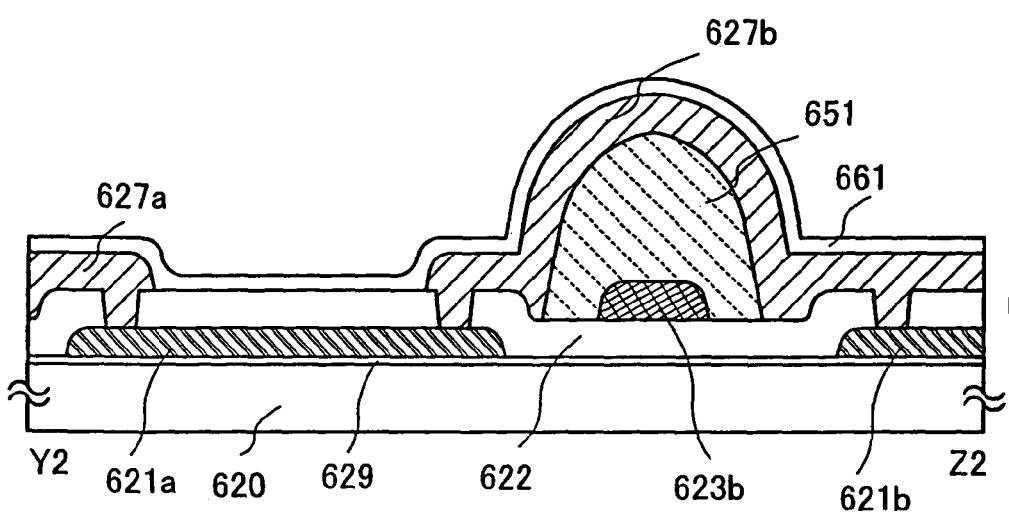
Figure 24A:
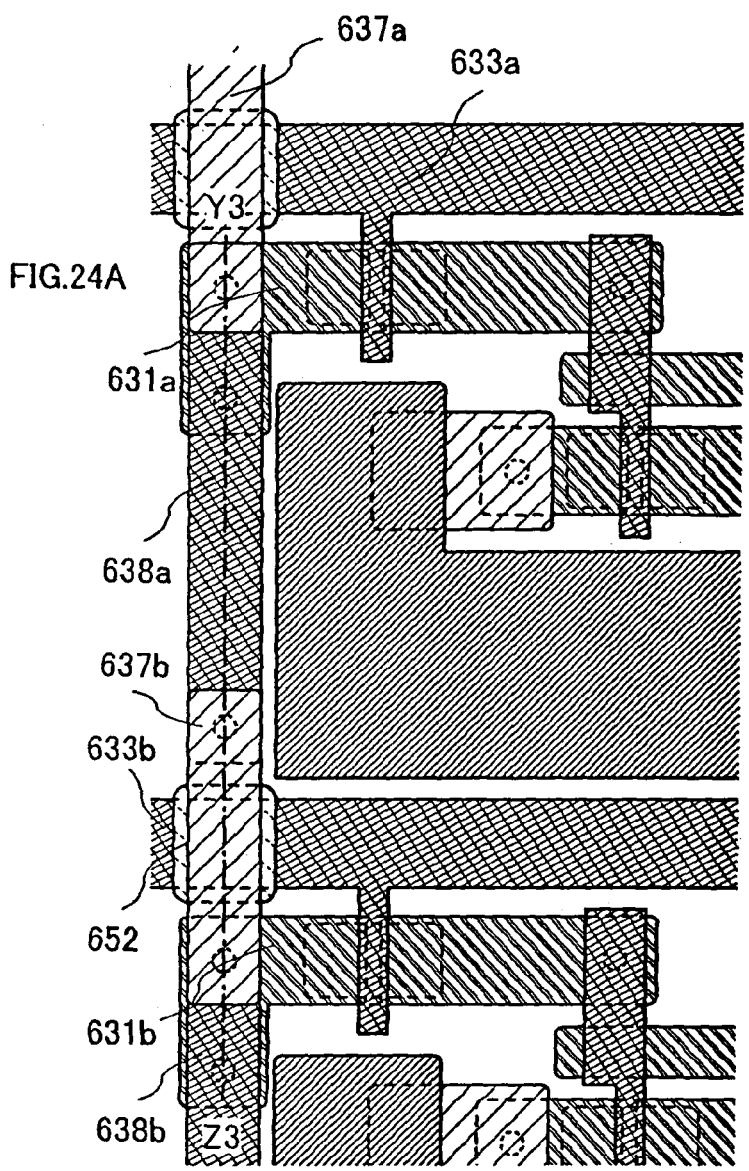
FIG. 24A is a top view and FIG. 24B is a cross sectional view explaining a method for manufacturing a display device according to the present invention.
Figure 24B:
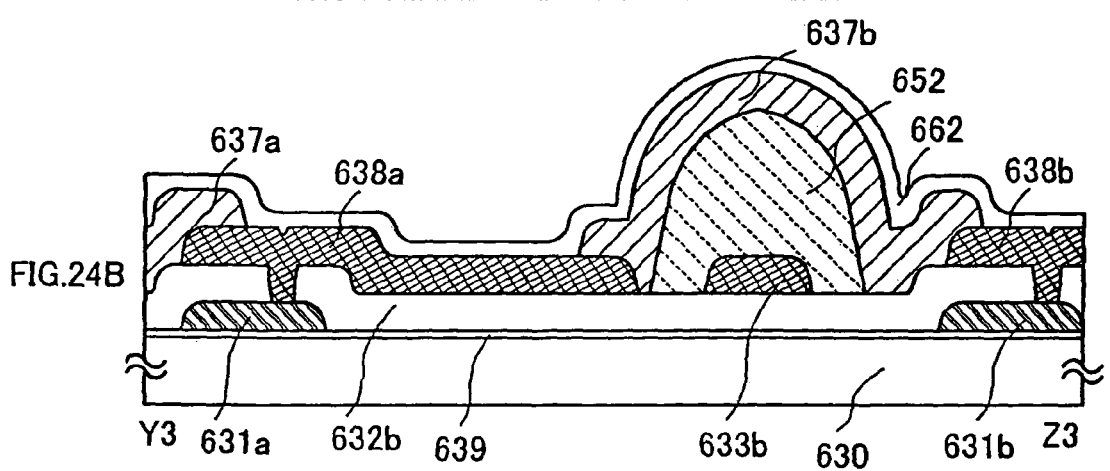

A display device as shown in FIGS. 22A and 22B corresponds to the display device as shown in FIGS. 19A and 19B, a display device as shown in FIGS. 23A and 23B corresponds to the display device as shown in FIGS. 20A and 20B and a display device as shown in FIGS. 24A and 24B corresponds to the display device as shown in FIGS. 21A and 21B, respectively, with the exception of the structures of the interlayer insulating layers. FIG. 22A is a top view of the display device while FIG. 22B is a cross sectional views taken along a line Y1-Z1 of FIG. 22A. In FIG. 22B, an interlayer insulating layer 650 is selectively formed by the droplet discharging method to cover the gate electrode layer 603b. The wiring layer 607 is formed on the insulating layer 650 to cover the insulating layer. An insulating film 660 is formed as a passivation film on the wiring layer 607. Although the insulating film 660 is not necessary to be formed, formation of the insulating film 660 makes it possible to increase the reliability of the display device. In this embodiment mode, the insulating layer 650 is formed using a single insulating layer. Alternatively, the insulating layer 650 may be formed to have a lamination structure in which another insulating film is formed on or under the insulating layer.

FIG. 23A is a top view of the display device while FIG. 23B is a cross sectional views taken along a line Y2-Z2 of FIG. 23A. In FIG. 23B, an insulating layer 651 is selectively formed by the droplet discharging method so as to cover the gate electrode layer 623b, as well as FIG. 20B. The wiring layer 627b is formed on the insulating layer 651 to cover the insulating layer. Since the wiring layer 627b is connected to the source or drain electrode layers 621a and 621b through contact holes, respectively, the source or drain electrode layers 621a and 621b are electrically connected to each other by the wiring layer 627b. An insulating film 661 is formed as a passivation film on the wiring layer 627b.

FIG. 24A is a top view of the display device while FIG. 24B is a cross sectional view taken along a line Y3-Z3 of FIG. 24A. An insulating layer 652 is selectively formed by the droplet discharging method to cover the gate electrode layer 633b, as well as FIG. 21B. The wiring layer 637b is formed on the insulating layer 652 to cover the insulating layer, and is connected to the wiring layers 638a and 638b. The wiring layer 638a is connected to the source or drain electrode layers 631a while the wiring layer 638b is connected to the source or drain electrode layer 631b through the contact holes, respectively. Accordingly, the source or drain electrode layers 631a and 631b are electrically connected to each other.

When an insulating layer for preventing the short-circuiting between wiring layers is selectively formed by the droplet discharging method like the insulating layers 650, 651 and 652, the loss of materials can be suppressed. In addition, the wiring layers can be formed to be in contact with each other directly, and hence, a step of forming a contact hole in the insulating layer can be eliminated, simplifying the process along with reducing the cost, and obtaining high productivity.

Figures 25A, 25B:
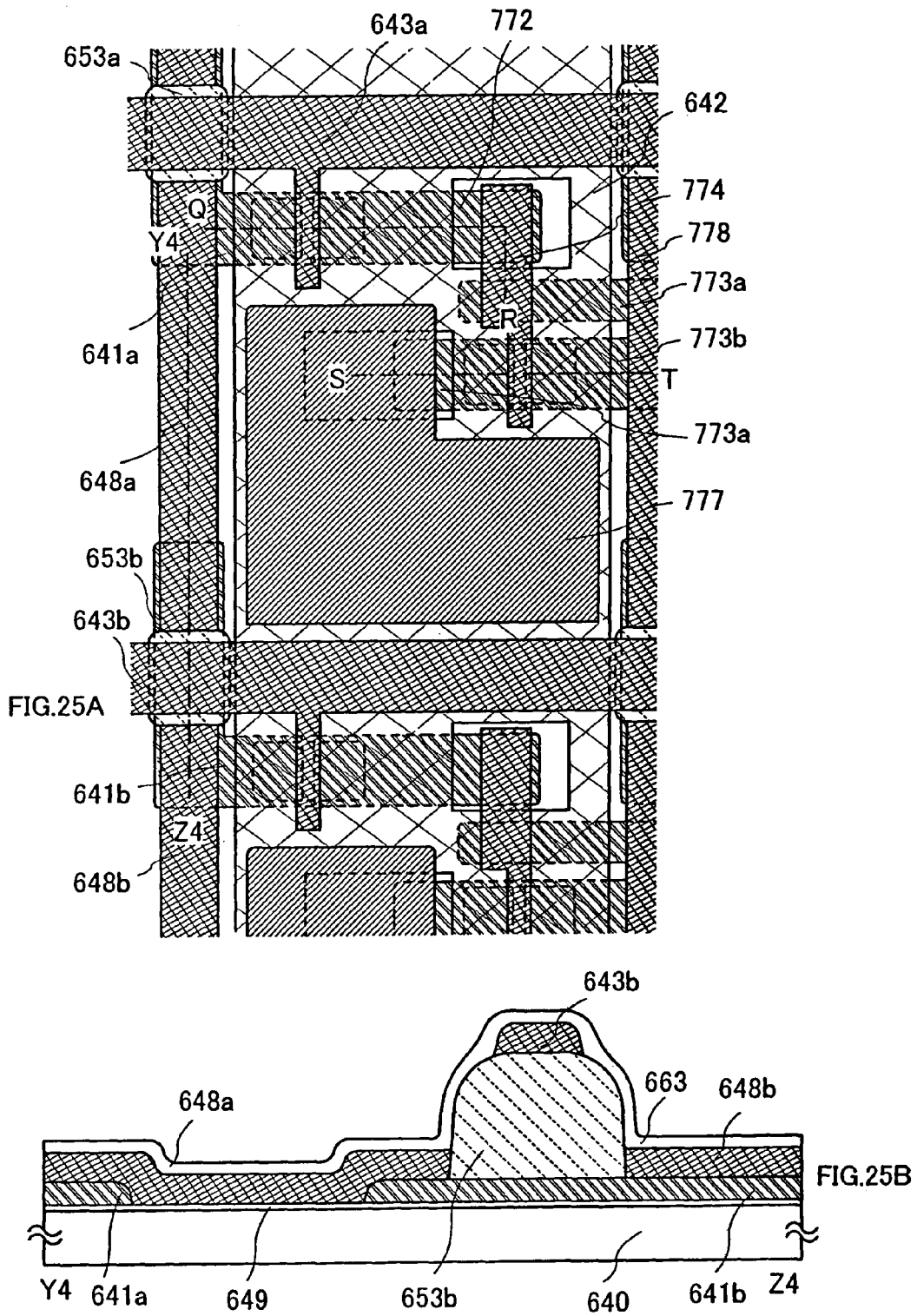
FIG. 25A is a top view and FIG. 25B is a cross sectional view explaining a method for manufacturing a display device according to the present invention.

FIGS. 25A and 25B show an example of a display device in which insulating layers 653a and 653b are selectively formed by the droplet discharging method so as to physically isolate gate electrode layers 643a and 643b from wiring layers 648a and 648b. In the display devices as shown in FIGS. 22A and 22B, FIGS. 23A and 23B and FIGS. 24A and 24B, the short-circuiting between the gate electrode layers and the wiring layers is prevented by forming the wiring layers on the insulating layers so as to cover the insulating layers. In the display device as shown in FIGS. 25A and 25B, source or drain electrode layers 641a and 641b are formed across a region whereon gate wiring layers will be formed later and over a region whereon the wiring layer 648b will be formed. In this embodiment mode, the source or drain electrode layers 641a and 641b are formed in the large areas across the regions whereon the gate electrode layers 643a and 643b will be formed and the regions whereon the wiring layers 648a and 648b will be formed. Alternatively, wiring layers may be formed across the regions whereon the gate electrode layers 643a and 643b will be formed, in addition to the source or drain electrode layers 641a and 641b.

Thereafter, prior to forming the gate electrode layers 643a and 643b, the gate insulating layer 642 covering the source or drain electrode layers is partly removed by etching. As shown in a top view of the display device of FIG. 25A, the gate insulating layer 642 is placed over semiconductor layers 770, 775 and a part of a source or drain electrode layer 773a where will be a region forming a capacitor element. However, the gate insulating layer 642 formed in the regions, on which the wiring layers 648a and 648b will be formed, the regions, on which the source or drain electrode layer 772 will be connected to the gate electrode layer 774, and the region, on which the source or drain electrode layer 773a will be connected to the first electrode layer 777 functioning as a pixel electrode layer, is removed therefrom. Therefore, the electrode layers can be directly connected to one another without forming contact holes. The insulating layers 653a and 653b are selectively formed by the droplet discharging method in the region on which the gate electrode layers 643a and 643b will be formed on the source or drain electrode layers 641a and 641b. The gate electrode layer 643a and 643b are formed on the insulating layers 653a and 653b. The wiring layers 648a and 648b are formed to be contacted to the source or drain electrode layers 641a and 641b respectively through the same process of forming the gate electrode layers 643a and 643b. Since the source or drain electrode layer 641a is continuously formed to pass under the insulating layer 653b, the wiring layer 648a can be electrically connected to the wiring layer 648b. Consequently, the wiring layers and the source or drain electrode layers can be electrically connected to one another underneath the insulating layer 653b.

Figure 26A:
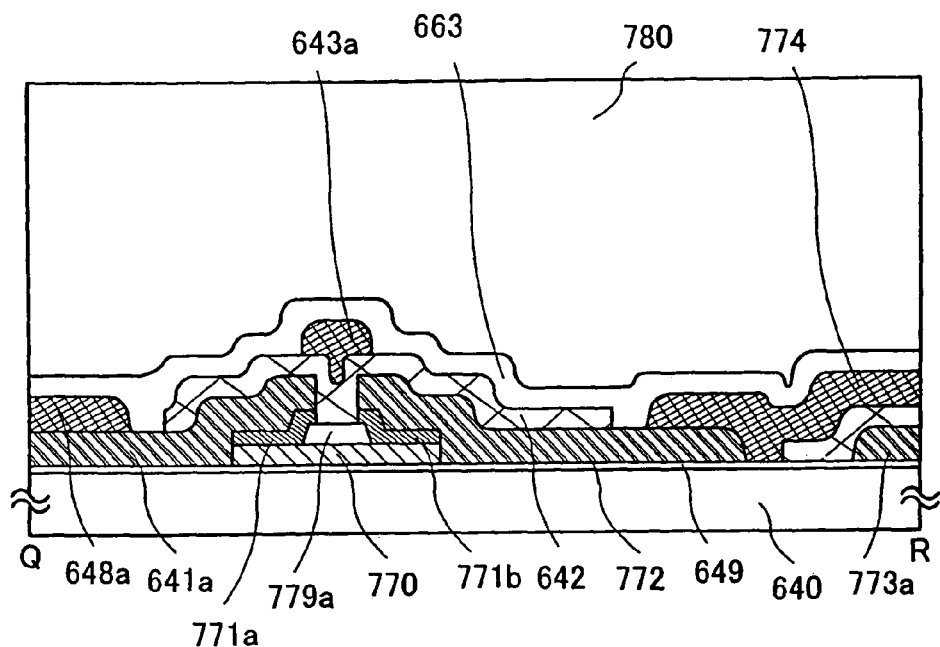
FIGS. 26A and 26B are cross sectional views explaining a method for manufacturing a display device according to the present invention.
Figure 26B:
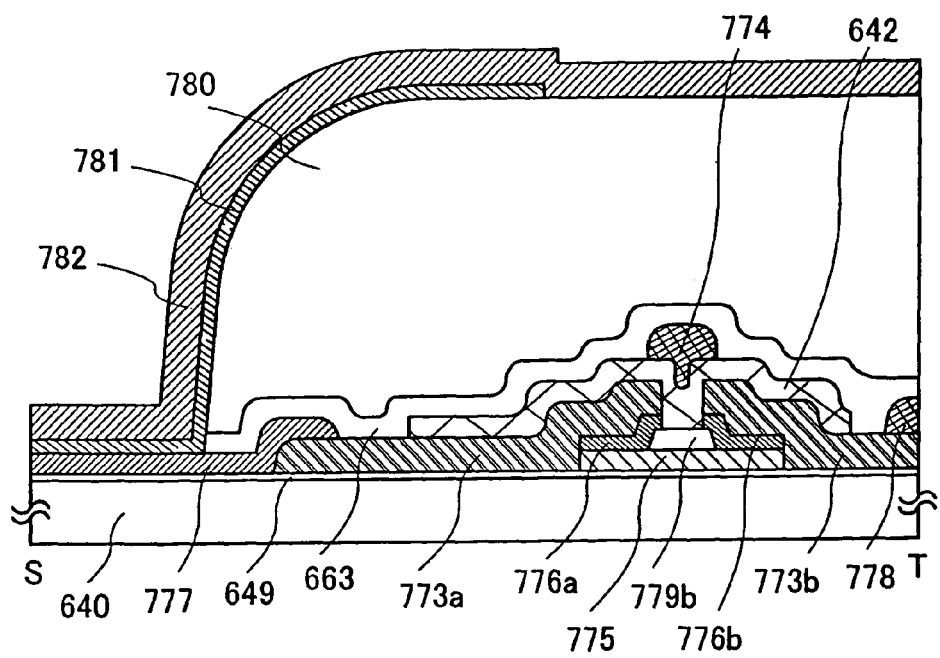

A cross sectional view of a display device taken along a line Q-R of FIG. 25 is shown in FIG. 26A while another cross sectional view thereof taken along a line S-T is shown in FIG. 26B. As shown in FIGS. 25A and 25B, the display device of FIGS. 25A and 25B has a structure in which the gate insulating layer is selectively removed and a contact hole is not formed within a pixel. Therefore, the electrodes are connected to each other without interposing an interlayer insulating layer therebetween. The display device of FIGA. 25A and 25B shows an example of a light emitting display device using a light emitting element as a display element.

In FIG. 26A, an insulating layer 649, a semiconductor layer 770, a channel protection layer 779a, a semiconductor layer 771a having one conductivity type, a semiconductor layer 771b having one conductivity type, and a source or drain electrode layer 773a are formed over a substrate 640. A source or drain electrode layer 641a and a source or drain electrode layer 772 are formed on the semiconductor layers 771a and 771b having one conductivity type. A gate insulating layer 642 is formed only to cover the semiconductor layer 770 and the source or drain electrode layer 773a whereas a part of the gate insulating layer 642 formed on the source or drain electrode layers 641a and 772 is removed. A wiring layer 648a is formed in contact with the source or drain electrode layer 641a where is exposed and not covered with the gate insulating layer 642 so that the wiring layer 648a and the source or drain electrode layer 641a are electrically connected to each other. A gate electrode layer 774 is formed on the source or drain electrode layer 772 where is exposed and not covered with the gate insulating layer 642 so that the gate electrode layer 774 is electrically connected to the source or drain electrode layer 772. A gate electrode layer 643a is formed on the gate insulating layer 642, which is formed to cover the semiconductor layer 770, and an insulating film 663 and an insulating layer 780 serving as a partition wall are sequentially laminated thereon.

Similarly, in FIG. 26B, an insulating layer 649, a first electrode layer 777, a semiconductor layer 775, a channel protection layer 779b, semiconductor layers 776a and 776b having one conductivity are formed over a substrate 640. Source or drain electrode layers 773a, 773b and a gate insulating layer 642 are formed over the semiconductor layers 776a and 776b having one conductivity. A gate electrode layer 774 is formed on the gate insulating layer 642, and an insulating layer 663 and an insulating layer 780 functioning as a partition wall are sequentially laminated thereover. The gate insulating layer 642 is selectively formed and a part of the gate insulating layer formed over the source or drain electrode layers 773a and 773b is removed. A power supply line 778 is formed on the source or drain electrode layer 773b, which is exposed and not covered with the gate insulating layer 642 so that the power supply line and the source or drain electrode layer are electrically connected to each other The first electrode layer 777 is formed in contact with the source or drain electrode layer 773a, which is exposed and not covered with the gate insulating layer 642 so that the first electrode and the source or drain electrode layer are electrically connected to each other. An electroluminescent layer 781 and an electrode layer 782 are sequentially laminated over the first electrode layer 777, thereby achieving a display device that comprises a light emitting element.

As shown in the above process, a highly reliable display device can be manufactured at low cost with good productivity.

The present embodiment mode can be implemented in combination with Embodiment Modes 1 through 9.

Embodiment Mode 11

The present embodiment mode will be described with reference to FIGS. 48A and 48B. This embodiment mode shows examples of display devices having different structures of interlayer insulating layers from the structure of the interlayer insulating layer of the display device according to Embodiment Mode 1. Further, same portions and portions having same functions as those of Embodiment Mode 1 will not be further explained here.

Figure 48A:
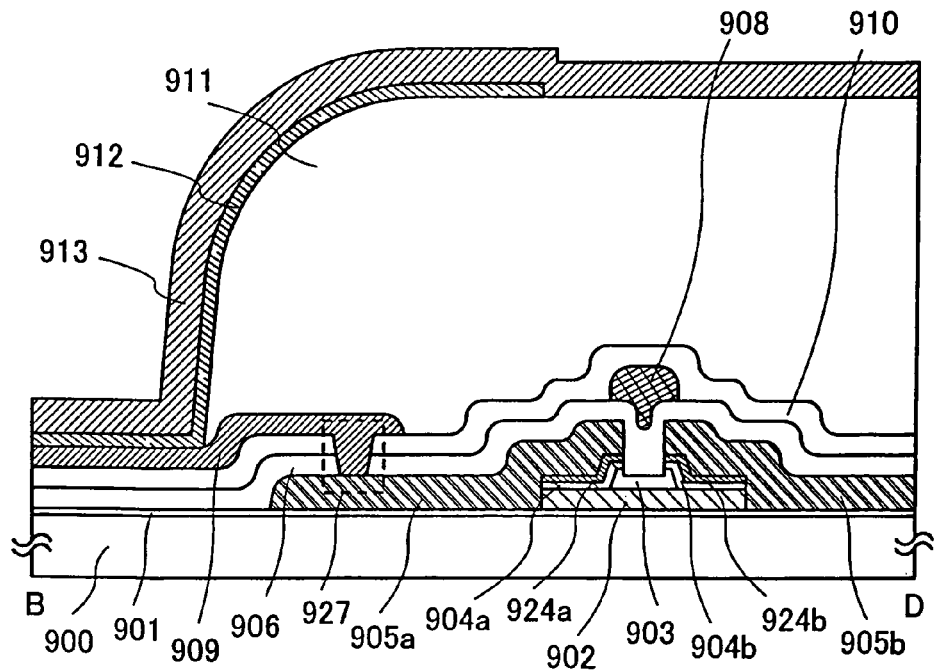
FIGS. 48A and 48B are cross sectional views showing a display device according to the invention.
Figure 48B:
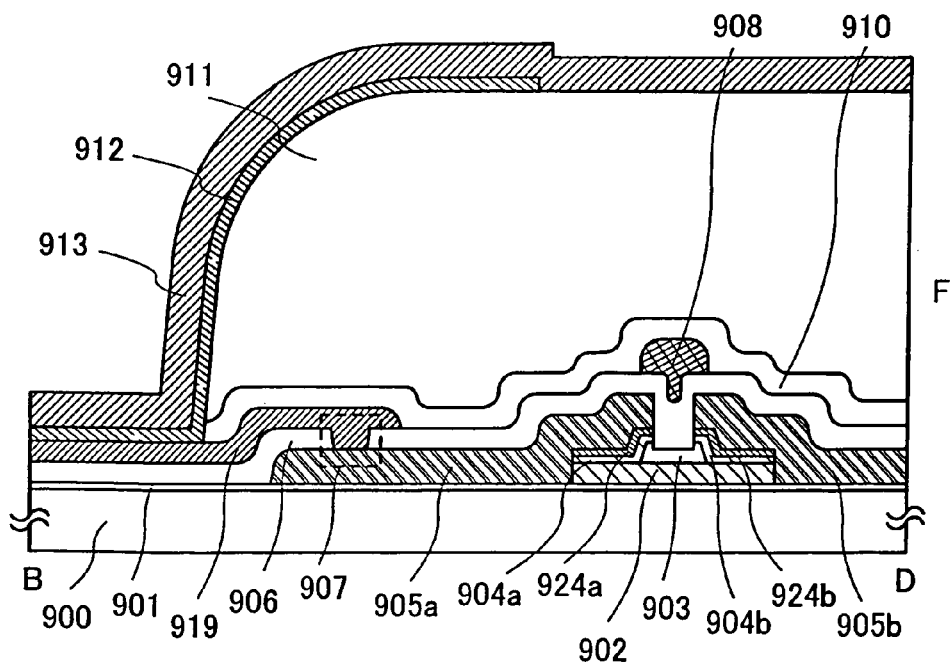

FIGS. 48A and 48B correspond to cross sectional views taken along a line B-D of the top view of FIG. 5A used in Embodiment Mode 1. In Embodiment Mode 1, the insulating layer 129 is formed as the interlayer insulating layer for planarizing the unevenness formed on the surface of the thin film transistors, and the first electrode layer 130 is formed on the insulating layer 129. In this embodiment mode, however, the first electrode layer is formed on the gate insulating layer or on the insulating film, which is a passivation film, without forming the insulating layer 129. Therefore, source or drain electrode layers and a first electrode layer are directly and electrically connected to one another in this embodiment mode, though they are connected to one another through the wiring layer in Embodiment Mode 1.

Display devices as shown in FIGS. 48A and 48B are light emitting display devices comprising light emitting elements as their display elements according to the present invention. In the display device of FIG. 48A, an insulating layer 901, a first electrode layer 909, a semiconductor layer 902, a channel protection layer 903, semiconductor layers 904a and 904b having one conductivity, and semiconductor layers 924a and 924b having one conductivity are formed over a substrate 900. Source or drain electrode layers 905a and 905b and a gate insulating layer 906 are formed over the semiconductor layers 924a and 924b having one conductivity.

A gate electrode layer 908 is formed on the gate insulating layer 906. An insulating film 910 and an insulating layer 911 functioning as a partition wall are laminated thereover. An opening 927 that reaches the source or drain electrode layer 905a is formed in the gate insulating layer 906 and the insulating film 910. A first electrode layer 909 is formed in the opening 927 so as to be in contact with the source or drain electrode layer 905a. An electroluminescent layer 912 and a second electrode layer 913 are laminated over the first electrode layer 909. Accordingly, the first electrode layer 909 can be formed on the insulating film 910 covering a thin film transistor.

In the display device of FIG. 48B, an insulating layer 901, a first electrode 919, a semiconductor layer 902, a channel protection layer 903, semiconductor layers 904a and 904b having one conductivity, and semiconductor layers 924a and 924b having one conductivity are formed over a substrate 900. Source or drain electrode layers 905a and 905b, and a gate insulating layer 906 are formed over the semiconductor layers 924a and 924b having one conductivity.

A gate electrode layer 908 is formed on the gate insulating layer 906. An insulating film 910 and an insulating layer 911 functioning as a partition wall are laminated thereover. The display device as shown in FIG. 48B shows an example in which the first electrode layer 919 is formed on the gate insulating layer 906. An opening 907 that reaches the source or drain electrode layer 905a is formed in the gate insulating layer 906. The first electrode layer 919 is formed in the opening 907 so as to be in contact with the source or drain electrode layer 905a. An electroluminescent layer 912 and a second electrode layer 913 are laminated over the first electrode layer 919. A part of the first electrode layer 919 is covered with the insulating film 910. Thus, the first electrode layer 909 can be formed on the gate insulating layer 906.

Interlayer insulating layers are not required in the display devices having the structures according to this embodiment mode, and hence, this structures have advantages of simplifying the process, reducing the cost due to reduction in materials.

Embodiment Mode 12

Modes of mounting driver circuits over display devices manufactured according to Embodiment Modes 1 through 11 will be described below.

A display device employing the COG technology will first be described with reference to FIG. 34A. A pixel portion 2701 for displaying information such as a character or an image is provided over a substrate 2700. A substrate over which a plurality of driver circuits are provided is divided into rectangular shapes. The divided driver circuits (also denoted by driver ICs) 2751 are mounted over the substrate 2700. FIG. 34A shows a case where FPCs 2750 are mounted over the ends of the plural driver ICs 2751. Alternatively, the divided size of a single driver IC may be set to be similar to the length of a signal line side of the pixel portion, and a tape may be attached to the end of the single driver IC.

Meanwhile, the TAB technology may be employed. In the case of employing the TAB technology, a plurality of tapes may be pasted to the substrate and the driver ICs may be attached to the tapes as shown in FIG. 34B. In the same manner as the case of using the COG technology, a single driver IC may be attached to a single tape. In this case, a metal piece or the like for fixing the driver IC may also be attached to the tape to increase the strength.

In order to increase the productivity, a plurality of driver ICs, which will be mounted over a display panel, are preferably formed over a rectangular substrate having 300 to 1,000 mm or more on a side.

That is, a plurality of circuit patterns each including a driver circuit portion and an input/output terminal as a unit may be formed over a substrate and then be divided from one another. In consideration of the length of one side of the pixel portion or a pixel pitch, rectangular driver ICs each having a long side of 15 to 80 mm and a short side of 1 to 6 mm may be formed. Alternatively, driver ICs in that the length of each one side corresponds to a sum of one side of a pixel region or a pixel portion and one side of each driver circuit may be formed.

The advantage of an outside dimension of the driver ICs with respect to IC chips is a length of a long side. When using driver ICs each having a long side of 15 to 80 mm, the number of the driver ICs required for attaching them to a pixel portion can be reduced as compared with the case of using IC chips, thereby increasing the manufacturing yield. Also, when the driver ICs are formed over a glass substrate, the shape of a mother substrate is not limited, and hence, the productivity is not impaired. This is very advantageous point as compared with the case of forming IC chips that are formed using a circular silicon wafer When a scanning line driver circuit 3704 is formed over a substrate 3700 as shown in FIG. 33B, driver ICs, over which signal line driver circuits are formed, are mounted in a region outside of a pixel region 3701. These driver ICs are signal line driver circuits. In order to form a pixel region corresponding to RGB full color, 3,027 signal lines are required in a XGA class whereas 4,800 signal lines are required in an UXGA class. Such signal lines are separated into several blocks at the end of the pixel portion 3701 to form leading lines. The leading lines are gathered in accordance with a pitch of an output terminal of each driver IC.

The driver ICs are preferably formed by using a crystalline semiconductor formed over a substrate, and a thin film transistor manufactured according to the present invention can be used. Since the thin film transistor manufactured according to the present invention has high mobility and excellent response speed, an driver IC formed using this thin film transistor can be driven at high speed, and the operating frequency of an element can be improved as compared with a conventional thin film transistor. Accordingly, high reliability can be obtained because of less variation in characteristics.

In a pixel region, signal lines and scanning lines intersect with one another in a matrix form and transistors are placed in each intersection. Thin film transistors manufactured according to the present invention can be applied to the transistors arranged in the pixel region. The thin film transistors manufactured according to the present invention have relatively high mobility through the simplified process, and therefore, they are efficient in manufacturing a large area display device. Accordingly, the thin film transistors can be used as switching elements of the pixels, elements of a scanning line driver circuit or the like. Consequently, a display panel in which a system-on-panel is realized can be manufactured.

the drive ICs may be mounted over a substrate as both a scanning line driver circuit and a signal line driver circuit as shown in FIGS. 34A and 34B. In this case, the designs of the driver ICs used in the scanning line and the signal line may be differed.

In this case, the design of the driver IC used as the scanning line driver circuit is preferably differed from the design of the driver IC uses as the signal line driver circuit. For example, although the withstand pressure of approximately 30 V is required for a transistor constituting a scanning line driver IC, a driving frequency of 100 kHz or less is also required, and therefore, high-speed operation is not relatively required. Accordingly, it is preferable that the channel length (L) of the transistor constituting the scanning line driver IC be set to be sufficiently long. On the other hand, although the transistor of the signal line driver IC requires the withstand pressure of only about 12 V, it requires a driving frequency of about 65 MHz at 3V, and therefore, high-speed operation is required. Accordingly, the channel length of a transistor constituting a driver is preferably set to be in micrometer unit. Further, the channel length direction corresponds to a direction of flowing current in a channel formation region, or, a direction of moving electric charge.

The method for mounting driver ICs is not particularly limited, and the known COG technology, wire bonding technology, or TAB technology can be used.

By adjusting the thickness of a driver IC to the thickness of a counter substrate, the height of the driver IC is approximately equal to that of the counter substrate, thereby contributing to the reduction in thickness of a display device as a whole. Also, by forming respective substrates using a same material, heat stress is not generated even when a temperature of the display device is changed and the characteristics of a circuit manufactured using a TFT are not impaired. Additionally, by forming driver circuits using driver ICs with a longer side than that of IC chips as shown in this embodiment mode, the number of the driver ICs mounted over one pixel portion can be reduced.

As mentioned above, the driver circuits can be incorporated into a display panel. The present embodiment mode can be implemented in combination with Embodiment Modes 1 through 11.

Embodiment Mode 13

In this embodiment mode, a positional relation of edges of a gate electrode layer, a source electrode layer and a drain electrode layer, i.e., a relation of the width of the gate electrode layer and a channel length will be described with reference to FIGS. 41A to 41C.

Figure 41A:
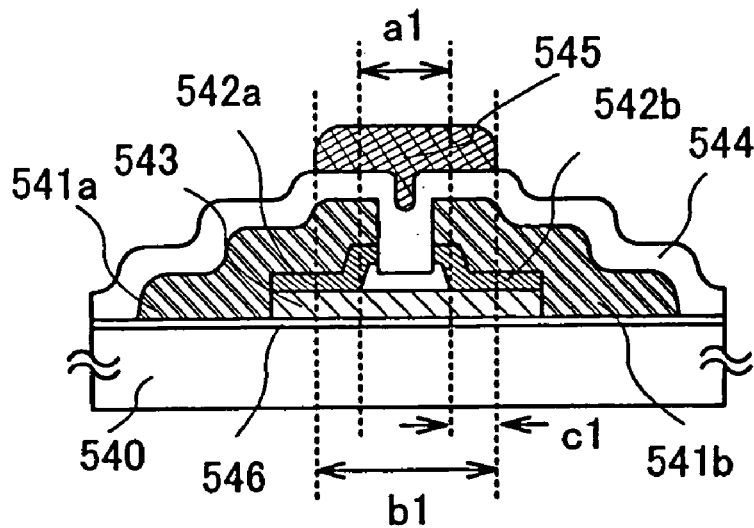
FIGS. 41A to 41C are cross sectional views explaining thin transistors according to the invention.

FIG. 41A is a top-gate type thin film transistor with a planar structure comprising an insulating layer 546, a semiconductor layer 543, semiconductor layers 542*a* and 542*b* having one conductivity type, source or drain electrode layers 541*a* and 541*b*, a gate insulating layer 544 and a gate electrode layer 545 that are formed over a substrate 540.

In FIG. 41A, both edges of the gate electrode layer 545 and the source or drain electrode layers 541*a* and 541*b* are overlapped a length of "c1", respectively. Here, in the semiconductor layer 543, the regions where the source or drain electrode layers are overlapped with the gate electrode layer are referred to as overlapping regions. The width "b1" of the gate electrode layer is larger than a channel length "a1". The width "c1" of each of the overlapping regions is expressed by (b1−a1)/2. An n-channel TFT having such the overlapping regions preferably comprises an n-type high concentration impurity region (n⁺ region) and an n-type low concentration impurity region (n⁻ region) between the source or drain electrode layers and a semiconductor region. This structure allows to increase an effect of electric field relaxation, making it possible to improve the hot carrier resistance.

Figure 41B:
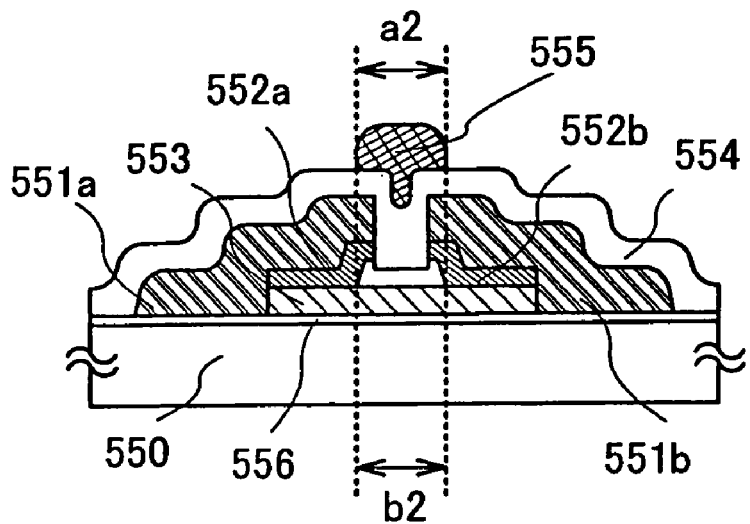

FIG. 41B is a top-gate type thin film transistor with a planar structure, comprising an insulating layer 556, a semiconductor layer 553, semiconductor layers 552a and 552b having one conductivity type, source or drain electrode layers 551a and 551b, a gate insulating layer 554 and a gate electrode layer 555 that are formed over a substrate 550.

In FIG. 41B, the both edges of the gate electrode layer 555 correspond to the edges of the source or drain electrode layers 551a and 551b. That is the width "b2" of the gate electrode layer and a channel length "a2" are equal to each other.

Figure 41C:
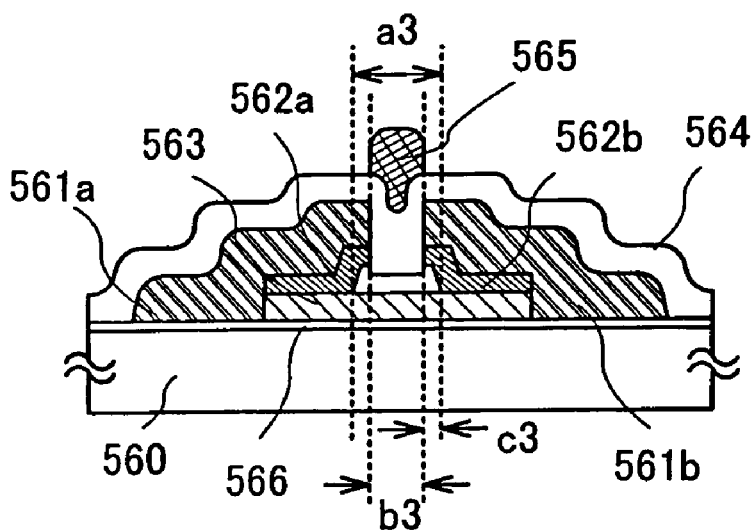

FIG. 41C is a top-gate type thin film transistor with a planar structure, comprising an insulating layer 566, a semiconductor layer 563, source or drain electrode layers 561a and 561b, a gate insulating layer 564, and a gate electrode layer 565 that are formed over a substrate 560.

In FIG. 41C, the both edges of the gate electrode layer 565 are kept away from the edges of the source or drain electrode layers 561a and 561b for a length of "c3". Here, in the semiconductor layer 563, the regions, where the gate electrode layer 565 and the source or drain electrode layers 561a and 561b are not overlapped with one another and kept away from one another, are referred to as offset regions. That is, the width "b3" of the gate electrode layer is smaller than a channel length "a3". The width "c3" of the offset region is-expressed by (a3−b3)/2. The TFT having such structure can reduce the off current. When this TFT is used as a switching element of a display device, the contrast can be improved.

Further, a so-called multi-gate type TFT where a semiconductor layer covers a plurality of gate electrode layers may be employed. This TFT also allows the off current to be reduced. By using the mask processing technique using laser light according to the present invention, a mask that is subjected to microscopic processing can be formed. Therefore, a wiring pattern such as an electrode layer can be formed to have a microscopic, accurate shape by utilizing such a mask. By performing microscopic processing of an electrode layer, a thin film transistor having a required function as shown in this embodiment mode can be formed with excellent yield and good productivity. Consequently, a display device having the thin film transistor can be formed to have high reliability along with excellent performance.

The present embodiment mode can be implemented in combination with Embodiment Modes 1 through 12.

Embodiment Mode 14

In this embodiment mode, a step of crystallizing a semiconductor film that is applicable to the above-described embodiment mode will be described with reference to FIGS. 38A and 38B and FIGS. 39A to 39D.

Figure 38A:
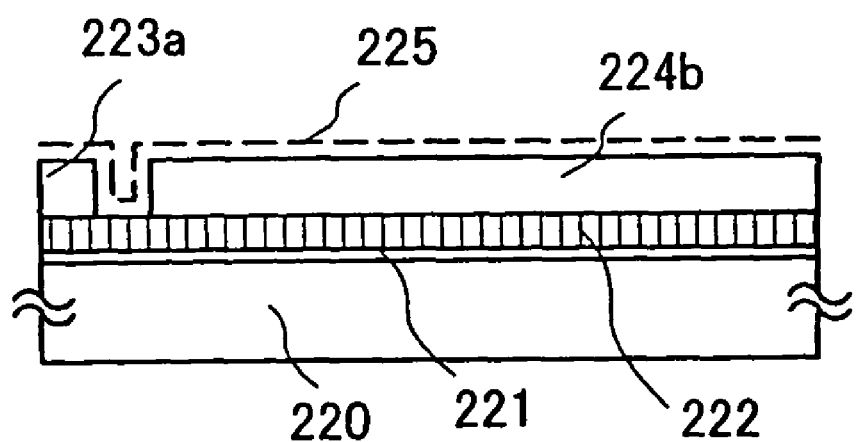
FIGS. 38A and 38B are cross sectional views explaining a method for manufacturing a display device according to the invention.
Figure 38B:
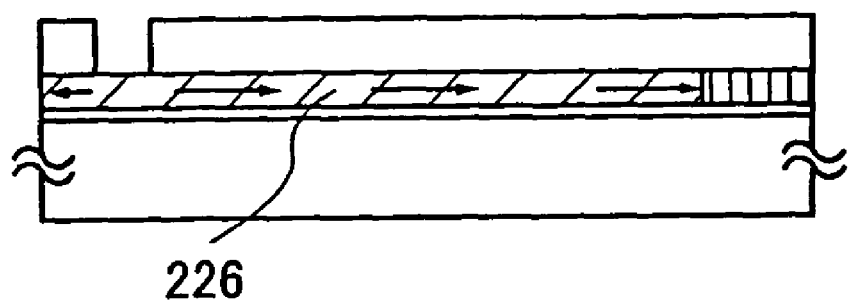

In FIG. 38A and 38B, an insulating layer 221 that serve as a base film is formed over a substrate 220, and an amorphous semiconductor film 222 is formed thereon. Masks 224a and 224b are formed using insulating films on the amorphous semiconductor film 222. A metal film 225 is selectively formed over the substrate 220 to crystallize the amorphous semiconductor film. Concretely, when heating the amorphous semiconductor film 222, crystal grows in a direction parallel to the surface of the substrate as denoted by arrows in FIG. 38B from a contact portion between the metal film 225 and the amorphous semiconductor film 222, thereby obtaining a crystalline semiconductor film 226. Further, the crystallization is not caused in a portion far away from the metal film 225 so that an amorphous portion remains over the substrate.

Figure 39A:
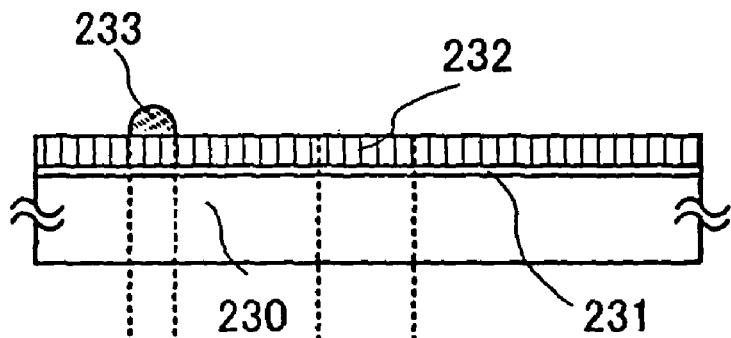
FIGS. 39A and 39C are cross sectional views and FIGS. 39B and 39D are top views explaining methods for manufacturing display devices according to the invention.
Figure 39B:
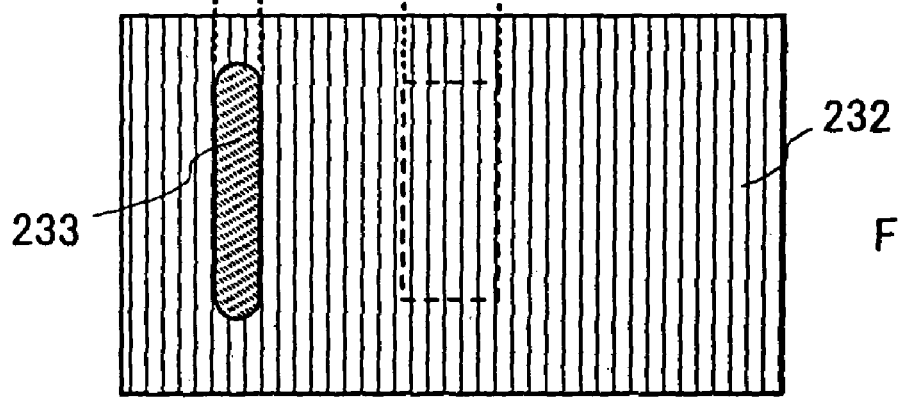

Furthermore, as shown in FIG. 39A, a metal film 233 may be selectively formed by the droplet discharging method without using masks to carry out the above-described crystallization. FIG. 39B is a top view of FIG. 39A. FIG. 39D is a top view of FIG. 39C.

Figure 39C:
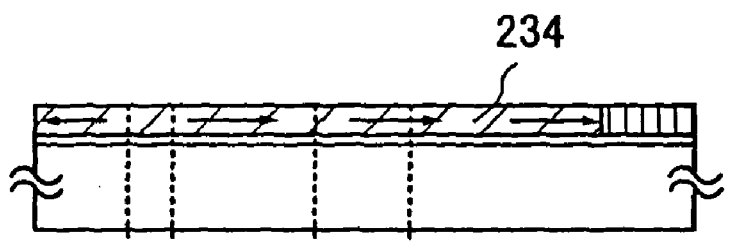
Figure 39D:
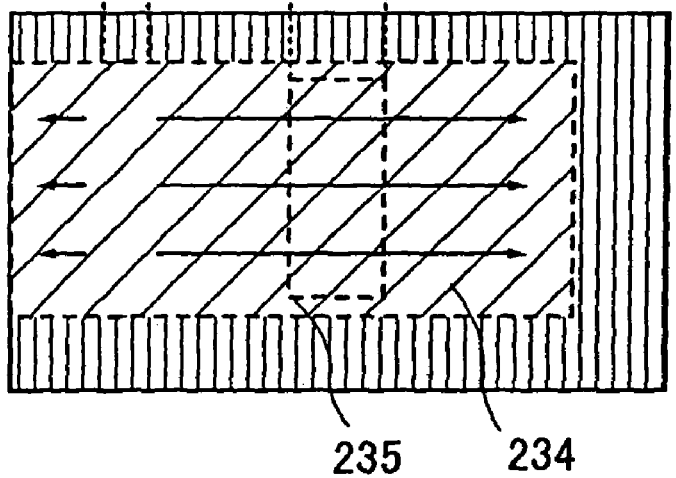

In FIGS. 39A to 39D, an insulating layer 231 that serve as a base film is formed over a substrate 230, and an amorphous semiconductor film 232 is formed thereon. The metal film 233 is selectively formed on the amorphous semiconductor film 232 by the droplet discharging method. When the amorphous semiconductor film 232 is crystallized by a heat treatment, crystal grows in a direction parallel to the surface of the substrate as shown in FIGS. 39A and 39C from a contact portion between the metal film 233 and the amorphous semiconductor film 232. Similarly, the crystallization is not caused in a portion far away from the metal film 233 so that an amorphous portion remains over the substrate.

The crystal growth in the direction parallel to the surface of the substrate is referred to as horizontal growth or lateral growth. Since a crystal grain having a large diameter can be formed by the horizontal growth, when this crystalline semiconductor film is used in a channel formation region 235, a thin film transistor having improved mobility can be formed.

The present embodiment mode can be implemented in combination with Embodiment Modes 1 through 13.

Embodiment Mode 15

An example of a protection circuit equipped in a display device according to the present invention will be described.

As shown in FIG. 34B, a protection circuit 2713 can be formed between an external circuit and an internal circuit. The protection circuit includes one or more elements selected from a TFT, a diode, a resistive element, a capacitor element and the like. Hereinafter, configurations and operations of various protection circuits will be described. Configurations of equivalent circuits for protection circuits each of which is provided between an external circuit and an internal circuit and corresponds to one input terminal will be described. A protection circuit as shown in FIG. 27A comprises p-channel thin film transistors 7220 and 7230, capacitor elements 7210 and 7240, and a resistive element 7250. The resistive element 7250 has two terminals, wherein one terminal is applied with an input voltage Vin (hereinafter, referred to as Vin) and the other terminal is applied with a low potential voltage VSS (hereinafter, referred to as VSS).

FIG. 27B is an equivalent circuit diagram showing a protection circuit wherein diodes 7260 and 7270 having rectifying properties are used in place of the p-channel thin film transistors 7220 and 7230. FIG. 27C is an equivalent circuit diagram showing a protection circuit wherein TFTs 7350, 7360, 7370 and 7380 are used in place of the p-channel thin film transistors 7220 and 7230. As a protection circuit having a configuration that is different from the above mentioned configurations, FIG. 27D shows a protection circuit that comprises resistive elements 7280 and 7290 and an n-channel thin film transistor 7300. FIG. 27E shows a protection circuit comprising the resistive elements 7280 and 7290, a p-channel thin film transistor 7310 and an n-channel thin film transistor 7320. Providing the protection circuit makes it possible to prevent sudden fluctuation in potential to prevent destruction or damage of elements, thereby improving the reliability. Further, the elements constituting the above protection circuits are preferably formed using an amorphous semiconductor having excellent resistance to pressure. The present embodiment mode can be freely combined with the above described embodiments modes.

The present embodiment mode can be implemented by being freely combined with Embodiment Modes 1 through 14.

Embodiment Mode 16

A thin film transistor is formed according to the present invention and a display device can be formed using the thin film transistor. When a light emitting element is used and an n-channel thin film transistor is used as a transistor for driving the light emitting element, light generated in the light emitting element is emitted upward, downward, or both upward and downward, i.e., bottom emission, top emission or dual emission. Here lamination structures of light emitting elements corresponding to the respective cases will be described below with reference to FIGS. 46A to 46C.

Further, top-gate type thin film transistors 671, 681 and 691 with a planar structure that are formed according to the present invention are used in this embodiment mode. In this embodiment mode, a silicon film having a crystalline structure is used as a semiconductor layer and an n-type semiconductor layer is used as a semiconductor layer having one conductivity type. One conductivity type may be imparted to a semiconductor layer by performing a plasma processing using $PH_3$ gas, instead of forming an n-type semiconductor layer. The semiconductor layer is not limited to the present embodiment mode, and an impurity region having one conductivity type may be formed by introducing (adding) an impurity into a crystalline semiconductor layer without forming the semiconductor layer having one conductivity type.

Firstly, the case where light is emitted through a substrate 680, i.e., emitted downward (bottom emission), is described with reference to FIG. 46A In the case of the bottom emission, a first electrode 684, an electroluminescent layer 685 and a second electrode layer 686 are sequentially laminated to be in contact with a wiring layer 682 connecting to a source or drain electrode layer so as to be electrically connected to a thin film transistor 681. The substrate 680 that transmits light therethrough is necessary to have a light transmitting property. Next, the case where light is emitted to an opposite direction of a substrate 690, i.e., emitted upward (top emission), is described with reference to FIG. 46B. A thin film transistor 691 can be formed in the same manner as the above-mentioned thin film transistor.

A wiring layer 692 connecting to a source or drain electrode layer that is electrically connected to the thin film transistor 691 is in contact with a first electrode layer 693 to be electrically connected together. The first electrode layer 693, an electroluminescent layer 694 and a second electrode layer 695 are sequentially laminated Over the substrate. The wiring layer 692 is a metal layer having reflexivity and reflects light, which is emitted from a light emitting element, upward as denoted by an arrow. The wiring layer 692 and the first electrode layer 693 are laminated together, and therefore, when the first electrode layer 693 is formed using a material with a light transmitting property and transmits light therethrough, the light is reflected by the first electrode layer 693 and then is emitted to the opposite direction of the substrate 690. Of course, the first electrode layer may be formed using a metal film having reflexivity. Since light generated in the light emitting element is emitted through the second electrode layer 695, the second electrode layer 695 is formed using a material having a light transmitting property with respect to at least a visible area. Lastly, the case where light is emitted through both the substrate 670 and an opposite side, i.e., emitted both upward and downward (dual emission), is described with reference to FIG. 46C. A thin film transistor 671 is also a top-gate type thin film transistor with a planar structure and can be formed in the same manner as the thin film transistor 681. A wiring layer 675 connecting to a source or drain electrode layer that is electrically connected to a semiconductor layer of the thin film transistor 671 is electrically connected to a first electrode layer 672. The first electrode layer 672, an electroluminescent layer 673 and a second electrode layer 674 are sequentially laminated over the substrate. When the first electrode layer 672 and the second electrode layer 674 are both formed using a material having a light transmitting property with respect to a visible area or are both formed to have thicknesses that can transmit light, the dual emission is realized. In this case, an insulating layer which transmits light and the substrate 670 are also formed to have light transmitting properties.

Structures of light emitting elements that can be applied to the present invention are shown in FIGS. 45A to 45D. Each light emitting element has a structure in which an electroluminescent layer 860 is sandwiched between a first electrode layer 870 and a second electrode layer 850. It is necessary to select materials for the first and second electrode layers in consideration of a work function. The first and second electrode layers can serve as either an anode or a cathode depending on a pixel structure. In this embodiment mode, it is preferable that the first electrode layer serve as a cathode and the second electrode layer serve as an anode, since a polarity of a driving TFT is an n-channel type. In addition, when a polarity of the driving TFT is a p-channel type, it is preferable that the first electrode be an anode and the second electrode be a cathode.

Figure 45A:
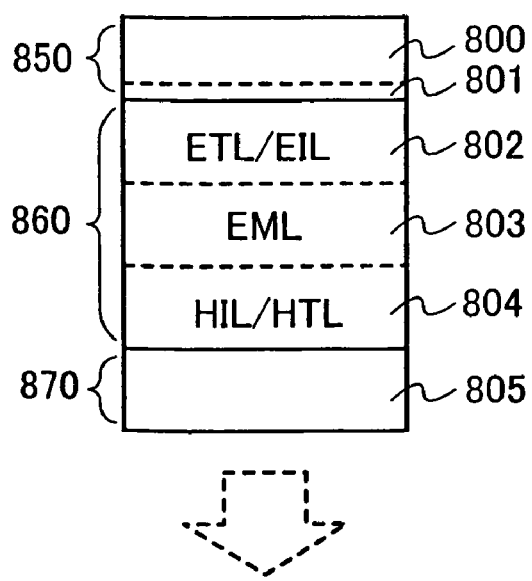
FIGS. 45A to 45D are cross sectional views showing structures of light emitting elements that can be applied to the invention.
Figure 45B:
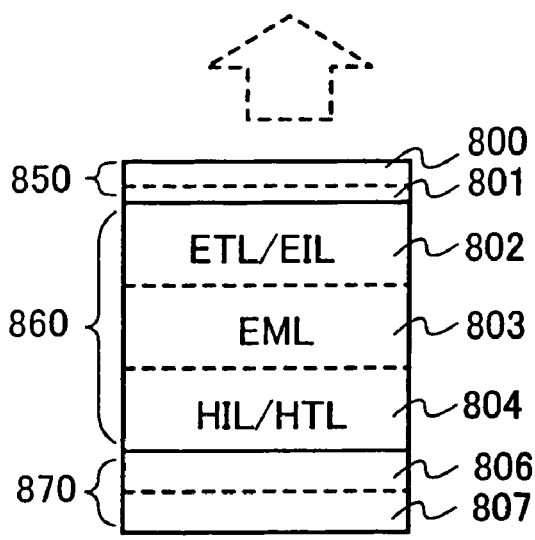

FIGS. 45A and 45B show the cases where each first electrode layer 870 is an anode and each second electrode layer 850 is a cathode, and therefore, each electroluminescent layer is preferably formed by sequentially laminating an HIL (a hole injecting layer), an HTL (a hole transporting layer) 804, an EML (a light emitting layer) 803, an ETL (an electron transporting layer), an EIL (an electron injecting layer) 802 and the second electrode layer 850 on the first electrode layer 870. Further, FIG. 45A shows a case where light is emitted through the first electrode layer 870, wherein the first electrode layer 870 is formed using an electrode layer 805 that is made from a conductive oxide material having a light transmitting property and the second electrode layer is formed by sequentially laminating an electrode layer 801 that contains alkali metal or alkali earth metal such as LiF and MgAg and an electrode layer 800 made from an metal material such as aluminum over the electroluminescent layer 860. FIG. 45B shows the structure in that light is emitted through the second electrode layer 850, wherein the first electrode layer includes an electrode layer 807 made from metal such as aluminum and titanium or a metal material containing the metal and nitrogen at a concentration in the stoichiometric quantity lower than the metal; and an electrode layer 806 made from a conductive oxide material that contains 1 to 15 atomic % silicon oxide. The second electrode layer is formed by sequentially laminating the electrode layer 801 containing the alkali metal or the alkali earth metal such as LiF and MgAg and the electrode layer 800 made from the metal material such as aluminum over the electroluminescent layer 860. When the thicknesses of the respective electrode layers are set to be 100 nm or less so as to transmit light, light can be emitted through the second electrode layer 850.

Figure 45C:
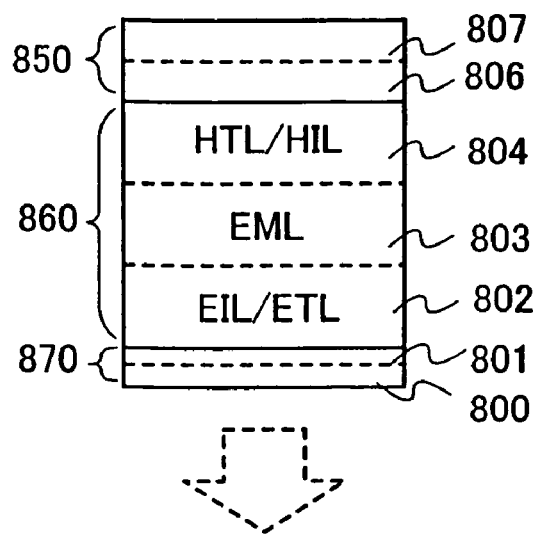
Figure 45D:
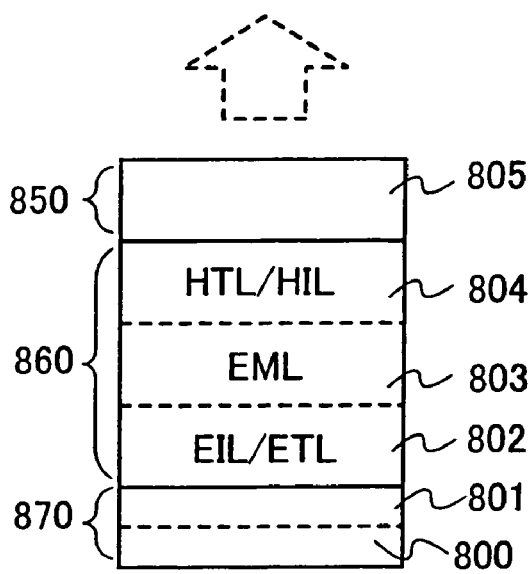

FIGS. 45C and 45D shows the cases where the first electrode layers 870 are cathodes and the second electrode layers 850 are anodes. In each of FIGS. 45C and 45D, the electroluminescent layer 860 is preferably formed by laminating an EIL (an electron injecting layer), an ETL (an electron transporting layer) 802, an EML (a light emitting layer) 803, an HTL (a hole transporting layer), an HIL (a hole injecting layer) 804 and a second electrode layer 850, which is the anode, over the cathode. FIG. 45C shows a structure in which light is emitted through the first electrode layer 870, wherein the first electrode layer 870 is formed by sequentially laminating an electrode layer 801 containing alkali metal or alkali earth metal such as LiF and MgAg and an electrode layer 800 made from a metal material such as aluminum over the electroluminescent layer 860. When the thicknesses of the respective electrode layers are set to be 100 nm or less to transmit light, light can be emitted through the first electrode layer 870. The second electrode layer is formed by sequentially laminating an electrode layer 806 made from a conductive oxide material containing 1 to 15 atomic % silicon oxide and an electrode layer 807 made from metal such as aluminum and titanium or a metal material containing the metal and nitrogen at a concentration in the stoichiometric quantity lower than the metal over the electroluminescent layer 860. FIG. 45D shows a structure in which light is emitted through the second electrode layer 850, wherein the first electrode layer 870 is formed by sequentially laminating the electrode layer 801 containing alkali metal or alkali earth metal such as LiF and MgAg and the electrode layer 800 formed using a metal material such as aluminum over the electroluminescent layer 860. The thicknesses of the respective electrode layers are set to be thick such that light generated in the electroluminescent layer 860 can be reflected by the first electrode layer 870. The second electrode layer 850 is formed using an electrode layer 805 that is made from a conductive oxide material having a light transmitting property. Further, the electroluminescent layer can also be formed with a single layer structure or a hybrid structure, in addition to the above laminated structure.

As the electroluminescent layer, materials exhibiting light emission of red (R), green (G) and blue (B) are selectively formed by evaporation using an evaporation mask and the like, respectively. The materials exhibiting light emission of red (R), green (G) and blue (B) (low molecular weight materials, high molecular weight materials, and the like) can be formed by the droplet discharging method as well as a color filter. The droplet discharging method is preferable since layers exhibiting R, G and B light can be separately applied without using a mask.

In the case of the top emission and a second electrode layer is made from ITO or ITSO with a light transmitting property, BzOs-Li in which benzoxazole derivative (BzOs) is added with Li, or the like can be used. Also, for instance, as the EML, Alq$_3$ added with a dopant corresponding to respective luminescent colors of R, G and B (DCM etc. in the case of R, and DMQD etc. in the case of G) may be used.

Further, the materials of the electroluminescent layer are not limited to the above materials. For example, a hole injecting property can be enhanced by co-evaporation of oxide such as molybdenum oxide (MoO$_x$: X=2 to 3) with α-NPD or rubrene as substitute for CuPc or PEDOT. In addition, an organic material (including a low molecular weight material or a high molecular weight material) or a composite material of an organic material and an inorganic material can be used as a material for the electroluminescent layer. Materials for forming a light emitting element will be described in more detail below.

As substances having excellent electron transporting properties among charge injecting/transporting substances, for example, metal complexes having quinoline skeleton or benzoquinoline skeleton such as: tris(8-quinolinolate)aluminum (abbreviation: Alq$_3$); tris(5-methyl-8-quinolinolate)aluminum (abbreviation: Almq$_3$); bis(10-hydroxybenzo[h]quinolinato)beryllium (abbreviation: BeBq$_2$); bis(2-methyl-8-quinolinolate)-4-phenylphenolato-aluminum (abbreviation: BAlq); and the like can be given. As substances having superior hole transporting properties, for example, aromatic amine (i.e., one having a benzene ring-nitrogen bond) compounds such as: 4,4'-bis[N-(1-naphthyl)-N-phenyl-amino]-biphenyl (abbreviation: α-NPD); 4, 4'-bis[N-(3-methylphenyl)-N-phenyl-amino]-biphenyl (abbreviation: TPD); 4,4', 4''-tris(N,N-diphenyl-amino)-triphenylamine (abbreviation: TDATA); 4,4', 4''-tris[N-(3-methylphenyl)-N-phenyl-amino]-triphenylamine (abbreviation: MTDATA); and the like can be given.

As substances having extremely superior electron injecting properties among charge injecting/transporting substances, compounds of alkali metal or alkali earth metal such as lithium fluoride (LiF), cesium fluoride (CsF) and calcium fluoride (CaF$_2$) can be given. In addition, a mixture of a substance having a high electron transportation property such as Alq$_3$ and alkali earth metal such as magnesium (Mg) may be used.

As substances having excellent hole, injecting properties among the charge injecting/transporting substances, for example, metal oxide such as molybdenum oxide (MoOx), vanadium oxide (VOx), ruthenium oxide (RuOx), tungsten oxide (WOx) and manganese oxide (MnOx) can be cited. Besides, phthalocyanine compounds such as phthalocyanine (abbreviation: H$_2$Pc) and copper phthalocyanine (CuPc) can be given.

Light emitting layers having different light emission wavelength bands may be formed in each pixel so as to perform color display. Typically, light emitting layers corresponding to respective luminescent colors of R (red), G (green) and B (blue) are formed. In this case, when a filter that transmits light of a certain light emission wavelength band is provided at a side of light emission of pixels, color purity can be improved and specular reflexion (reflection) of a pixel portion can be prevented. By providing the filter, a circular polarizing plat or the like, which has been conventionally thought to be required, can be eliminated, thereby reducing loss of light emitted from the light emitting layers. Also, change in color tone, that is caused in the case where a pixel portion (a display screen) is seen obliquely, can be reduced.

There are various kinds of light emitting materials. With respect to low molecular weight organic light emitting materials, the following substances can be used: 4-dicyanomethylene-2-methyl-6-[2-(1,1,7,7-tetramethyl-9-julolidyl) ethenyl]-4H-pyran (abbreviation: DCJT); 4-dicyanomethylene-2-t-butyl-6-[2-(1,1,7,7-tetramethyl-julolidine-9-il)ethenyl]-4H-pyran (abbreviation: DCJTB); periflanthene; 2, 5-dicyano-1,4-bis[2-(10-methoxy-1,1,7,7-tetramethyl-julolidine-9-il)ethenyl]benzene, N,N'-dimethylquinacridone (abbreviation: DMQd); coumarin 6; coumarin 545T; tris(8-quinolinolate)aluminum (abbreviation: Alq$_3$); 9,9'-biantryl; 9,10-diphenylanthracene (abbreviation: DPA); 9,10-bis(2-naphthyl)anthracene (abbreviation: DNA); and the like. Also, another substances may be used.

On the other hand, as compared with the low molecular weight organic light emitting materials, the high molecular weight organic light emitting materials have higher physical strength, which results in more durable elements. In addition, since the high molecular weight organic light emitting materials can be formed by applying a liquid, an element can be formed relatively easily. A structure of a light emitting element formed using the high molecular weight organic light emitting material is basically similar to that of using the low molecular weight organic light emitting material, and is formed by sequentially laminating a cathode, an organic light emitting layer and an anode. However, when a light emitting layer is made from the high molecular weight organic light emitting material, it is difficult to form a lamination structure like the case of using the low molecular weight organic light emitting material. In many cases, such the light emitting element made from the high molecular weight organic light emitting material has a two layer structure. Concretely, it is a lamination structure formed by sequentially laminating a cathode, a light emitting layer, a hole transporting layer and an anode.

A luminescent color is determined by a material of a light emitting layer, and hence, a light emitting element that emits a predetermined color of light can be formed by selecting the material. As high molecular weight electroluminescent materials that can be used to form a light emitting layer, polyparaphenylene vinylene, polyparaphenylene, polythiophene, polyfluorene and the like can be given.

Specifically, a derivative of poly(paraphenylenevinylene) (PPV); poly(2,5-dialkoxy-1,4-phenylenevinylene) (RO-PPV); poly(2-[2'-ethyl-hexoxy]-5-methoxy-1,4-phenylenevinylene) (MEH-PPV); poly(2-[dialkoxyphenyl]-1,4-phenylenevinylene) (ROPh-PPV); and the like can be given as polyparaphenylene vinylene. As the polyparaphenylene, a derivative of polyparaphenylene (PPP); poly(2,5-dialkoxy-1, 4-phenylene) (RO-PPP); poly(2,5-dihexoxy-1,4-phenylene); and the like can be given. As the polythiophene, a derivative of polythiophene (PT); poly(3-alkylthiophene) (PAT); poly (3-hexylthiophene) (PHT); poly(3-cyclohexylthiophene) (PC); poly(3-cyclohexyl-4-methylthiophene) (PCHMT); poly(3,4-dicyclohexylthiophene) (PDCHT); poly(3-[4-octylphenyl]-thiophene) (POPT); poly(3-[4-octylphenyl]-2,2-bithiophene) (PTOPT); and the like can be given. As the polyfluorene, a derivative of polyfluorene (PF); poly(9,9-dialkylfluorene) (PDAF); poly(9,9-dioctylfluorene) (PDOF); and the like can be given.

When a high molecular weight organic light emitting material with a hole transporting property is sandwiched between an anode and a high molecular weight organic light emitting material with a light emitting property, a hole injecting property from the anode can be improved. Typically, a solution in which a high molecular weight organic light emitting material with the hole transporting property is dissolved in water along with an acceptor material is applied by spin coating or the like. Since an organic solvent is insoluble, it can be laminated together with the above-mentioned organic light emitting material with the light emitting property. As the high molecular weight organic light emitting material with the hole transporting property, a mixture of PEDOT and camphor sulfonic acid (CSA) as an acceptor material; a mixture of polyaniline (PANI) and polystyrenesulfonic acid (PSS) as an acceptor material; and the like can be cited.

A light emitting layer can emit monochromatic light or white light. In the case of using a white light emitting material, a color display can be achieved by providing a filter (a colored layer) that transmits light of a certain wavelength in a light emitting direction side of a pixel.

In order to form a light emitting layer that emits white light, for example, white light emission can be achieved by sequentially laminating $Alq_3$, $Alq_3$ partially added with Nile red, which is a red light emitting pigment, $Alq_3$, p-EtTAZ and TPD (aromatic diamine) by evaporation. Also, when an EL is formed by coating using spin coating, the EL is preferably baked by vacuum heating after applying a liquid. For example, an aqueous solution of poly(ethylene dioxythiophene)/poly(styrenesulfonic acid) (PEDOT/PSS), which functions as a hole injecting layer, may be applied over the entire surface of a substrate and baked. Afterwards, a solution of polyvinyl carbazole (PVK) added with a pigment for luminescence center (such as 1,1,4,4-tetraphenyl-1,3-butadiene (TPB), 4-dicyanomethylene-2-methyl-6-(p-dimethylamino-styryl)-4H-pyran (DCM1), Nile red and coumarin 6), which serves as a light emitting layer, may then be applied over the entire surface and baked.

A light emitting layer may be formed to have a single layer. In this case, 1,3,4-oxadiazole derivative (PBD) with an electron transporting property may be dispersed in polyvinyl carbazole (PVK) with a hole transporting property. In addition, white light emission can be obtained by dispersing 30 wt % PBD as an electron transporting agent and dispersing a suitable amount of four kinds of pigments (TPB, coumarin 6, DCM1, and Nile red). In addition to the above-mentioned light emitting elements that emit white light, a light emitting element capable of emitting red light, green light or blue light can be manufactured by properly selecting materials for the light emitting layer.

Further, triplet excited light emitting materials including metal complex and the like may be used for a light emitting layer in addition to singlet excited light emitting materials. For example, pixels emitting red light, in which luminance half-life is relatively shorter than those of pixels emitting green and blue light, are formed by using a triplet excited light emitting material, and the pixels emitting green and blue light are formed of a singlet excited light emitting material. Since the triplet excited light emitting material has an excellent light emitting efficiency, it has a feature of requiring lower power consumption in order to obtain a same level of luminance as compared with the singlet excited light emitting material. That is, when the pixels for emitting red light are formed by a triplet excited light emitting material, a small amount of current flowing through the light emitting element is required, thereby improving the reliability. To reduce power consumption, pixels emitting red and green light may be formed of the triplet excited light emitting materials, while pixels emitting blue light may be formed of a singlet excited light emitting material. In the case where light emitting elements that emit green light, which has high visibility with respect to human eyes, are also formed of the triplet excited light emitting material, power consumption can be further reduced.

As an example of the triplet excited light emitting material, there is one that uses a metal complex as a dopant. In particular, a metal complex with platinum, which is a third transition element, as its central metal, a metal complex with iridium as its central metal and the like are known. The triplet excited light emitting materials are not limited to these compounds, and it is possible to use a compound having the above mentioned structure and including an element that belongs to group 8 to 10 of the periodic table as its central metal.

Above mentioned substances for forming a light emitting layer are examples, and a light emitting element can be formed by properly laminating respective layers with various properties such as a hole injecting/transporting layer, a hole transporting layer, an electron injecting/transporting layer, an electron transporting layer, a light emitting layer, an electron blocking layer and a hole blocking layer. In addition, a mixed layer or a mixed junction of these layers may be used. The layer structure of a light emitting layer can be varied. The structural change of the light emitting layer may be allowable without deviating the purpose of the invention; for example, an electrode layer is provided or a light emitting material is dispersed so as to function as a light emitting, layer, instead of providing a certain electron injecting region or light emitting region.

When a light emitting element formed of the above-mentioned materials is applied with a forward bias voltage, it can emit light. Each pixel of a display device formed using the light emitting element can be driven by either a simple matrix method or an active matrix method. In either case, each pixel emits light by being applied with a forward bias voltage at a certain timing, whereas each pixel does not emit light in a certain period. In this non-light emitting period, a reverse bias voltage is applied to the light emitting element so that the reliability of the light emitting element can be improved. The light emitting element has deterioration modes of reducing light intensity under a certain drive condition or reducing appearance luminance due to expansion of a non-light emitting region within pixels. When the light emitting element is driven by applying alternating current such that each pixel is applied with a forward bias voltage and a reverse bias voltage alternately, the deteriorations of the light emitting element can be hindered, thereby increasing the reliability of the light emitting device. Furthermore, either the digital driving or the analog driving is applicable.

Figure 46A:
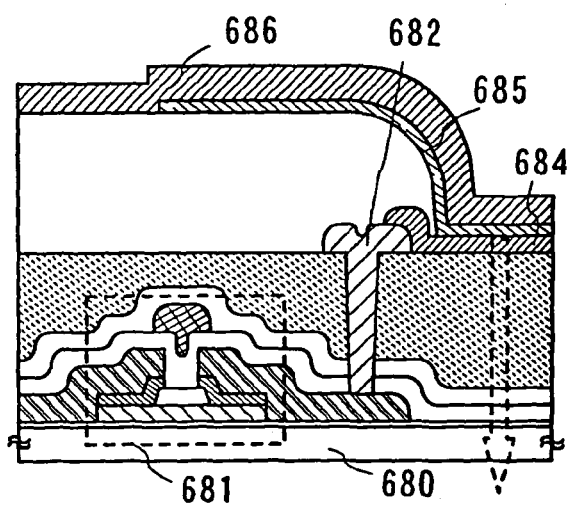
FIGS. 46A to 46C are cross sectional views showing display devices according to the invention.
Figure 46B:
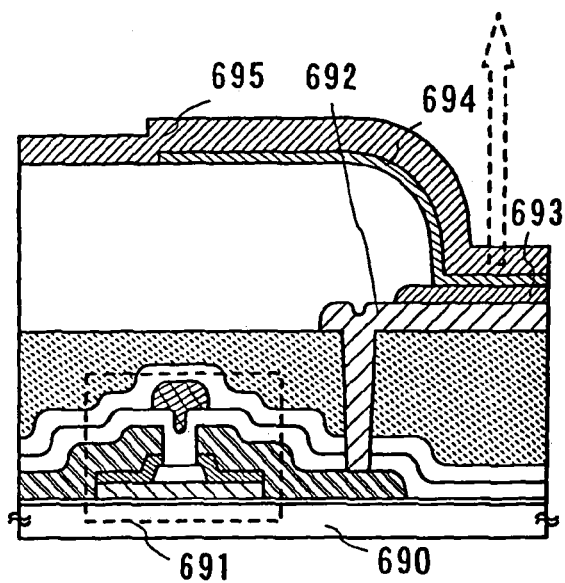
Figure 46C:
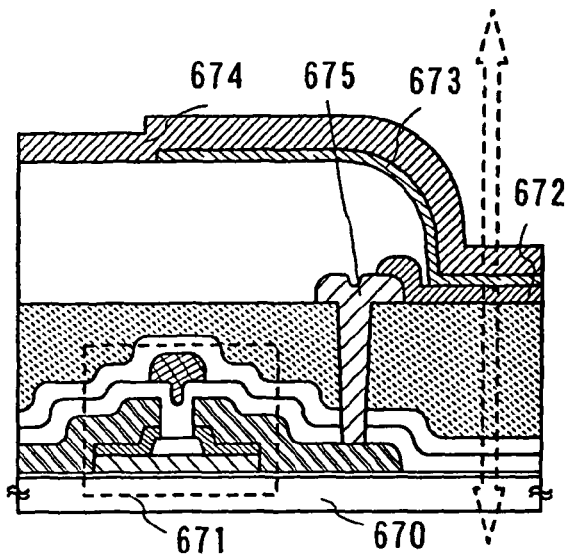

Although not shown in FIGS. 46A to 46C, a color filter (colored layer) may be formed over a counter substrate facing to a substrate comprising elements. The color filter (colored layer) can be formed selectively by the droplet discharging method. Since broad peaks of the emission spectrum for respective R, G and B can be adjusted sharply by the color filter (colored layer), a high-definition image can be displayed by using this color filter (colored layer).

Although the case of forming the material exhibiting light emission of respective R, G and B is described above, a full color display can also be achieved by forming a material exhibiting a monochromatic light in combination with a color filter or a color conversion layer. For example, the color filter (colored layer) or the color conversion layer may be formed over a sealing substrate and attached to a substrate having elements. As described above, the material exhibiting monochromatic light, the color filter (colored layer) and the cooler conversion layer can be formed by the droplet discharging method.

Of course, a monochromatic light emitting display may be performed. For instance, an area color display device using a monochromatic light may be formed. A passive matrix display portion is suitable for the area color display device and characters and symbols can be mainly displayed thereon.

In the above-mentioned structures, the cathodes can be formed of a material having low work function. For example, the cathodes are desirably formed of Ca, Al, CaF, MgAg, AlLi, and the like. The electroluminescent layers may have any one of a single-layer structure, a lamination structure and a mixed structure having no interfaces between layers. Further, the electroluminescent layers may be formed of any materials such as a singlet material; a triplet material; a material with a combination of the singlet and triplet materials; a charge injecting/transporting substance containing an organic compound or an inorganic compound; or a light emitting material. The cathodes may include one or plural kinds of layers selected from a low molecular weight organic compound, an intermediate molecular weight organic compound (which indicates an organic compound that does not have a sublimation property and has 20 or less molecules or a chained molecule with a length of 10 μm or less) and a high molecular weight organic compound depending on the number of its molecules, in combination with an inorganic compound with an electron injecting/transporting property or a hole injecting/transporting property. The first electrode layers 684 and 672 and the second electrode layers 695, and 674 are formed of transparent conductive films, which transmit light. For example, a transparent conductive film, in which indium oxide is mixed with 2 to 20% of zinc oxide (ZnO) is used besides ITO and ITSO. It is preferable that a plasma treatment be carried out under an oxygen atmosphere or a heat treatment be performed under a vacuum atmosphere prior to forming the first electrode layers 684, 693 and 672. Partition walls (also referred to as banks) are formed of a material including silicon, an organic material, or a compound material. Also, a porous film may be used. When the partition walls are formed of a photosensitive or nonphotosensitive material such as acrylic and polyimide, the radius of curvature for each side surface thereof is continuously varied. Therefore, a thin film formed on each partition wall is not disconnected. Accordingly, it is preferable that the partition walls be formed of the photosensitive or nonphotosensitive material. The present invention can be implemented by being freely combined with Embodiment Modes 1 through 15.

Embodiment Mode 17

Structures of pixels for a display panel shown in this embodiment mode will be described with reference to equivalent circuit diagrams illustrated in FIGS. 30A to 30F.

Figure 30:
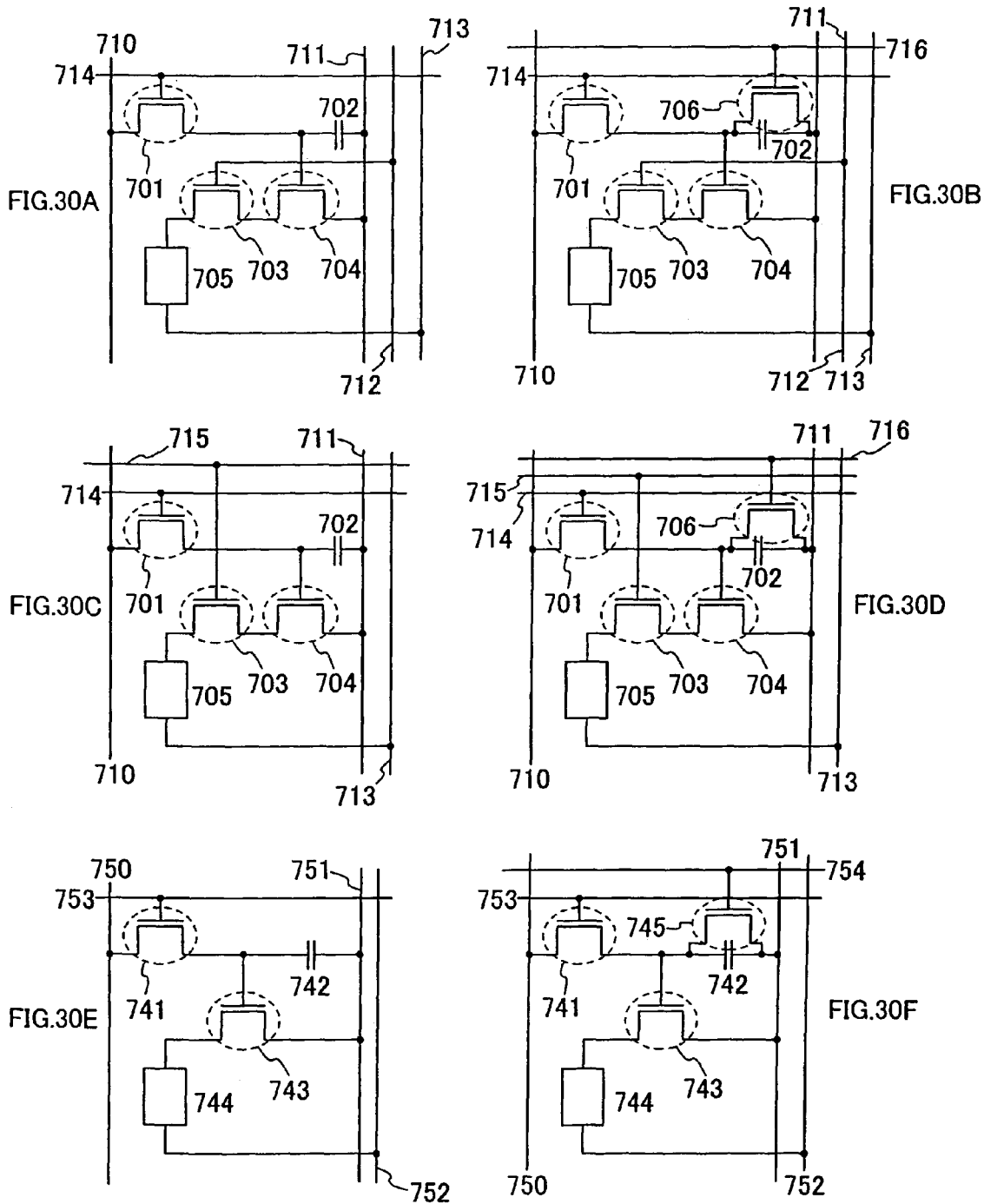
FIGS. 30A to 30F are equivalent circuit diagrams showing configurations of pixels that can be applied to the present invention.

In a pixel as shown in FIG. 30A, a signal line 710, power supply lines 711, 712 and 713 are arranged in columns, whereas a scanning line 714 is arranged in a row. The pixel also includes a switching TFT 701, a driving TFT 703, a current controlling TFT 704, a capacitor element 702 and a light emitting element 705.

A pixel as shown in FIG. 30C has a similar structure to the one shown in FIG. 30A, except that a gate electrode of the driving TFT 703 is connected to a power supply line 715 that is arranged in a row. That is, both pixels depicted in FIGS. 30A and 30C show same equivalent circuit diagrams. However, respective power supply lines are formed of conductive layers in different layers between the cases where the power supply line 712 is arranged in a column (FIG. 30A) and where the power supply line 715 is arranged in a row (FIG. 30C). In order to emphasis on the different arrangements of the power supply lines to which the gate electrodes of the driving TFTs 703 are connected, the equivalent circuit diagrams are individually illustrated in FIGS. 30A and 30C.

In each FIGS. 30A and 30C, the driving TFT 703 and the current controlling TFT 704 are connected in series in each pixel, and the channel length $L_3$ and the channel width $W_3$ of the driving TFT 703 and the channel length $L_4$ and the channel width $W_4$ of the current controlling TFT 704 are set to satisfy the relation of $L_3/W_3: L_4/W_4=5$ to 6,000: 1. For example, when $L_3$, $W_3$, $L_4$, and $W_4$ are set to be 500 μm, 3 μm, 3 μm and 100 μm, respectively, they satisfies 6000: 1. Since microscopic patterning can be carried out according to the present invention, a fine wiring having a short channel width can be formed stably without causing defects such as short-circuiting. Accordingly, a TFT having electronic characteristics that are required for sufficiently functioning the pixels as shown in FIGS. 30A and 30C can be formed, thereby manufacturing a display panel with an excellent display function along with high reliability.

The driving TFT 703 is operated in a saturation region and controls the amount of current flowing through the light emitting element 705, whereas the current controlling TFT 704 is operated in a linear region and controls current supplied to the light emitting element 705. The both TFTs 703 and 704 preferably have a same conductivity type in view of the manufacturing process. As the driving TFT 703, a depletion type TFT may be used instead of an enhancement type TFT According to the invention having the above structure, slight variations in VGs of the current controlling TFT 704 does not adversely affect the amount of current flowing through the light emitting element 405, since the current controlling TFT 704 is operated in a linear region. That is, the amount of current flowing through the light emitting element 705 is determined by the driving TFT 703 operated in the saturation region. Accordingly, it is possible to provide a display device in which image quality is improved by improving variations in luminance of the light emitting element due to variation of the TFT characteristics.

The switching. TFT 701 of each pixel as shown in FIGS. 30A to 30D controls a video signal input to the pixel. When the switching TFT 701 is turned on and a video signal is input in the pixel, the video signal is held in the capacitor element 702. Although the arrangements in which each pixel includes the capacitor element 702 are shown in FIGS. 30A and 30C, the invention is not limited to these arrangements. When a gate capacitance or the like can serve as a capacitor for holding a video signal, the capacitor element 702 may not be provided.

The light emitting element 705 has a structure in which an electroluminescent layer is sandwiched between a pair of electrodes. A potential difference is maintained between a pixel electrode and a counter electrode (i.e., between an anode and a cathode) such that a forward bias voltage is applied. The electroluminescent layer is formed of various kinds of materials such as an organic material and an inorganic material. Luminescence in the electroluminescent layer includes luminescence that is generated when an excited singlet state returns to a ground state (fluorescence) and luminescence that is generated when an exited triplet state returns to a ground state (phosphorescence).

A pixel as shown in FIG. 30B has a similar structure to the one shown in FIG. 30A, except that a TFT 706 and a scanning line 716 are added thereto. Similarly, a pixel as shown in FIG. 30D has a similar structure to the one shown in FIG. 30C, except that a TFT 706 and a scanning line 716 are added thereto.

The TFT 706 is controlled to be turned on/off by the newly provided scanning line 716. When the TFT 706 is turned on, charges held in the capacitor element 702 are discharged, thereby turning the TFT 704 off. That is, supply of current flowing through the light emitting element 705 can be forcibly stopped by providing the TFT 706. Therefore, a lighting period can start simultaneously with or immediately after a writing period starts before signals are written into all the pixels according to the structures shown in FIGS. 30B and 30D, and hence, the duty ratio can be improved.

In a pixel as shown in FIG. 30E, a signal line 750 and power supply lines 751 and 752 are arranged in columns while a scanning line 753 is arranged in a row. The pixel further includes a switching TFT 741, a driving TFT 743, a capacitor element 742 and a light emitting element 744. A pixel shown in FIG. 30F has a similar structure to the one shown in FIG. 30E, except that a TFT 745 and a scanning line 754 are added. Further, the structure as shown in FIG. 30F also allows a duty ratio to be improved by providing the TFT 745.

According to the present invention, a pattern such as a wiring can be formed stably and precisely without causing fabrication failures, thereby providing a TFT having excellent electronic characteristics and high reliability. The present invention can be applicable to an applied technology for improving a displaying function of a pixel in accordance with an intended purpose.

The present embodiment mode can be implemented in combination with Embodiment Modes 1 through 16.

Embodiment Mode 18

Figure 35:
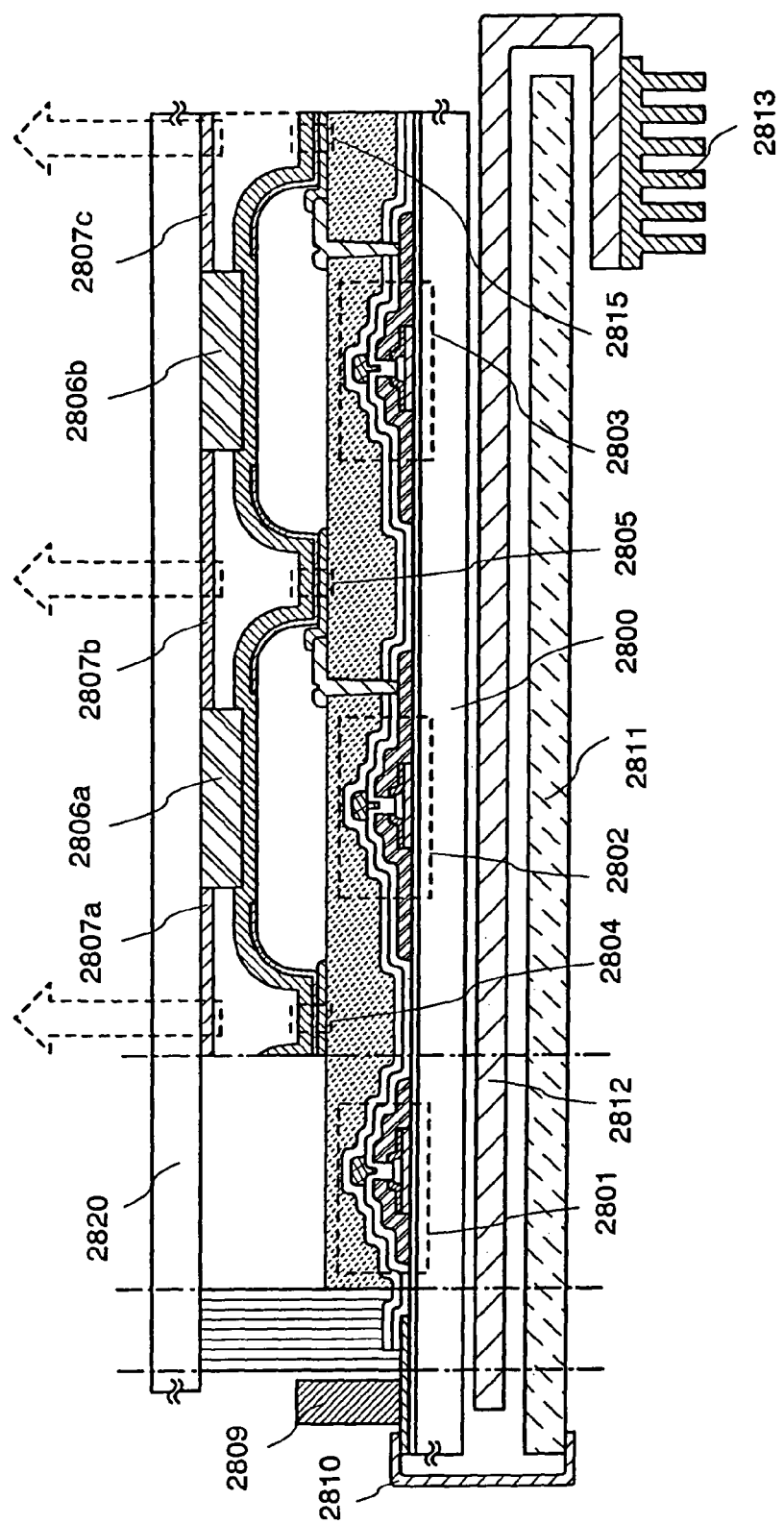
FIG. 35 is a cross sectional view showing a structure of a display module according to the invention.

The present embodiment mode will be described with reference to FIG. 35 and FIG. 36. FIG. 35 shows an example of a structure of an EL display module formed by using a TFT substrate 2800 manufactured according to the present invention. In FIG. 35, a pixel portion including pixels is formed over the TFT substrate 2800.

In FIG. 35, a protective circuit portion 2801 including a TFT that is same as one formed in a pixel or a diode, in which a gate and a source or a drain of the TFT are connected to each other, is provided between a driver circuit and the pixel, and outside of the pixel portion. A driver IC formed of a single crystal semiconductor, a stick driver IC formed of a polycrystalline semiconductor film over a glass substrate, a driver circuit formed using an SAS, or the like is applied as a driver circuit 2809.

The TFT substrate 2800 is firmly attached to a sealing substrate 2820 while sandwiching spacers 2806a and 2806b, which are formed by the droplet discharge method, therebetween. The spacers are preferably provided to keep a constant gap between the two substrates, even when the substrates are thin and an area of the pixel portion is increased. A resin material having a light transmitting property may be filled in the gap between the TFT substrate 2800 and the sealing substrate 2820, over light emitting elements 2804 and 2805 and then be cured. Alternatively, the gap therebetween may be filled with anhydrous nitrogen or an inert gas.

FIG. 35 shows a case where the light emitting element 2804, the light emitting element 2805 and a light emitting element 2815 have a top emission type structure, wherein light generated in the respective light emitting elements is emitted in a direction indicated by arrows as illustrated in the drawing. By forming pixels having different luminescent colors of red, green and blue, multicolor display can be carried out. In addition, color purity of light emitted to the outside can be increased by forming colored layers 2807a, 2807b and 2807c corresponding to each color over the sealing substrate 2820. Alternatively, the pixels may be formed as white light emitting elements in combination with the colored layers 2807a, 2807b and 2807c.

The driver circuit 2809, which is an external circuit, is connected to a scanning line or signal line connection terminal provided in one edge of an external circuit substrate 2811 with a wiring substrate 2810. Alternatively, a heat pipe 2813 and a radiator plate 2812 may be provided to be in contact with or adjacent to the TFT substrate 2800 so as to enhance the effect of heat release.

Although an EL module having the top emission structure is shown in FIG. 35, a bottom emission structure, or of course, a dual emission structure in which light is emitted upward and downward may also, be employed by changing the structure of a light emitting element or the arrangement of an external circuit substrate. In the case of the top emission structure, an insulating layer serving as a partition wall may be colored to be used as a black matrix. This partition wall can be formed by the droplet discharge method. For example, it can be formed by mixing black pigment resin, a carbon black or the like into a resin material such as polyimide. Further, a lamination of the partition walls may also be used.

Figure 36:
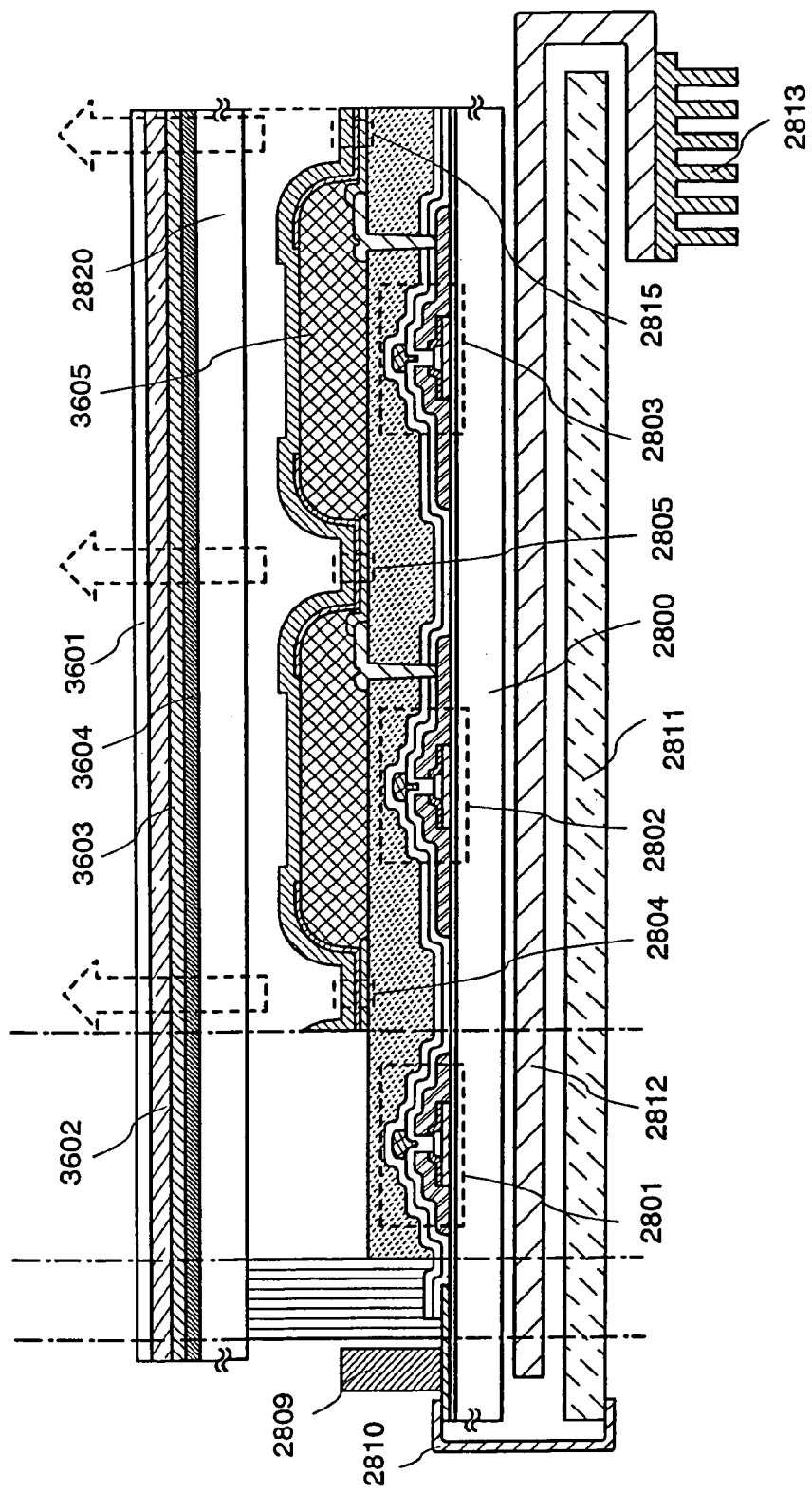
FIG. 36 is a cross sectional view showing a structure of a display module according to the invention.

In addition, the EL display module may have a structure in which reflected light of light entering from the outside may be blocked by using a retardation plate and a polarizing plate, as shown in FIG. 36. FIG. 36 shows a top emission structure in which an insulating layer 3605, which serves as a partition wall, is colored to be used as a black matrix. This partition wall can be formed by the droplet discharging method. The partition wall may be made using a resin material such as polyimide mixed with carbon black etc. A lamination layer thereof may also be used. To form the partition wall, different kinds of materials may be discharged in a same region at several times by the droplet discharging method. In this embodiment mode, black pigment resin is employed. As retardation plates 3603 and 3604, λ/4 and λ/2 plates may be used to control light. A TFT substrate 2800, a light emitting element 2804, a sealing substrate (sealing member) 2820, the retardation plates 3603 and 3604 (λ/4 and λ/2 plates), and a polarizing plate 3602 are sequentially laminated. Light generated in the light emitting element is emitted to the outside portion through the polarizing plate. The retardation plates and polarizing plate may be disposed in a side through which light is emitted to the outside. In the case of a dual-emission type display device, which emits light both upward and downward, retardation plates and polarizing plates can be provided over both surfaces of the display device. In addition, antireflection films 3601 may be provided on the outer sides of the polarizing plates. According to this structure, more high-definition images can be displayed.

Alternatively, a resin film may be attached to the TFT substrate 2800 using a sealing material or adhesive resin so as to seal the pixel portion formed over the TFT substrate 2800. Although the pixel portion is sealed using the glass substrate in this embodiment mode, it can be sealed using various materials such as resin, plastic and a film. A gas barrier film is preferably formed on the surface of the resin film to prevent moisture vapor from penetrating therethrough. By sealing the pixel portion with the resin film, a display device can be made thinner and lighter.

The present embodiment mode can be implemented in combination with Embodiment Modes 1 through 17.

Embodiment Mode 19

Figure 42:
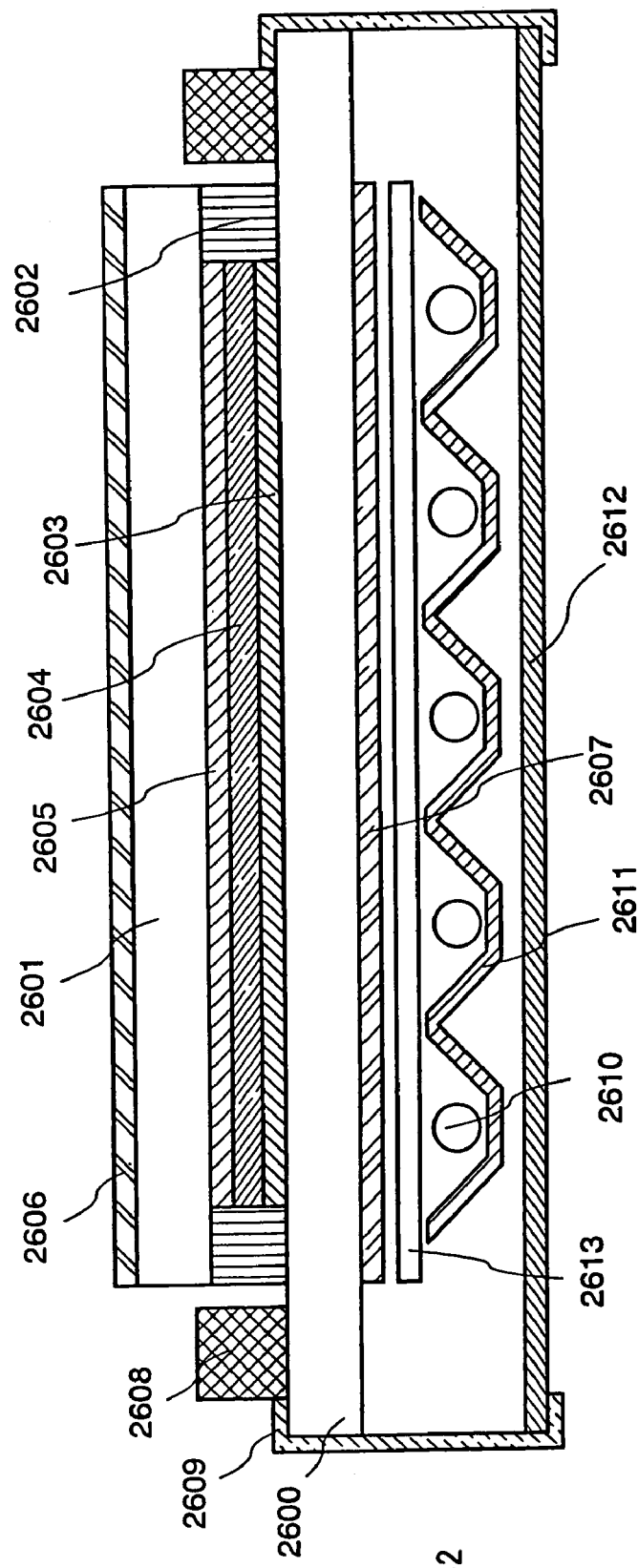
FIG. 42 is a cross sectional view explaining a structure of a display module according to the invention.
Figure 44:
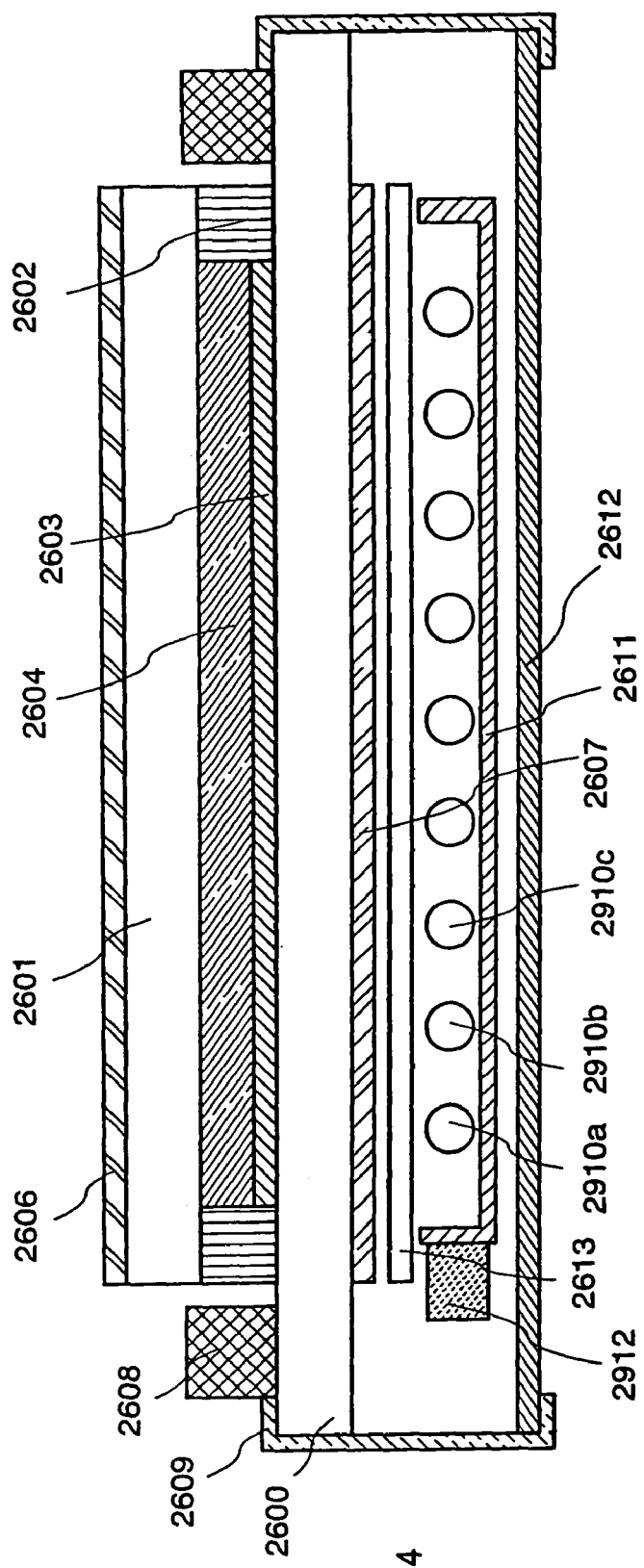
FIG. 44 is a cross sectional view explaining a structure of a display module according to the present invention.

The present embodiment mode will be described with reference to FIG. 42 and FIG. 44. FIG. 42 and FIG. 44 show examples of forming liquid crystal display modules by using TFT substrates 2600 that are manufactured according to the present invention.

FIG. 42 shows an example of a liquid crystal display module, wherein a TFT substrate 2600 and a counter substrate 2601 are firmly attached to each other by a sealing material 2602 and a pixel portion 2603 and a liquid crystal layer 2604 are provided between the substrates to constitute a display region. A colored layer 2605 is necessary to perform a color display. In the case of the RGB system, colored layers corresponding to respective colors of red, green and blue are provided in relation to each pixel. The outsides of the TFT substrate 2600 and the counter substrate 2601 are provided with polarizing plates 2606 and 2607, respectively. Also, a lens film 2613 is provided to the outside of the polarizing plate 2607, which is provided over the TFT substrate 2600. A light source includes cold-cathode tubes 2610 and a reflecting plate 2611. A circuit substrate 2612 is connected to the TFT substrate 2600 by a flexible wiring substrate 2609. External circuits such as a control circuit and a power supply circuit are incorporated in the circuit substrate 2612. The liquid crystal display module can employ a TN (twisted nematic) mode, an IPS (in-plane-switching) mode, an MVA (multi-domain vertical aligiment) mode, an ASM (axially symmetric aligned micro-cell) mode, an OCB mode or the like.

Especially, properties of a display device manufactured according to the present invention can be improved by using the OCB mode that can response at high speed. FIG. 44 shows an example in which the OCB mode is applied to a liquid crystal display module of FIG. 42 so that this liquid crystal display module becomes an FS-LCD (a field sequential-LCD). The FS-LCD performs red light emission, green light emission and blue light emission in one flame period, respectively. An image is produced by using temporal decomposition so that a color display can be performed. Also, emission of respective colors is formed using light emitting diodes, cold-cathode tubes and the like, and hence, a color filter is not required. Therefore, since the arrangement of color filters of red, green and blue is not required, 9 times numbers of pixels can be displayed in a same area as the case of using the color filters. On the other hand, light emission of three colors is performed in one flame period, thereby achieving a high speed response of liquid crystal. Since the thin film transistor included in the display device manufactured according to the present invention can be operated at high speed, the display device can employ the OCB mode. As a consequence, an FS system, and the OCB mode can be applied to the display device of the present invention, completing a high-definition display device and a high-definition liquid crystal television device with higher performance. Further, as a mode corresponding to the FS system, an HV-FLC, an SS-FLC or the like using ferroelectric liquid crystal (FLC) that can be operated at high speed can also be used. A nematic liquid crystal that has relatively low viscosity is used for the OCB mode. A smectic liquid crystal is used for the HV-FLC and SS-FLC. As liquid crystal materials, materials such as an FLC, a nematic liquid crystal and a smectic liquid crystal can be used.

An optical response speed of a liquid crystal display module is increased by narrowing a cell gap of the liquid crystal display module. Alternatively, the optical response speed can be increased by lowering the viscosity of a liquid crystal material. Increasing the response speed is more effective in the case where a pixel or a dot pitch of a pixel region of a TN mode liquid crystal display module is 30 μm or less.

The liquid crystal display module of FIG. 44 is of a transmissive type, where a red light source 2910a, a green light source 2910b and a blue light source 2910c are provided as light sources. A controlling portion 2912 is installed in the liquid crystal display module to control switch-on or switch-on-off of the red light source 2910a, the green light source 2910b and the blue light source 2910c, respectively. The light emission of respective colors is controlled by the controlling portion 2912 and light enters into the liquid crystal to generate an image using temporal decomposition, performing a color display.

As set forth above, a high-definition, highly reliable liquid crystal display module can be manufactured by using the present invention.

The present embodiment mode can be implemented by being combined with Embodiment Modes 1 through 17.

Embodiment Mode 20

A television device can be completed by using a display module (display panel) that is manufactured according to the above-described embodiment modes. There are a case in which only a pixel portion is formed over a substrate as the structure as shown in FIG. 33A and a scanning line driver circuit and a signal line driver circuit are mounted over the substrate by the TAB technology like FIG. 34B; a case in which the scanning line driver circuit and the signal line driver circuit are mounted over the substrate by the COG technology like FIG. 34A; a case in which a TFT is formed over a substrate using an SAS as shown in FIG. 33B, a pixel portion and a scanning line driver circuit are also formed over the substrate and a signal line driver circuit is independently mounted over the substrate as a driver IC; and a case in which a pixel portion, a signal line driver circuit and a scanning line driver circuit are formed over a same substrate as shown in FIG. 33C; and the like. Any types of display panels may be used.

In addition, as other external circuits, a display device may include a video signal amplifier circuit which amplifies a video signal among signals received by a tuner, a video signal processing circuit which converts signals output from the video signal amplifier circuit into chrominance signals corresponding to respective colors of red, green and blue, a control circuit which converts the video signal into an input specification of a driver IC, and the like in an input side of a video signal. The control circuit outputs signals to both a scanning line side and a signal line side. In the case of digital driving, a signal dividing circuit may be provided in the signal line side and an input digital signal may be divided, into m pieces to be supplied.

An audio signal among signals received by the tuner is sent to an audio signal amplifier circuit and is supplied to a speaker through an audio signal processing circuit. A control circuit receives control information about a receiving station (reception frequency) or sound volume from an input portion and transmits signals to the tuner and the audio signal processing circuit.

A television device can be completed by incorporating such a liquid crystal display module or an EL display module into a housing as shown in FIGS. 37A and 37B. When an EL display module as shown in FIG. 35 and FIG. 36 is used, an EL television device can be achieved. When using a liquid crystal display module as shown in FIG. 42 and FIG. 44, a liquid crystal television can be obtained. A main display screen 2003 is formed by using the display module, and speaker portions 2009, an operation switch, and the like are provided as its accessory equipment. Thus, television devices can be completed according to the present invention.

A display panel 2002 is incorporated in a housing 2001 and a receiver 2005 is connected to a communication network by wired or wireless connections via a modem 2004 to receive general TV broadcast so that one-way (from a sender to a receiver) or two-way (between a sender and a receiver or between receivers) information communication can be carried out. The television device can be operated by using a switch built in the housing or a remote control unit 2006. Also, a display portion 2007 for displaying output information may also be provided in the remote control unit.

Further, the television device may include a sub screen 2008 formed using a second display panel to display channels, volume, and the like, in addition to the main screen 2003. In this structure, the main screen 2003 may be formed by using an EL display panel having wide viewing angle and the sub screen may be formed by using a liquid crystal display panel capable of displaying images at lower power consumption. Or, in order to reduce the power consumption preferentially, the main screen 2003 may be formed by using a liquid crystal display panel capable of displaying images at lower power consumption and the sub screen may be formed by using an EL display panel having wide view angle, which can be switched on/off. According to the present invention, a highly reliable display device can be formed even when a large size substrate is used and a large number of TFTs or electronic parts are used.

FIG. 37B shows a television device having a display portion with a size of 20 to 80 inches. The television device includes a housing 2010, a display portion 2011, a remote-control unit 2012, that is an operation portion, speakers 2013 and the like. The present invention is applied to the fabrication of the display portion 2011. Since the display portion of FIG. 37B is a wall-hanging type, it does not require a large installation space.

Of course, the invention is not limited to the television device, and can be applied to various use applications, e.g., a large-size display medium such as an information display board in a train station, an airport, and the like, or an advertisement display board on the street, as well as a monitor of a personal computer.

Embodiment Mode 21

According to the invention, various kinds of display devices can be manufactured. Namely, various kinds of electronic appliances can be manufactured by incorporating such display devices of the invention to display portions of the electronic appliances.

As examples of the electronic appliances, a camera such as a video camera and a digital camera; a projector; a head-mounted display (a goggle type display); a car navigation system; a mobile stereo; a personal computer; a game machine; a portable information terminal (such as a mobile computer, a cellular telephone and an electronic book); an image reproduction device provided with a recording medium (concretely, a device which can reproduce the recording medium such as a digital versatile disc (DVD) and display images thereof); and the like can be given. Specific examples thereof are shown in FIGS. 32A to 32D.

Figure 32A:
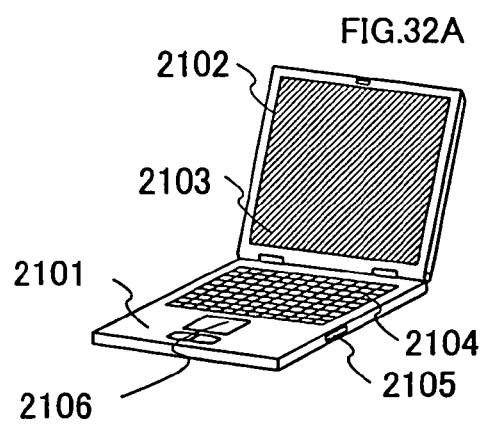
FIGS. 32A to 32D are diagrams showing electronic appliances to which the present invention is applied.

FIG. 32A shows a personal laptop computer, which includes a main body 2101, a housing 2102, a display portion 2103, a keyboard 2104, an external connection port 2105, a pointing mouse 2106, and the like. The display portion 2103 can be manufactured according to the invention. According to the invention, a highly reliable, high-quality image can be displayed on the display portion even if the personal computer is miniaturized and a wiring and the like are formed precisely.

Figure 32B:
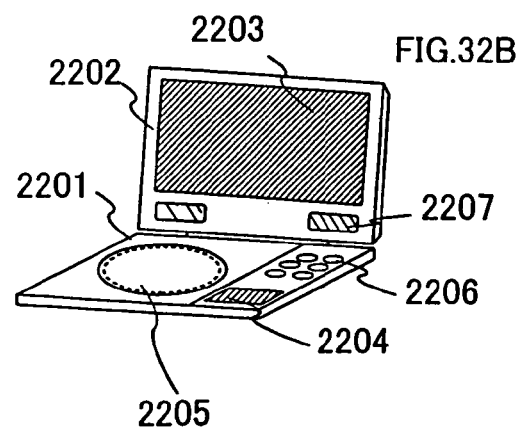

FIG. 32B shows an image reproduction device comprising a recording medium (specifically, a DVD reproducing device), which includes a main body 2201, a housing 2202, a display portion A 2203, a display portion B 2204, a recording medium (a DVD and the like) reading portion 2205, operation keys 2206, speaker portions 2207, and the like. The display portion A 2203 mainly displays image information, while the display portion B 2204 mainly displays character information. These display portion A 2203 and display portion B 2204 can be manufactured according to the invention. According to the invention, a highly reliable, high-quality image can be displayed on the display portions even if the image reproduction device is miniaturized and a wiring and the like are formed precisely.

Figure 32C:
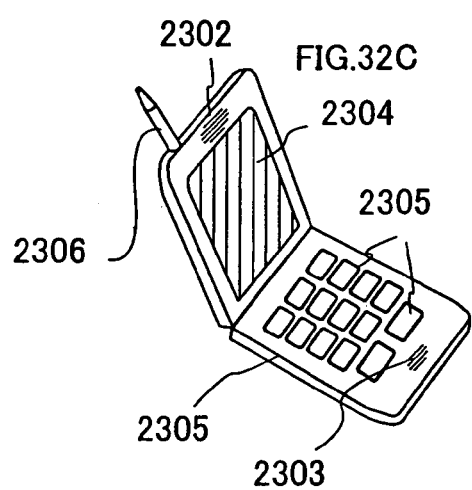

FIG. 32C shows a cellular phone, which includes a main body 2301, an audio output portion 2302, an audio input portion 2303, a display portion 2304, operation switches 2305, an antenna 2306, and the like. According to the invention, a highly reliable, high-quality image can be displayed on the display portion even if a cellular phone is miniaturized and a wiring and the like are formed precisely.

Figure 32D:
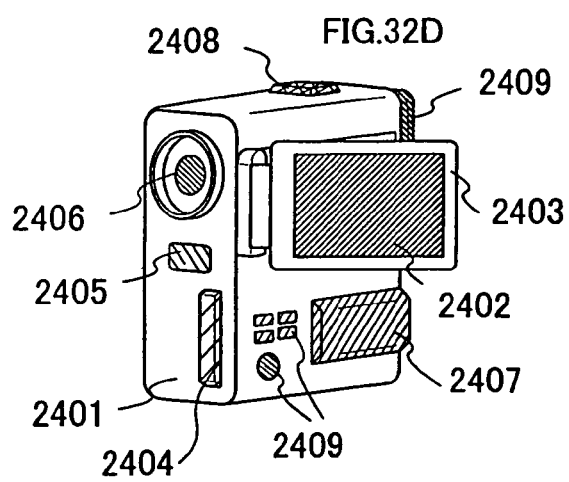

FIG. 32D shows a video camera, which includes a main body 2401, a display portion 2402, a housing 2403, an external connection port 2404, a remote control receiver 2405, an image receiving portion 2406, a battery 2407, an audio input portion 2408, operation keys 2409, an eye piece portion 2410, and the like. The invention can be applied to the display portion 2402. According to the invention, a highly reliable, high-quality image can be displayed on the display portion 2402 even if a video camera is miniaturized and a wiring and the like are formed precisely. The present embodiment mode can be freely combined with the above described embodiment modes.

What is claimed is:

1. A semiconductor device comprising:
    a channel region provided in a first semiconductor film provided over a substrate;
    a second semiconductor film having one conductivity provided over the first semiconductor film;
    a third semiconductor film having the one conductivity provided over the first semiconductor film;
    a channel protection layer provided over the channel region and between the second semiconductor film and the third semiconductor film;
    a source electrode provided over one of the second semiconductor film and the third semiconductor film;
    a drain electrode provided over the other of the second semiconductor film and the third semiconductor film;
    a gate insulating film provided over the channel protection layer and the source electrode and the drain electrode; and
    a gate electrode provided over the gate insulating film.

2. A semiconductor device according to claim 1, wherein the channel protection layer comprises an inorganic material.

3. A semiconductor device according to claim 1, wherein the channel protection layer comprises an organic material.

4. A semiconductor device according to claim 1, wherein the channel protection layer comprises a material selected from the group consisting of silicon oxide, silicon nitride, silicon oxynitride and silicon nitride oxide.

5. A semiconductor device according to claim 1, wherein the channel protection layer comprises a material selected from the group consisting of polyimide, acrylic, polyamide, polyimide amide and benzocyclobutene.

6. A semiconductor device according to claim 1, wherein the channel protection layer is insulating.

7. A semiconductor device according to claim 1, wherein the semiconductor device is incorporated into one selected from the group consisting of a computer, an image reproduction device comprising a recording medium, a cellular phone, and a camera.

8. A semiconductor device comprising:
    a channel region provided in a first semiconductor film provided over a substrate;
    a second semiconductor film having one conductivity provided over the first semiconductor film;
    a third semiconductor film having the one conductivity provided over the first semiconductor film;
    a fourth semiconductor film having the one conductivity provided over the second semiconductor film;
    a fifth semiconductor film having the one conductivity provided over the third semiconductor film;
    a channel protection layer provided over the channel region and between the second semiconductor film and the third semiconductor film and between the fourth semiconductor film and the fifth semiconductor film;
    a source electrode provided over one of the fourth semiconductor film and the fifth semiconductor film;
    a drain electrode provided over the other of the fourth semiconductor film and the fifth semiconductor film;
    a gate insulating film provided over the channel protection layer and the source electrode and the drain electrode; and
    a gate electrode provided over the gate insulating film,
    wherein the second semiconductor film contains an impurity imparting one conductivity at a concentration lower than the fourth semiconductor film, and
    wherein the third semiconductor film contains the impurity imparting one conductivity at a concentration lower than the fifth semiconductor film.

9. A semiconductor device according to claim 8, wherein the channel protection layer comprises an inorganic material.

10. A semiconductor device according to claim 8, wherein the channel protection layer comprises an organic material.

11. A semiconductor device according to claim 8, wherein the channel protection layer comprises a material selected from the group consisting of silicon oxide, silicon nitride, silicon oxynitride and silicon nitride oxide.

12. A semiconductor device according to claim 8, wherein the channel protection layer comprises a material selected from the group consisting of polyimide, acrylic, polyamide, polyimide amide and benzocyclobutene.

13. A semiconductor device according to claim 8, wherein the channel protection layer is insulating.

14. A semiconductor device according to claim 8, wherein the semiconductor device is incorporated into one selected from the group consisting of a computer, an image reproduction device comprising a recording medium, a cellular phone, and a camera.

15. A semiconductor device comprising:
    a channel region provided in a first semiconductor film provided over a substrate;
    a second semiconductor film having one conductivity provided over the first semiconductor film;
    a third semiconductor film having the one conductivity provided over the first semiconductor film;
    a channel protection layer provided over the channel region and between the second semiconductor film and the third semiconductor film;
    a source electrode provided over one of the second semiconductor film and the third semiconductor film;
    a drain electrode provided over the other of the second semiconductor film and the third semiconductor film;
    a gate insulating film provided over the channel protection layer and the source electrode and the drain electrode; and
    a gate electrode provided over the gate insulating film,
    wherein the gate insulating film has a part provided between the channel protection layer and the gate electrode and between the second semiconductor film and the third semiconductor film and between the source electrode and the drain electrode.

16. A semiconductor device according to claim 15, wherein the channel protection layer comprises an inorganic material.

17. A semiconductor device according to claim 15, wherein the channel protection layer comprises an organic material.

18. A semiconductor device according to claim 15, wherein the channel protection layer comprises a material selected from the group consisting of silicon oxide, silicon nitride, silicon oxynitride and silicon nitride oxide.

19. A semiconductor device according to claim 15, wherein the channel protection layer comprises a material selected from the group consisting of polyimide, acrylic, polyamide, polyimide amide and benzocyclobutene.

20. A semiconductor device according to claim 15, wherein the channel protection layer is insulating.

21. A semiconductor device according to claim 15, wherein the semiconductor device is incorporated into one selected from the group consisting of a computer, an image reproduction device comprising a recording medium, a cellular phone, and a camera.

* * * * *

UNITED STATES PATENT AND TRADEMARK OFFICE
CERTIFICATE OF CORRECTION

PATENT NO. : 7,800,113 B2
APPLICATION NO. : 11/826815
DATED : September 21, 2010
INVENTOR(S) : Hironobu Shoji et al.

It is certified that error appears in the above-identified patent and that said Letters Patent is hereby corrected as shown below:

Col. 5, line 66, "FIGS. 41A to 41C are cross sectional views explaining thin" should read
"FIGS. 41A to 41C are cross sectional views explaining thin film"

Col. 8, line 32, "In addition, laser light maybe employed." should read
"In addition, laser light may be employed."

Col. 12, line 24 , "in the range of 1:2to 1:1,000." should read
"in the range of 1:2 to 1:1,000."

Col. 19, line 14, "composition is preferably, set" should read
"composition is preferably set"

Col. 20, line 55, "layer. 204b having an n-type" should read
"layer 204b having an n-type"

Col. 20, line 62, "droplet discharging devices. 207a and 207b" should read
"droplet discharging devices 207a and 207b"

Col. 24, line 8, "a conductive oxide material may be used." should read
"a conductive oxide material, may be used."

Col. 25, line 44, "(SiNO), aluminum nitride (AIN)," should read
"(SiNO), aluminum nitride (AlN),"

Col. 25, line 45, "(AION), aluminum nitride oxide (AINO)" should read
"(AlON), aluminum nitride oxide (AlNO)"

Col. 27, line 20, "using the same materials thereof The" should read
"using the same materials thereof. The"

Signed and Sealed this
Third Day of July, 2012

David J. Kappos
*Director of the United States Patent and Trademark Office*

CERTIFICATE OF CORRECTION (continued)
U.S. Pat. No. 7,800,113 B2

Col. 33, line 2, "formed thereon (see FIG 11E)" should read
    "formed thereon (see FIG. 11E)"

Col. 35, line 15, "conductor film. 470 containing the n-type" should read
    "conductor film 470 containing the n-type"

Col. 40, line 17, "the gate insulating layer 364 can, be" should read
    "the gate insulating layer 364 can be"

Col. 42, line 65, "spheric air" should read
    "spheric air."

Col. 43, line 18, "nitride oxide (SiNO), aluminum nitride (AIN)" should read
    "nitride oxide (SiNO), aluminum nitride (AlN)"

Col. 43, line 19, "oxynitride (AION), aluminum nitride oxide (AINO) having" should read
    "oxynitride (AlON), aluminum nitride oxide (AlNO) having"

Col. 44, line 59, "drain electrode layer 25i" should read
    "drain electrode layer 251"

Col. 46, line 14, "a barrier layer, 32" should read
    "a barrier layer; 32"

Col. 47, line 46, "FIGS.: 19A and 19B,. 20A" should read
    "FIGS. 19A and 19B, 20A"

Col. 50, line 48, "As shown in FIGS. $2^5$A and 25B" should read
    "As shown in FIGS. 25A and 25B"

Col. 51, line 30, "electrically connected to each other The" should read
    "electrically connected to each other. The"

Col. 53, line 36, "circular silicon wafer When a scanning line" should read
    "circular silicon wafer. When a scanning line"

Col. 54, line 3, "the drive ICs may be mounted" should read
    "The drive ICs may be mounted"

Col. 57, line 36, "with reference to FIG. 46A In the case of" should read
    "with reference to FIG. 46A. In the case of"

Col. 57, line 53, "sequentially laminated Over the substrate" should read
    "sequentially laminated over the substrate"

CERTIFICATE OF CORRECTION (continued)
U.S. Pat. No. 7,800,113 B2

Col. 60, line 25, "As substances having excellent hole, injecting properties" should read
"As substances having excellent hole injecting properties"

Col. 61, lines 32-33, "poly(3-cyclohexylthiophene) (PC);" should read
"poly(3-cyclohexylthiophene) (PCHT);"

Col. 63, line 1, "so as to function as a light emitting, layer," should read
"so as to function as a light emitting layer,"

Col. 65, line 4, "variations in VGs of the current controlling TFT 704" should read
"variations in $V_{GS}$ of the current controlling TFT 704"

Col. 65, line 14, "The switching. TFT 701" should read
"The switching TFT 701"

Col. 66, line 55, "downward may also, be employed" should read
"downward may also be employed"

Col. 67, lines 65-66, "MVA (multi-domain vertical aligiment) mode" should read
"MVA (multi-domain vertical alignment) mode"

Col. 69, line 20, "an input digital signal may be divided, into" should read
"an input digital signal may be divided into"